(12) United States Patent
Maeno

(10) Patent No.: US 6,964,000 B2
(45) Date of Patent: Nov. 8, 2005

(54) SEMICONDUCTOR INTEGRATED CIRCUIT DEVICE HAVING A TEST CIRCUIT OF A RANDOM ACCESS MEMORY

(75) Inventor: Hideshi Maeno, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 410 days.

(21) Appl. No.: 10/383,553

(22) Filed: Mar. 10, 2003

(65) Prior Publication Data

US 2004/0059976 A1    Mar. 25, 2004

(30) Foreign Application Priority Data

Sep. 20, 2002    (JP) .............................. 2002-275525

(51) Int. Cl.$^7$ ............................................ G11C 29/00
(52) U.S. Cl. ..................................... 714/720; 714/743
(58) Field of Search ............................... 714/719, 743, 714/42, 739, 718, 720; 365/201; 700/5

(56) References Cited

U.S. PATENT DOCUMENTS

| | | | | |
|---|---|---|---|---|
| 5,033,048 A | * | 7/1991 | Pierce et al. ................ | 714/719 |
| 5,420,870 A | * | 5/1995 | Kim ............................ | 714/743 |
| 5,506,959 A | * | 4/1996 | Cockburn .................... | 714/42 |
| 5,592,424 A | * | 1/1997 | Maeno ........................ | 365/201 |
| 5,636,225 A | | 6/1997 | Osawa | |
| 5,815,512 A | | 9/1998 | Osawa et al. | |
| 6,338,154 B2 | * | 1/2002 | Kim ........................... | 714/743 |
| 6,654,646 B2 | * | 11/2003 | Bowers et al. ................ | 700/5 |
| 6,769,084 B2 | * | 7/2004 | Kim et al. ................... | 714/739 |

OTHER PUBLICATIONS

J. Otterstedt, et al., "Detection of CMOS Address Decoder Open Faults with March and Pseudo Random Memory Tests", IEEE, International Test Conference 1998 Proceedings, Paper 3.1, Oct. 18-23, 1998, pp. 53-62.

* cited by examiner

Primary Examiner—David Ton
(74) Attorney, Agent, or Firm—Buchanan Ingersoll PC

(57) ABSTRACT

32 pseudo-random numbers respectively indicated by 5 bits are successively generated in a test address generating unit, a serial output signal denoting one pair of pseudo-random numbers of 10 bits are input to 10 flip-flops serially arranged in an address shift register for each clock cycle, a read address expressed by a string of bits output from the flip-flops of odd-numbered stages is input to a read port of a RAM to perform a read test for one memory cell of the read address, and a write address expressed by a string of bits output from the flip-flops of even-numbered stages is input to a write port of the RAM to perform a write test for one memory cell of the write address. The read test and the write test for 32 memory cells are alternately performed in 64 clock cycles.

17 Claims, 25 Drawing Sheets

FIG.3

| CYCLE | HOLD | A4 | A3 | A2 | A1 | A0 | A (Decimal) | XA (Decimal) | YA (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|
| 0 | 1 | 0 | 0 | 0 | 0 | 0 | 0 | 0 | 0 | X | X | X | X | X | X | X | X | X | X | X | X |
| 1 | 0 | 0 | 0 | 0 | 0 | 0 | 0 | 0 | 0 | 0 | X | X | X | X | X | X | X | X | X | X | X |
| 2 | 1 | 1 | 0 | 0 | 0 | 0 | 16 | 4 | 0 | 0 | 0 | X | X | X | X | X | X | X | X | X | X |
| 3 | 0 | 1 | 0 | 0 | 0 | 0 | 16 | 4 | 0 | 0 | 0 | 0 | X | X | X | X | X | X | X | X | X |
| 4 | 1 | 0 | 1 | 0 | 0 | 0 | 8 | 2 | 0 | 0 | 0 | 0 | 0 | X | X | X | X | X | X | X | X |
| 5 | 0 | 0 | 1 | 0 | 0 | 0 | 8 | 2 | 0 | 0 | 0 | 0 | 0 | 0 | X | X | X | X | X | X | X |
| 6 | 1 | 0 | 0 | 1 | 0 | 0 | 4 | 1 | 0 | 0 | 0 | 0 | 0 | 0 | 0 | X | X | X | X | X | X |
| 7 | 0 | 0 | 0 | 1 | 0 | 0 | 4 | 1 | 0 | 0 | 0 | 0 | 0 | 0 | 0 | 0 | X | X | X | X | X |
| 8 | 1 | 1 | 0 | 0 | 1 | 0 | 18 | 4 | 2 | 0 | 0 | 0 | 0 | 0 | 0 | 0 | 0 | X | X | X | X |
| 9 | 0 | 1 | 0 | 0 | 1 | 0 | 18 | 4 | 2 | 0 | 0 | 0 | 0 | 0 | 0 | 0 | 0 | 0 | X | 0 | X |
| 10 | 1 | 0 | 1 | 0 | 0 | 1 | 9 | 2 | 1 | 0 | 0 | 0 | 0 | 0 | 0 | 0 | 0 | 0 | 0 | 0 | 0 |
| 11 | 0 | 0 | 1 | 0 | 0 | 1 | 9 | 2 | 1 | 1 | 0 | 0 | 0 | 0 | 0 | 0 | 0 | 0 | 0 | 16 | 0 |
| 12 | 1 | 1 | 0 | 1 | 0 | 0 | 20 | 5 | 0 | 1 | 1 | 0 | 0 | 0 | 0 | 0 | 0 | 0 | 0 | 16 | 16 |
| 13 | 0 | 1 | 0 | 1 | 0 | 0 | 20 | 5 | 0 | 0 | 1 | 1 | 0 | 0 | 0 | 0 | 0 | 0 | 0 | 8 | 16 |
| 14 | 1 | 1 | 1 | 0 | 1 | 0 | 26 | 6 | 2 | 0 | 0 | 1 | 1 | 0 | 0 | 0 | 0 | 0 | 0 | 8 | 8 |
| 15 | 0 | 1 | 1 | 0 | 1 | 0 | 26 | 6 | 2 | 0 | 0 | 0 | 1 | 1 | 0 | 0 | 0 | 0 | 0 | 4 | 8 |
| 16 | 1 | 0 | 1 | 1 | 0 | 1 | 13 | 3 | 1 | 0 | 0 | 0 | 0 | 1 | 1 | 0 | 0 | 0 | 0 | 4 | 4 |
| 17 | 0 | 0 | 1 | 1 | 0 | 1 | 13 | 3 | 1 | 1 | 0 | 0 | 0 | 0 | 1 | 1 | 0 | 0 | 0 | 18 | 4 |
| 18 | 1 | 0 | 0 | 1 | 1 | 0 | 6 | 1 | 2 | 1 | 1 | 0 | 0 | 0 | 0 | 1 | 1 | 0 | 0 | 18 | 18 |
| 19 | 0 | 0 | 0 | 1 | 1 | 0 | 6 | 1 | 2 | 0 | 1 | 1 | 0 | 0 | 0 | 0 | 1 | 1 | 0 | 9 | 18 |
| 20 | 1 | 1 | 0 | 0 | 1 | 1 | 19 | 4 | 3 | 0 | 0 | 1 | 1 | 0 | 0 | 0 | 0 | 1 | 1 | 9 | 9 |
| 21 | 0 | 1 | 0 | 0 | 1 | 1 | 19 | 4 | 3 | 1 | 0 | 0 | 1 | 1 | 0 | 0 | 0 | 0 | 1 | 20 | 9 |
| 22 | 1 | 1 | 1 | 0 | 0 | 1 | 25 | 6 | 1 | 1 | 1 | 0 | 0 | 1 | 1 | 0 | 0 | 0 | 0 | 20 | 20 |
| 23 | 0 | 1 | 1 | 0 | 0 | 1 | 25 | 6 | 1 | 1 | 1 | 1 | 0 | 0 | 1 | 1 | 0 | 0 | 0 | 26 | 20 |
| 24 | 1 | 1 | 1 | 1 | 0 | 0 | 28 | 7 | 0 | 1 | 1 | 1 | 1 | 0 | 0 | 1 | 1 | 0 | 0 | 26 | 26 |
| 25 | 0 | 1 | 1 | 1 | 0 | 0 | 28 | 7 | 0 | 0 | 1 | 1 | 1 | 1 | 0 | 0 | 1 | 1 | 0 | 13 | 26 |
| 26 | 1 | 1 | 1 | 1 | 1 | 0 | 30 | 7 | 2 | 0 | 0 | 1 | 1 | 1 | 1 | 0 | 0 | 1 | 1 | 13 | 13 |
| 27 | 0 | 1 | 1 | 1 | 1 | 0 | 30 | 7 | 2 | 1 | 0 | 0 | 1 | 1 | 1 | 1 | 0 | 0 | 1 | 6 | 13 |
| 28 | 1 | 1 | 1 | 1 | 1 | 1 | 31 | 7 | 3 | 0 | 0 | 0 | 0 | 1 | 1 | 1 | 1 | 0 | 0 | 6 | 6 |
| 29 | 0 | 1 | 1 | 1 | 1 | 1 | 31 | 7 | 3 | 1 | 0 | 0 | 0 | 0 | 1 | 1 | 1 | 1 | 0 | 19 | 6 |
| 30 | 1 | 0 | 1 | 1 | 1 | 1 | 15 | 3 | 3 | 1 | 1 | 0 | 0 | 0 | 0 | 1 | 1 | 1 | 1 | 19 | 19 |
| 31 | 0 | 0 | 1 | 1 | 1 | 1 | 15 | 3 | 3 | 1 | 1 | 1 | 0 | 0 | 0 | 0 | 1 | 1 | 1 | 25 | 19 |
| 32 | 1 | 0 | 0 | 1 | 1 | 1 | 7 | 1 | 3 | 1 | 1 | 1 | 1 | 0 | 0 | 0 | 0 | 1 | 1 | 25 | 25 |
| 33 | 0 | 0 | 0 | 1 | 1 | 1 | 7 | 1 | 3 | 1 | 1 | 1 | 1 | 1 | 0 | 0 | 0 | 0 | 1 | 28 | 25 |
| 34 | 1 | 0 | 0 | 0 | 1 | 1 | 3 | 0 | 3 | 1 | 1 | 1 | 1 | 1 | 1 | 0 | 0 | 0 | 0 | 28 | 28 |
| 35 | 0 | 0 | 0 | 0 | 1 | 1 | 3 | 0 | 3 | 1 | 1 | 1 | 1 | 1 | 1 | 1 | 0 | 0 | 0 | 30 | 28 |
| 36 | 1 | 1 | 0 | 0 | 0 | 1 | 17 | 4 | 1 | 1 | 1 | 1 | 1 | 1 | 1 | 1 | 1 | 0 | 0 | 30 | 30 |
| 37 | 0 | 1 | 0 | 0 | 0 | 1 | 17 | 4 | 1 | 1 | 1 | 1 | 1 | 1 | 1 | 1 | 1 | 1 | 0 | 31 | 30 |
| 38 | 1 | 1 | 1 | 0 | 0 | 0 | 24 | 6 | 0 | 1 | 1 | 1 | 1 | 1 | 1 | 1 | 1 | 1 | 1 | 31 | 31 |
| 39 | 0 | 1 | 1 | 0 | 0 | 0 | 24 | 6 | 0 | 0 | 1 | 1 | 1 | 1 | 1 | 1 | 1 | 1 | 1 | 15 | 31 |
| 40 | 1 | 0 | 1 | 1 | 0 | 0 | 12 | 3 | 0 | 0 | 0 | 1 | 1 | 1 | 1 | 1 | 1 | 1 | 1 | 15 | 15 |
| 41 | 0 | 0 | 1 | 1 | 0 | 0 | 12 | 3 | 0 | 0 | 0 | 0 | 1 | 1 | 1 | 1 | 1 | 1 | 1 | 7 | 15 |
| 42 | 1 | 1 | 0 | 1 | 1 | 0 | 22 | 5 | 2 | 0 | 0 | 0 | 0 | 1 | 1 | 1 | 1 | 1 | 1 | 7 | 7 |
| 43 | 0 | 1 | 0 | 1 | 1 | 0 | 22 | 5 | 2 | 0 | 0 | 0 | 0 | 0 | 1 | 1 | 1 | 1 | 1 | 3 | 7 |
| 44 | 1 | 1 | 1 | 0 | 1 | 1 | 27 | 6 | 3 | 0 | 0 | 0 | 0 | 0 | 0 | 1 | 1 | 1 | 1 | 3 | 3 |
| 45 | 0 | 1 | 1 | 0 | 1 | 1 | 27 | 6 | 3 | 1 | 0 | 0 | 0 | 0 | 0 | 0 | 1 | 1 | 1 | 17 | 3 |
| 46 | 1 | 1 | 1 | 1 | 0 | 1 | 29 | 7 | 1 | 1 | 1 | 0 | 0 | 0 | 0 | 0 | 0 | 1 | 1 | 17 | 17 |
| 47 | 0 | 1 | 1 | 1 | 0 | 1 | 29 | 7 | 1 | 1 | 1 | 1 | 0 | 0 | 0 | 0 | 0 | 0 | 1 | 24 | 17 |
| 48 | 1 | 0 | 1 | 1 | 1 | 0 | 14 | 3 | 2 | 1 | 1 | 1 | 1 | 0 | 0 | 0 | 0 | 0 | 0 | 24 | 24 |
| 49 | 0 | 0 | 1 | 1 | 1 | 0 | 14 | 3 | 2 | 0 | 1 | 1 | 1 | 1 | 0 | 0 | 0 | 0 | 0 | 12 | 24 |
| 50 | 1 | 1 | 0 | 1 | 1 | 1 | 23 | 5 | 3 | 0 | 0 | 1 | 1 | 1 | 1 | 0 | 0 | 0 | 0 | 12 | 12 |
| 51 | 0 | 1 | 0 | 1 | 1 | 1 | 23 | 5 | 3 | 1 | 0 | 0 | 1 | 1 | 1 | 1 | 0 | 0 | 0 | 22 | 12 |
| 52 | 1 | 0 | 1 | 0 | 1 | 1 | 11 | 2 | 3 | 1 | 1 | 0 | 0 | 1 | 1 | 1 | 1 | 0 | 0 | 22 | 22 |
| 53 | 0 | 0 | 1 | 0 | 1 | 1 | 11 | 2 | 3 | 1 | 1 | 1 | 0 | 0 | 1 | 1 | 1 | 1 | 0 | 27 | 22 |
| 54 | 1 | 1 | 0 | 1 | 0 | 1 | 21 | 5 | 1 | 1 | 1 | 1 | 1 | 0 | 0 | 1 | 1 | 1 | 1 | 27 | 27 |
| 55 | 0 | 1 | 0 | 1 | 0 | 1 | 21 | 5 | 1 | 1 | 1 | 1 | 1 | 1 | 0 | 0 | 1 | 1 | 1 | 29 | 27 |
| 56 | 1 | 0 | 1 | 0 | 1 | 0 | 10 | 2 | 2 | 1 | 1 | 1 | 1 | 1 | 1 | 0 | 0 | 1 | 1 | 29 | 29 |
| 57 | 0 | 0 | 1 | 0 | 1 | 0 | 10 | 2 | 2 | 0 | 1 | 1 | 1 | 1 | 1 | 1 | 0 | 0 | 1 | 14 | 29 |
| 58 | 1 | 0 | 0 | 1 | 0 | 1 | 5 | 1 | 1 | 0 | 0 | 1 | 1 | 1 | 1 | 1 | 1 | 0 | 0 | 14 | 14 |
| 59 | 0 | 0 | 0 | 1 | 0 | 1 | 5 | 1 | 1 | 1 | 0 | 0 | 1 | 1 | 1 | 1 | 1 | 1 | 0 | 23 | 14 |
| 60 | 1 | 0 | 0 | 0 | 1 | 0 | 2 | 0 | 2 | 1 | 1 | 0 | 0 | 1 | 1 | 1 | 1 | 1 | 1 | 23 | 23 |
| 61 | 0 | 0 | 0 | 0 | 1 | 0 | 2 | 0 | 2 | 0 | 1 | 1 | 0 | 0 | 1 | 1 | 1 | 1 | 1 | 11 | 23 |
| 62 | 1 | 0 | 0 | 0 | 0 | 1 | 1 | 0 | 1 | 0 | 0 | 1 | 1 | 0 | 0 | 1 | 1 | 1 | 1 | 11 | 11 |
| 63 | 0 | 0 | 0 | 0 | 0 | 1 | 1 | 0 | 1 | 1 | 0 | 0 | 1 | 1 | 0 | 0 | 1 | 1 | 1 | 21 | 11 |
| 64 | 1 | 0 | 0 | 0 | 0 | 0 | 0 | 0 | 0 | 0 | 1 | 1 | 0 | 0 | 1 | 1 | 0 | 0 | 1 | 21 | 21 |
| 65 | 0 | 0 | 0 | 0 | 0 | 0 | 0 | 0 | 0 | 0 | 0 | 1 | 1 | 0 | 0 | 1 | 1 | 0 | 0 | 10 | 21 |
| 66 | 1 | 1 | 0 | 0 | 0 | 0 | 16 | 4 | 0 | 0 | 0 | 0 | 1 | 1 | 0 | 0 | 1 | 1 | 0 | 10 | 10 |
| 67 | 0 | 1 | 0 | 0 | 0 | 0 | 16 | 4 | 0 | 0 | 0 | 0 | 0 | 1 | 1 | 0 | 0 | 1 | 1 | 5 | 10 |
| 68 | 1 | 0 | 1 | 0 | 0 | 0 | 8 | 2 | 0 | 0 | 0 | 0 | 0 | 0 | 1 | 1 | 0 | 0 | 1 | 5 | 5 |
| 69 | 0 | 0 | 1 | 0 | 0 | 0 | 8 | 2 | 0 | 0 | 0 | 0 | 0 | 0 | 0 | 1 | 1 | 0 | 0 | 2 | 5 |
| 70 | 1 | 0 | 0 | 1 | 0 | 0 | 4 | 1 | 0 | 0 | 0 | 0 | 0 | 0 | 0 | 0 | 1 | 1 | 0 | 2 | 2 |
| 71 | 0 | 0 | 0 | 1 | 0 | 0 | 4 | 1 | 0 | 0 | 0 | 0 | 0 | 0 | 0 | 0 | 0 | 1 | 0 | 1 | 2 |
| 72 | 1 | 1 | 0 | 0 | 1 | 0 | 18 | 4 | 2 | 0 | 0 | 0 | 0 | 0 | 0 | 0 | 0 | 0 | 1 | 1 | 1 |
| 73 | 0 | 1 | 0 | 0 | 1 | 0 | 18 | 4 | 2 | 0 | 0 | 0 | 0 | 0 | 0 | 0 | 0 | 0 | 1 | 0 | 1 |
| 74 | 1 | 0 | 1 | 0 | 0 | 1 | 9 | 2 | 1 | 0 | 0 | 0 | 0 | 0 | 0 | 0 | 0 | 0 | 0 | 0 | 0 |
| 75 | 0 | 0 | 1 | 0 | 0 | 1 | 9 | 2 | 1 | 1 | 0 | 0 | 0 | 0 | 0 | 0 | 0 | 0 | 0 | 16 | 0 |

FIG.5

| CYCLE | A9 | A8 | A7 | A6 | A5 | A4 | A3 | A2 | A1 | A0 | A (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | X | X | X | X | X | X | X | X | X | X | X | X |
| 1 | 1 | 0 | 0 | 0 | 0 | 0 | 0 | 0 | 0 | 0 | 512 | 0 | X | X | X | X | X | X | X | X | X | X | X |
| 2 | 0 | 1 | 0 | 0 | 0 | 0 | 0 | 0 | 0 | 0 | 256 | 0 | 0 | X | X | X | X | X | X | X | X | X | X |
| 3 | 0 | 0 | 1 | 0 | 0 | 0 | 0 | 0 | 0 | 0 | 128 | 0 | 0 | 0 | X | X | X | X | X | X | X | X | X |
| 4 | 0 | 0 | 0 | 1 | 0 | 0 | 0 | 0 | 0 | 0 | 64 | 0 | 0 | 0 | 0 | X | X | X | X | X | X | X | X |
| 5 | 0 | 0 | 0 | 0 | 1 | 0 | 0 | 0 | 0 | 0 | 32 | 0 | 0 | 0 | 0 | 0 | X | X | X | X | X | X | X |
| 6 | 0 | 0 | 0 | 0 | 0 | 1 | 0 | 0 | 0 | 0 | 16 | 0 | 0 | 0 | 0 | 0 | 0 | X | X | X | X | X | X |
| 7 | 0 | 0 | 0 | 0 | 0 | 0 | 1 | 0 | 0 | 0 | 8 | 0 | 0 | 0 | 0 | 0 | 0 | 0 | X | X | X | X | X |
| 8 | 1 | 0 | 0 | 0 | 0 | 0 | 0 | 1 | 0 | 0 | 516 | 0 | 0 | 0 | 0 | 0 | 0 | 0 | 0 | X | X | X | X |
| 9 | 0 | 1 | 0 | 0 | 0 | 0 | 0 | 0 | 1 | 0 | 258 | 0 | 0 | 0 | 0 | 0 | 0 | 0 | 0 | 0 | X | 0 | X |
| 10 | 0 | 0 | 1 | 0 | 0 | 0 | 0 | 0 | 0 | 1 | 129 | 0 | 0 | 0 | 0 | 0 | 0 | 0 | 0 | 0 | 0 | 0 | 0 |
| 11 | 1 | 0 | 0 | 1 | 0 | 0 | 0 | 0 | 0 | 0 | 576 | 1 | 0 | 0 | 0 | 0 | 0 | 0 | 0 | 0 | 0 | 16 | 0 |
| 12 | 0 | 1 | 0 | 0 | 1 | 0 | 0 | 0 | 0 | 0 | 288 | 0 | 1 | 0 | 0 | 0 | 0 | 0 | 0 | 0 | 0 | 0 | 16 |
| 13 | 0 | 0 | 1 | 0 | 0 | 1 | 0 | 0 | 0 | 0 | 144 | 0 | 0 | 1 | 0 | 0 | 0 | 0 | 0 | 0 | 0 | 8 | 0 |
| 14 | 0 | 0 | 0 | 1 | 0 | 0 | 1 | 0 | 0 | 0 | 72 | 0 | 0 | 0 | 1 | 0 | 0 | 0 | 0 | 0 | 0 | 0 | 8 |
| 15 | 1 | 0 | 0 | 0 | 1 | 0 | 0 | 1 | 0 | 0 | 548 | 0 | 0 | 0 | 0 | 1 | 0 | 0 | 0 | 0 | 0 | 4 | 0 |
| 16 | 0 | 1 | 0 | 0 | 0 | 1 | 0 | 0 | 1 | 0 | 274 | 0 | 0 | 0 | 0 | 0 | 1 | 0 | 0 | 0 | 0 | 0 | 4 |
| 17 | 0 | 0 | 1 | 0 | 0 | 0 | 1 | 0 | 0 | 1 | 137 | 0 | 0 | 0 | 0 | 0 | 0 | 1 | 0 | 0 | 0 | 2 | 0 |
| 18 | 0 | 0 | 0 | 1 | 0 | 0 | 0 | 1 | 0 | 0 | 68 | 1 | 0 | 0 | 0 | 0 | 0 | 0 | 1 | 0 | 0 | 16 | 2 |
| 19 | 0 | 0 | 0 | 0 | 1 | 0 | 0 | 0 | 1 | 0 | 34 | 0 | 1 | 0 | 0 | 0 | 0 | 0 | 0 | 1 | 0 | 1 | 16 |
| 20 | 0 | 0 | 0 | 0 | 0 | 1 | 0 | 0 | 0 | 1 | 17 | 0 | 0 | 1 | 0 | 0 | 0 | 0 | 0 | 0 | 1 | 8 | 1 |
| 21 | 1 | 0 | 0 | 0 | 0 | 0 | 1 | 0 | 0 | 0 | 520 | 1 | 0 | 0 | 1 | 0 | 0 | 0 | 0 | 0 | 0 | 16 | 8 |
| 22 | 1 | 1 | 0 | 0 | 0 | 0 | 0 | 1 | 0 | 0 | 772 | 0 | 1 | 0 | 0 | 1 | 0 | 0 | 0 | 0 | 0 | 4 | 16 |
| 23 | 0 | 1 | 1 | 0 | 0 | 0 | 0 | 0 | 1 | 0 | 386 | 0 | 0 | 1 | 0 | 0 | 1 | 0 | 0 | 0 | 0 | 8 | 4 |
| 24 | 0 | 0 | 1 | 1 | 0 | 0 | 0 | 0 | 0 | 1 | 193 | 0 | 0 | 0 | 1 | 0 | 0 | 1 | 0 | 0 | 0 | 2 | 8 |
| 25 | 1 | 0 | 0 | 1 | 1 | 0 | 0 | 0 | 0 | 0 | 608 | 1 | 0 | 0 | 0 | 1 | 0 | 0 | 1 | 0 | 0 | 20 | 2 |
| 26 | 0 | 1 | 0 | 0 | 1 | 1 | 0 | 0 | 0 | 0 | 304 | 0 | 1 | 0 | 0 | 0 | 1 | 0 | 0 | 1 | 0 | 1 | 20 |
| 27 | 0 | 0 | 1 | 0 | 0 | 1 | 1 | 0 | 0 | 0 | 152 | 0 | 0 | 1 | 0 | 0 | 0 | 1 | 0 | 0 | 1 | 10 | 1 |
| 28 | 1 | 0 | 0 | 1 | 0 | 0 | 1 | 1 | 0 | 0 | 588 | 0 | 0 | 0 | 1 | 0 | 0 | 0 | 1 | 0 | 0 | 0 | 10 |
| 29 | 1 | 1 | 0 | 0 | 1 | 0 | 0 | 1 | 1 | 0 | 806 | 0 | 0 | 0 | 0 | 1 | 0 | 0 | 0 | 1 | 0 | 5 | 0 |
| 30 | 0 | 1 | 1 | 0 | 0 | 1 | 0 | 0 | 1 | 1 | 403 | 0 | 0 | 0 | 0 | 0 | 1 | 0 | 0 | 0 | 1 | 0 | 5 |
| 31 | 1 | 0 | 1 | 1 | 0 | 0 | 1 | 0 | 0 | 1 | 713 | 1 | 0 | 0 | 0 | 0 | 0 | 1 | 0 | 0 | 0 | 18 | 0 |
| 32 | 0 | 1 | 0 | 1 | 1 | 0 | 0 | 1 | 0 | 0 | 356 | 1 | 1 | 0 | 0 | 0 | 0 | 0 | 1 | 0 | 0 | 16 | 18 |
| 33 | 0 | 0 | 1 | 0 | 1 | 1 | 0 | 0 | 1 | 0 | 178 | 0 | 1 | 1 | 0 | 0 | 0 | 0 | 0 | 1 | 0 | 9 | 16 |
| 34 | 0 | 0 | 0 | 1 | 0 | 1 | 1 | 0 | 0 | 1 | 89 | 0 | 0 | 1 | 1 | 0 | 0 | 0 | 0 | 0 | 1 | 8 | 9 |
| 35 | 0 | 0 | 0 | 0 | 1 | 0 | 1 | 1 | 0 | 0 | 44 | 1 | 0 | 0 | 1 | 1 | 0 | 0 | 0 | 0 | 0 | 20 | 8 |
| 36 | 1 | 0 | 0 | 0 | 0 | 1 | 0 | 1 | 1 | 0 | 534 | 0 | 1 | 0 | 0 | 1 | 1 | 0 | 0 | 0 | 0 | 4 | 20 |
| 37 | 0 | 1 | 0 | 0 | 0 | 0 | 1 | 0 | 1 | 1 | 267 | 0 | 0 | 1 | 0 | 0 | 1 | 1 | 0 | 0 | 0 | 10 | 4 |
| 38 | 0 | 0 | 1 | 0 | 0 | 0 | 0 | 1 | 0 | 1 | 133 | 1 | 0 | 0 | 1 | 0 | 0 | 1 | 1 | 0 | 0 | 18 | 10 |
| 39 | 1 | 0 | 0 | 1 | 0 | 0 | 0 | 0 | 1 | 0 | 578 | 1 | 1 | 0 | 0 | 1 | 0 | 0 | 1 | 1 | 0 | 21 | 18 |
| 40 | 0 | 1 | 0 | 0 | 1 | 0 | 0 | 0 | 0 | 1 | 289 | 0 | 1 | 1 | 0 | 0 | 1 | 0 | 0 | 1 | 1 | 9 | 21 |
| 41 | 1 | 0 | 1 | 0 | 0 | 1 | 0 | 0 | 0 | 0 | 656 | 1 | 0 | 1 | 1 | 0 | 0 | 1 | 0 | 0 | 1 | 26 | 9 |
| 42 | 0 | 1 | 0 | 1 | 0 | 0 | 1 | 0 | 0 | 0 | 328 | 0 | 1 | 0 | 1 | 1 | 0 | 0 | 1 | 0 | 0 | 4 | 26 |
| 43 | 1 | 0 | 1 | 0 | 1 | 0 | 0 | 1 | 0 | 0 | 676 | 0 | 0 | 1 | 0 | 1 | 1 | 0 | 0 | 1 | 0 | 13 | 4 |
| 44 | 0 | 1 | 0 | 1 | 0 | 1 | 0 | 0 | 1 | 0 | 338 | 0 | 0 | 0 | 1 | 0 | 1 | 1 | 0 | 0 | 1 | 2 | 13 |
| 45 | 0 | 0 | 1 | 0 | 1 | 0 | 1 | 0 | 0 | 1 | 169 | 0 | 0 | 0 | 0 | 1 | 0 | 1 | 1 | 0 | 0 | 6 | 2 |
| 46 | 0 | 0 | 0 | 1 | 0 | 1 | 0 | 1 | 0 | 0 | 84 | 1 | 0 | 0 | 0 | 0 | 1 | 0 | 1 | 1 | 0 | 17 | 6 |
| 47 | 0 | 0 | 0 | 0 | 1 | 0 | 1 | 0 | 1 | 0 | 42 | 0 | 1 | 0 | 0 | 0 | 0 | 1 | 0 | 1 | 1 | 3 | 17 |
| 48 | 1 | 0 | 0 | 0 | 0 | 1 | 0 | 1 | 0 | 1 | 533 | 0 | 0 | 1 | 0 | 0 | 0 | 0 | 1 | 0 | 1 | 8 | 3 |
| 49 | 1 | 1 | 0 | 0 | 0 | 0 | 1 | 0 | 1 | 0 | 778 | 1 | 0 | 0 | 1 | 0 | 0 | 0 | 0 | 1 | 0 | 17 | 8 |
| 50 | 1 | 1 | 1 | 0 | 0 | 0 | 0 | 1 | 0 | 1 | 901 | 0 | 1 | 0 | 0 | 1 | 0 | 0 | 0 | 0 | 1 | 4 | 17 |
| 51 | 1 | 1 | 1 | 1 | 0 | 0 | 0 | 0 | 1 | 0 | 962 | 1 | 0 | 1 | 0 | 0 | 1 | 0 | 0 | 0 | 0 | 24 | 4 |
| 52 | 0 | 1 | 1 | 1 | 1 | 0 | 0 | 0 | 0 | 1 | 481 | 0 | 1 | 0 | 1 | 0 | 0 | 1 | 0 | 0 | 0 | 2 | 24 |
| 53 | 1 | 0 | 1 | 1 | 1 | 1 | 0 | 0 | 0 | 0 | 752 | 1 | 0 | 1 | 0 | 1 | 0 | 0 | 1 | 0 | 0 | 28 | 2 |
| 54 | 0 | 1 | 0 | 1 | 1 | 1 | 1 | 0 | 0 | 0 | 376 | 0 | 1 | 0 | 1 | 0 | 1 | 0 | 0 | 1 | 0 | 1 | 28 |
| 55 | 1 | 0 | 1 | 0 | 1 | 1 | 1 | 1 | 0 | 0 | 700 | 0 | 0 | 1 | 0 | 1 | 0 | 1 | 0 | 0 | 1 | 14 | 1 |
| 56 | 1 | 1 | 0 | 1 | 0 | 1 | 1 | 1 | 1 | 0 | 862 | 0 | 0 | 0 | 1 | 0 | 1 | 0 | 1 | 0 | 0 | 0 | 14 |
| 57 | 1 | 1 | 1 | 0 | 1 | 0 | 1 | 1 | 1 | 1 | 943 | 0 | 0 | 0 | 0 | 1 | 0 | 1 | 0 | 1 | 0 | 7 | 0 |
| 58 | 0 | 1 | 1 | 1 | 0 | 1 | 0 | 1 | 1 | 1 | 471 | 1 | 0 | 0 | 0 | 0 | 1 | 0 | 1 | 0 | 1 | 16 | 7 |
| 59 | 1 | 0 | 1 | 1 | 1 | 0 | 1 | 0 | 1 | 1 | 747 | 1 | 1 | 0 | 0 | 0 | 0 | 1 | 0 | 1 | 0 | 19 | 16 |
| 60 | 0 | 1 | 0 | 1 | 1 | 1 | 0 | 1 | 0 | 1 | 373 | 1 | 1 | 1 | 0 | 0 | 0 | 0 | 1 | 0 | 1 | 24 | 19 |
| 61 | 1 | 0 | 1 | 0 | 1 | 1 | 1 | 0 | 1 | 0 | 698 | 1 | 1 | 1 | 1 | 0 | 0 | 0 | 0 | 1 | 0 | 25 | 24 |
| 62 | 1 | 1 | 0 | 1 | 0 | 1 | 1 | 1 | 0 | 1 | 861 | 0 | 1 | 1 | 1 | 1 | 0 | 0 | 0 | 0 | 1 | 12 | 25 |
| 63 | 0 | 1 | 1 | 0 | 1 | 0 | 1 | 1 | 1 | 0 | 430 | 1 | 0 | 1 | 1 | 1 | 1 | 0 | 0 | 0 | 0 | 28 | 12 |
| 64 | 1 | 0 | 1 | 1 | 0 | 1 | 0 | 1 | 1 | 1 | 727 | 0 | 1 | 0 | 1 | 1 | 1 | 1 | 0 | 0 | 0 | 6 | 28 |
| 65 | 1 | 1 | 0 | 1 | 1 | 0 | 1 | 0 | 1 | 1 | 875 | 1 | 0 | 1 | 0 | 1 | 1 | 1 | 1 | 0 | 0 | 30 | 6 |
| 66 | 0 | 1 | 1 | 0 | 1 | 1 | 0 | 1 | 0 | 1 | 437 | 1 | 1 | 0 | 1 | 0 | 1 | 1 | 1 | 1 | 0 | 19 | 30 |
| 67 | 1 | 0 | 1 | 1 | 0 | 1 | 1 | 0 | 1 | 0 | 730 | 1 | 1 | 1 | 0 | 1 | 0 | 1 | 1 | 1 | 1 | 31 | 19 |
| 68 | 1 | 1 | 0 | 1 | 1 | 0 | 1 | 1 | 0 | 1 | 877 | 0 | 1 | 1 | 1 | 0 | 1 | 0 | 1 | 1 | 1 | 9 | 31 |
| 69 | 0 | 1 | 1 | 0 | 1 | 1 | 0 | 1 | 1 | 0 | 438 | 1 | 0 | 1 | 1 | 1 | 0 | 1 | 0 | 1 | 1 | 31 | 9 |
| 70 | 0 | 0 | 1 | 1 | 0 | 1 | 1 | 0 | 1 | 1 | 219 | 0 | 1 | 0 | 1 | 1 | 1 | 0 | 1 | 0 | 1 | 4 | 31 |
| 71 | 0 | 0 | 0 | 1 | 1 | 0 | 1 | 1 | 0 | 1 | 109 | 1 | 0 | 1 | 0 | 1 | 1 | 1 | 0 | 1 | 0 | 31 | 4 |
| 72 | 0 | 0 | 0 | 0 | 1 | 1 | 0 | 1 | 1 | 0 | 54 | 1 | 1 | 0 | 1 | 0 | 1 | 1 | 1 | 0 | 1 | 18 | 31 |
| 73 | 0 | 0 | 0 | 0 | 0 | 1 | 1 | 0 | 1 | 1 | 27 | 0 | 1 | 1 | 0 | 1 | 0 | 1 | 1 | 1 | 0 | 15 | 18 |
| 74 | 0 | 0 | 0 | 0 | 0 | 0 | 1 | 1 | 0 | 1 | 13 | 1 | 0 | 1 | 1 | 0 | 1 | 0 | 1 | 1 | 1 | 25 | 15 |
| 75 | 0 | 0 | 0 | 0 | 0 | 0 | 0 | 1 | 1 | 0 | 6 | 1 | 1 | 0 | 1 | 1 | 0 | 1 | 0 | 1 | 1 | 23 | 25 |

FIG.7

| CYCLE | AP4 | AQ4 | AP3 | AQ3 | AP2 | AQ2 | AP1 | AQ1 | AP0 | AQ0 | AP (Decimal) | AQ (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | X | X | X | X | X | X | X | X | X | X | X | X |
| 1 | 1 | 0 | 0 | 0 | 0 | 0 | 0 | 0 | 0 | 0 | 16 | 0 | 0 | X | X | X | X | X | X | X | X | X | X | X |
| 2 | 1 | 1 | 0 | 0 | 0 | 0 | 0 | 0 | 0 | 0 | 16 | 16 | 0 | 0 | X | X | X | X | X | X | X | X | X | X |
| 3 | 0 | 1 | 1 | 0 | 0 | 0 | 0 | 0 | 0 | 0 | 8 | 16 | 0 | 0 | 0 | X | X | X | X | X | X | X | X | X |
| 4 | 0 | 0 | 1 | 1 | 0 | 0 | 0 | 0 | 0 | 0 | 8 | 8 | 0 | 0 | 0 | 0 | X | X | X | X | X | X | X | X |
| 5 | 0 | 0 | 0 | 1 | 1 | 0 | 0 | 0 | 0 | 0 | 4 | 8 | 0 | 0 | 0 | 0 | 0 | X | X | X | X | X | X | X |
| 6 | 0 | 0 | 0 | 0 | 1 | 1 | 0 | 0 | 0 | 0 | 4 | 4 | 0 | 0 | 0 | 0 | 0 | 0 | X | X | X | X | X | X |
| 7 | 1 | 0 | 0 | 0 | 0 | 1 | 1 | 0 | 0 | 0 | 18 | 4 | 0 | 0 | 0 | 0 | 0 | 0 | 0 | X | X | X | X | X |
| 8 | 1 | 1 | 0 | 0 | 0 | 0 | 1 | 1 | 0 | 0 | 18 | 18 | 0 | 0 | 0 | 0 | 0 | 0 | 0 | 0 | X | X | X | X |
| 9 | 0 | 1 | 1 | 0 | 0 | 0 | 0 | 1 | 1 | 0 | 9 | 18 | 0 | 0 | 0 | 0 | 0 | 0 | 0 | 0 | 0 | X | 0 | X |
| 10 | 0 | 0 | 1 | 1 | 0 | 0 | 0 | 0 | 1 | 1 | 9 | 9 | 0 | 0 | 0 | 0 | 0 | 0 | 0 | 0 | 0 | 0 | 0 | 0 |
| 11 | 1 | 0 | 0 | 1 | 1 | 0 | 0 | 0 | 0 | 1 | 20 | 9 | 1 | 0 | 0 | 0 | 0 | 0 | 0 | 0 | 0 | 0 | 16 | 0 |
| 12 | 1 | 1 | 0 | 0 | 1 | 1 | 0 | 0 | 0 | 0 | 20 | 20 | 1 | 1 | 0 | 0 | 0 | 0 | 0 | 0 | 0 | 0 | 16 | 16 |
| 13 | 1 | 1 | 1 | 0 | 0 | 1 | 1 | 0 | 0 | 0 | 26 | 20 | 0 | 1 | 1 | 0 | 0 | 0 | 0 | 0 | 0 | 0 | 8 | 16 |
| 14 | 1 | 1 | 1 | 1 | 0 | 0 | 1 | 1 | 0 | 0 | 26 | 26 | 0 | 0 | 1 | 1 | 0 | 0 | 0 | 0 | 0 | 0 | 8 | 8 |
| 15 | 0 | 1 | 1 | 1 | 1 | 0 | 0 | 1 | 1 | 0 | 13 | 26 | 0 | 0 | 0 | 1 | 1 | 0 | 0 | 0 | 0 | 0 | 4 | 8 |
| 16 | 0 | 0 | 1 | 1 | 1 | 1 | 0 | 0 | 1 | 1 | 13 | 13 | 0 | 0 | 0 | 0 | 1 | 1 | 0 | 0 | 0 | 0 | 4 | 4 |
| 17 | 0 | 0 | 0 | 1 | 1 | 1 | 1 | 0 | 0 | 1 | 6 | 13 | 1 | 0 | 0 | 0 | 0 | 1 | 1 | 0 | 0 | 0 | 18 | 4 |
| 18 | 0 | 0 | 0 | 0 | 1 | 1 | 1 | 1 | 0 | 0 | 6 | 6 | 1 | 1 | 0 | 0 | 0 | 0 | 1 | 1 | 0 | 0 | 18 | 18 |
| 19 | 1 | 0 | 0 | 0 | 0 | 1 | 1 | 1 | 1 | 0 | 19 | 6 | 0 | 1 | 1 | 0 | 0 | 0 | 0 | 1 | 1 | 0 | 9 | 18 |
| 20 | 1 | 1 | 0 | 0 | 0 | 0 | 1 | 1 | 1 | 1 | 19 | 19 | 0 | 0 | 1 | 1 | 0 | 0 | 0 | 0 | 1 | 1 | 9 | 9 |
| 21 | 1 | 1 | 1 | 0 | 0 | 0 | 0 | 1 | 1 | 1 | 25 | 19 | 1 | 0 | 0 | 1 | 1 | 0 | 0 | 0 | 0 | 1 | 20 | 9 |
| 22 | 1 | 1 | 1 | 1 | 0 | 0 | 0 | 0 | 1 | 1 | 25 | 25 | 1 | 1 | 0 | 0 | 1 | 1 | 0 | 0 | 0 | 0 | 20 | 20 |
| 23 | 1 | 1 | 1 | 1 | 1 | 0 | 0 | 0 | 0 | 1 | 28 | 25 | 1 | 1 | 1 | 0 | 0 | 1 | 1 | 0 | 0 | 0 | 26 | 20 |
| 24 | 1 | 1 | 1 | 1 | 1 | 1 | 0 | 0 | 0 | 0 | 28 | 28 | 1 | 1 | 1 | 1 | 0 | 0 | 1 | 1 | 0 | 0 | 26 | 26 |
| 25 | 1 | 1 | 1 | 1 | 1 | 1 | 1 | 0 | 0 | 0 | 30 | 28 | 0 | 1 | 1 | 1 | 1 | 0 | 0 | 1 | 1 | 0 | 13 | 26 |
| 26 | 1 | 1 | 1 | 1 | 1 | 1 | 1 | 1 | 0 | 0 | 30 | 30 | 0 | 0 | 1 | 1 | 1 | 1 | 0 | 0 | 1 | 1 | 13 | 13 |
| 27 | 1 | 1 | 1 | 1 | 1 | 1 | 1 | 1 | 1 | 0 | 31 | 30 | 0 | 0 | 0 | 1 | 1 | 1 | 1 | 0 | 0 | 1 | 6 | 13 |
| 28 | 1 | 1 | 1 | 1 | 1 | 1 | 1 | 1 | 1 | 1 | 31 | 31 | 0 | 0 | 0 | 0 | 1 | 1 | 1 | 1 | 0 | 0 | 6 | 6 |
| 29 | 0 | 1 | 1 | 1 | 1 | 1 | 1 | 1 | 1 | 1 | 15 | 31 | 1 | 0 | 0 | 0 | 0 | 1 | 1 | 1 | 1 | 0 | 19 | 6 |
| 30 | 0 | 0 | 1 | 1 | 1 | 1 | 1 | 1 | 1 | 1 | 15 | 15 | 1 | 1 | 0 | 0 | 0 | 0 | 1 | 1 | 1 | 1 | 19 | 19 |
| 31 | 0 | 0 | 0 | 1 | 1 | 1 | 1 | 1 | 1 | 1 | 7 | 15 | 1 | 1 | 1 | 0 | 0 | 0 | 0 | 1 | 1 | 1 | 25 | 19 |
| 32 | 0 | 0 | 0 | 0 | 1 | 1 | 1 | 1 | 1 | 1 | 7 | 7 | 1 | 1 | 1 | 1 | 0 | 0 | 0 | 0 | 1 | 1 | 25 | 25 |
| 33 | 0 | 0 | 0 | 0 | 0 | 1 | 1 | 1 | 1 | 1 | 3 | 7 | 1 | 1 | 1 | 1 | 1 | 0 | 0 | 0 | 0 | 1 | 28 | 25 |
| 34 | 0 | 0 | 0 | 0 | 0 | 0 | 1 | 1 | 1 | 1 | 3 | 3 | 1 | 1 | 1 | 1 | 1 | 1 | 0 | 0 | 0 | 0 | 28 | 28 |
| 35 | 1 | 0 | 0 | 0 | 0 | 0 | 0 | 1 | 1 | 1 | 17 | 3 | 1 | 1 | 1 | 1 | 1 | 1 | 1 | 0 | 0 | 0 | 30 | 28 |
| 36 | 1 | 1 | 0 | 0 | 0 | 0 | 0 | 0 | 1 | 1 | 17 | 17 | 1 | 1 | 1 | 1 | 1 | 1 | 1 | 1 | 0 | 0 | 30 | 30 |
| 37 | 1 | 1 | 1 | 0 | 0 | 0 | 0 | 0 | 0 | 1 | 24 | 17 | 1 | 1 | 1 | 1 | 1 | 1 | 1 | 1 | 1 | 0 | 31 | 30 |
| 38 | 1 | 1 | 1 | 1 | 0 | 0 | 0 | 0 | 0 | 0 | 24 | 24 | 1 | 1 | 1 | 1 | 1 | 1 | 1 | 1 | 1 | 1 | 31 | 31 |
| 39 | 0 | 1 | 1 | 1 | 1 | 0 | 0 | 0 | 0 | 0 | 12 | 24 | 0 | 1 | 1 | 1 | 1 | 1 | 1 | 1 | 1 | 1 | 15 | 31 |
| 40 | 0 | 0 | 1 | 1 | 1 | 1 | 0 | 0 | 0 | 0 | 12 | 12 | 0 | 0 | 1 | 1 | 1 | 1 | 1 | 1 | 1 | 1 | 15 | 15 |
| 41 | 1 | 0 | 0 | 1 | 1 | 1 | 0 | 0 | 0 | 0 | 22 | 12 | 0 | 0 | 0 | 1 | 1 | 1 | 1 | 1 | 1 | 1 | 7 | 15 |
| 42 | 1 | 1 | 0 | 0 | 1 | 1 | 1 | 0 | 0 | 0 | 22 | 22 | 0 | 0 | 0 | 0 | 1 | 1 | 1 | 1 | 1 | 1 | 7 | 7 |
| 43 | 1 | 1 | 0 | 0 | 0 | 1 | 1 | 1 | 0 | 0 | 27 | 22 | 0 | 0 | 0 | 0 | 0 | 1 | 1 | 1 | 1 | 1 | 3 | 7 |
| 44 | 1 | 1 | 1 | 0 | 0 | 0 | 1 | 1 | 1 | 0 | 27 | 27 | 0 | 0 | 0 | 0 | 0 | 0 | 1 | 1 | 1 | 1 | 3 | 3 |
| 45 | 1 | 1 | 1 | 1 | 0 | 0 | 0 | 1 | 1 | 1 | 29 | 27 | 1 | 0 | 0 | 0 | 0 | 0 | 0 | 1 | 1 | 1 | 17 | 3 |
| 46 | 1 | 1 | 1 | 1 | 1 | 0 | 0 | 0 | 1 | 1 | 29 | 29 | 1 | 1 | 0 | 0 | 0 | 0 | 0 | 0 | 1 | 1 | 17 | 17 |
| 47 | 0 | 1 | 1 | 1 | 1 | 1 | 0 | 0 | 0 | 1 | 14 | 29 | 1 | 1 | 1 | 0 | 0 | 0 | 0 | 0 | 0 | 1 | 24 | 17 |
| 48 | 0 | 0 | 1 | 1 | 1 | 1 | 1 | 0 | 0 | 0 | 14 | 14 | 1 | 1 | 1 | 1 | 0 | 0 | 0 | 0 | 0 | 0 | 24 | 24 |
| 49 | 1 | 0 | 0 | 1 | 1 | 1 | 1 | 1 | 0 | 0 | 23 | 14 | 0 | 1 | 1 | 1 | 1 | 0 | 0 | 0 | 0 | 0 | 12 | 24 |
| 50 | 1 | 1 | 0 | 0 | 1 | 1 | 1 | 1 | 1 | 0 | 23 | 23 | 0 | 0 | 1 | 1 | 1 | 1 | 0 | 0 | 0 | 0 | 12 | 12 |
| 51 | 0 | 1 | 1 | 0 | 0 | 1 | 1 | 1 | 1 | 1 | 11 | 23 | 1 | 0 | 0 | 1 | 1 | 1 | 1 | 0 | 0 | 0 | 22 | 12 |
| 52 | 0 | 0 | 1 | 1 | 0 | 0 | 1 | 1 | 1 | 1 | 11 | 11 | 1 | 1 | 0 | 0 | 1 | 1 | 1 | 1 | 0 | 0 | 22 | 22 |
| 53 | 1 | 0 | 0 | 1 | 1 | 0 | 0 | 1 | 1 | 1 | 21 | 11 | 1 | 1 | 1 | 0 | 0 | 1 | 1 | 1 | 1 | 0 | 27 | 22 |
| 54 | 1 | 1 | 0 | 0 | 1 | 1 | 0 | 0 | 1 | 1 | 21 | 21 | 1 | 1 | 1 | 1 | 0 | 0 | 1 | 1 | 1 | 1 | 27 | 27 |
| 55 | 0 | 1 | 1 | 0 | 0 | 1 | 1 | 0 | 0 | 1 | 10 | 21 | 1 | 1 | 1 | 1 | 1 | 0 | 0 | 1 | 1 | 1 | 29 | 27 |
| 56 | 0 | 0 | 1 | 1 | 0 | 0 | 1 | 1 | 0 | 0 | 10 | 10 | 1 | 1 | 1 | 1 | 1 | 1 | 0 | 0 | 1 | 1 | 29 | 29 |
| 57 | 0 | 0 | 0 | 1 | 1 | 0 | 0 | 1 | 1 | 0 | 5 | 10 | 1 | 1 | 1 | 1 | 1 | 1 | 1 | 0 | 0 | 1 | 14 | 29 |
| 58 | 0 | 0 | 0 | 0 | 1 | 1 | 0 | 0 | 1 | 1 | 5 | 5 | 0 | 1 | 1 | 1 | 1 | 1 | 1 | 1 | 0 | 0 | 14 | 14 |
| 59 | 0 | 0 | 0 | 0 | 0 | 1 | 1 | 0 | 0 | 1 | 2 | 5 | 1 | 0 | 1 | 1 | 1 | 1 | 1 | 1 | 1 | 0 | 23 | 14 |
| 60 | 0 | 0 | 0 | 0 | 0 | 0 | 1 | 1 | 0 | 0 | 2 | 2 | 1 | 1 | 0 | 1 | 1 | 1 | 1 | 1 | 1 | 1 | 23 | 23 |
| 61 | 0 | 0 | 0 | 0 | 0 | 0 | 0 | 1 | 1 | 0 | 1 | 2 | 0 | 1 | 1 | 0 | 1 | 1 | 1 | 1 | 1 | 1 | 11 | 23 |
| 62 | 0 | 0 | 0 | 0 | 0 | 0 | 0 | 0 | 1 | 1 | 1 | 1 | 0 | 0 | 1 | 1 | 0 | 1 | 1 | 1 | 1 | 1 | 11 | 11 |
| 63 | 0 | 0 | 0 | 0 | 0 | 0 | 0 | 0 | 0 | 1 | 0 | 1 | 1 | 0 | 0 | 1 | 1 | 0 | 1 | 1 | 1 | 1 | 21 | 11 |
| 64 | 0 | 0 | 0 | 0 | 0 | 0 | 0 | 0 | 0 | 0 | 0 | 0 | 1 | 1 | 0 | 0 | 1 | 1 | 0 | 1 | 1 | 1 | 21 | 21 |
| 65 | 1 | 0 | 0 | 0 | 0 | 0 | 0 | 0 | 0 | 0 | 16 | 0 | 0 | 1 | 1 | 0 | 0 | 1 | 1 | 0 | 1 | 1 | 10 | 21 |
| 66 | 1 | 1 | 0 | 0 | 0 | 0 | 0 | 0 | 0 | 0 | 16 | 16 | 0 | 0 | 1 | 1 | 0 | 0 | 1 | 1 | 0 | 1 | 10 | 10 |
| 67 | 0 | 1 | 1 | 0 | 0 | 0 | 0 | 0 | 0 | 0 | 8 | 16 | 0 | 0 | 0 | 1 | 1 | 0 | 0 | 1 | 1 | 0 | 5 | 10 |
| 68 | 0 | 0 | 1 | 1 | 0 | 0 | 0 | 0 | 0 | 0 | 8 | 8 | 0 | 0 | 0 | 0 | 1 | 1 | 0 | 0 | 1 | 1 | 5 | 5 |
| 69 | 0 | 0 | 0 | 1 | 1 | 0 | 0 | 0 | 0 | 0 | 4 | 8 | 0 | 0 | 0 | 0 | 0 | 1 | 1 | 0 | 0 | 1 | 2 | 5 |
| 70 | 0 | 0 | 0 | 0 | 1 | 1 | 0 | 0 | 0 | 0 | 4 | 4 | 0 | 0 | 0 | 0 | 0 | 0 | 1 | 1 | 0 | 0 | 2 | 2 |
| 71 | 1 | 0 | 0 | 0 | 0 | 1 | 1 | 0 | 0 | 0 | 18 | 4 | 0 | 0 | 0 | 0 | 0 | 0 | 0 | 1 | 1 | 0 | 1 | 2 |
| 72 | 1 | 1 | 0 | 0 | 0 | 0 | 1 | 1 | 0 | 0 | 18 | 18 | 0 | 0 | 0 | 0 | 0 | 0 | 0 | 0 | 1 | 1 | 1 | 1 |
| 73 | 0 | 1 | 1 | 0 | 0 | 0 | 0 | 1 | 1 | 0 | 9 | 18 | 0 | 0 | 0 | 0 | 0 | 0 | 0 | 0 | 0 | 1 | 0 | 1 |
| 74 | 0 | 0 | 1 | 1 | 0 | 0 | 0 | 0 | 1 | 1 | 9 | 9 | 0 | 0 | 0 | 0 | 0 | 0 | 0 | 0 | 0 | 0 | 0 | 0 |
| 75 | 1 | 0 | 0 | 1 | 1 | 0 | 0 | 0 | 0 | 1 | 20 | 9 | 1 | 0 | 0 | 0 | 0 | 0 | 0 | 0 | 0 | 0 | 16 | 0 |

| CYCLE | HOLD | A4 | A3 | A2 | A1 | A0 | A (Decimal) | XA (Decimal) | YA (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|
| 0 | 1 | 0 | 0 | 0 | 0 | 0 | 0 | 0 | 0 | X | X | X | X | X | X | X | X | X | X | X | X |
| 1 | 0 | 0 | 0 | 0 | 0 | 0 | 0 | 0 | 0 | 0 | X | X | X | X | X | X | X | X | X | X | X |
| 2 | 1 | 1 | 0 | 0 | 0 | 0 | 16 | 4 | 0 | 0 | 0 | X | X | X | X | X | X | X | X | X | X |
| 3 | 0 | 1 | 0 | 0 | 0 | 0 | 16 | 4 | 0 | 0 | 0 | 0 | X | X | X | X | X | X | X | X | X |
| 4 | 1 | 1 | 1 | 0 | 0 | 0 | 24 | 6 | 0 | 0 | 0 | 0 | 0 | X | X | X | X | X | X | X | X |
| 5 | 0 | 1 | 1 | 0 | 0 | 0 | 24 | 6 | 0 | 0 | 0 | 0 | 0 | 0 | X | X | X | X | X | X | X |
| 6 | 1 | 1 | 1 | 1 | 0 | 0 | 28 | 7 | 0 | 0 | 0 | 0 | 0 | 0 | 0 | X | X | X | X | X | X |
| 7 | 0 | 1 | 1 | 1 | 0 | 0 | 28 | 7 | 0 | 0 | 0 | 0 | 0 | 0 | 0 | 0 | X | X | X | X | X |
| 8 | 1 | 0 | 1 | 1 | 1 | 0 | 14 | 3 | 2 | 0 | 0 | 0 | 0 | 0 | 0 | 0 | 0 | X | X | X | X |
| 9 | 0 | 0 | 1 | 1 | 1 | 0 | 14 | 3 | 2 | 0 | 0 | 0 | 0 | 0 | 0 | 0 | 0 | 0 | X | 0 | X |
| 10 | 1 | 0 | 0 | 1 | 1 | 1 | 7 | 1 | 3 | 0 | 0 | 0 | 0 | 0 | 0 | 0 | 0 | 0 | 0 | 0 | 0 |
| 11 | 0 | 0 | 0 | 1 | 1 | 1 | 7 | 1 | 3 | 1 | 0 | 0 | 0 | 0 | 0 | 0 | 0 | 0 | 0 | 16 | 0 |
| 12 | 1 | 1 | 0 | 0 | 1 | 1 | 19 | 4 | 3 | 1 | 1 | 0 | 0 | 0 | 0 | 0 | 0 | 0 | 0 | 16 | 16 |
| 13 | 0 | 1 | 0 | 0 | 1 | 1 | 19 | 4 | 3 | 1 | 1 | 1 | 0 | 0 | 0 | 0 | 0 | 0 | 0 | 24 | 16 |
| 14 | 1 | 0 | 1 | 0 | 0 | 1 | 9 | 2 | 1 | 1 | 1 | 1 | 1 | 0 | 0 | 0 | 0 | 0 | 0 | 24 | 24 |
| 15 | 0 | 0 | 1 | 0 | 0 | 1 | 9 | 2 | 1 | 1 | 1 | 1 | 1 | 1 | 0 | 0 | 0 | 0 | 0 | 28 | 24 |
| 16 | 1 | 0 | 0 | 1 | 0 | 0 | 4 | 1 | 0 | 1 | 1 | 1 | 1 | 1 | 1 | 0 | 0 | 0 | 0 | 28 | 28 |
| 17 | 0 | 0 | 0 | 1 | 0 | 0 | 4 | 1 | 0 | 0 | 1 | 1 | 1 | 1 | 1 | 1 | 0 | 0 | 0 | 14 | 28 |
| 18 | 1 | 0 | 0 | 0 | 1 | 0 | 2 | 0 | 2 | 0 | 0 | 1 | 1 | 1 | 1 | 1 | 1 | 0 | 0 | 14 | 14 |
| 19 | 0 | 0 | 0 | 0 | 1 | 0 | 2 | 0 | 2 | 0 | 0 | 0 | 1 | 1 | 1 | 1 | 1 | 1 | 0 | 7 | 14 |
| 20 | 1 | 1 | 0 | 0 | 0 | 1 | 17 | 4 | 1 | 0 | 0 | 0 | 0 | 1 | 1 | 1 | 1 | 1 | 1 | 7 | 7 |
| 21 | 0 | 1 | 0 | 0 | 0 | 1 | 17 | 4 | 1 | 1 | 0 | 0 | 0 | 0 | 1 | 1 | 1 | 1 | 1 | 19 | 7 |
| 22 | 1 | 0 | 1 | 0 | 0 | 0 | 8 | 2 | 0 | 1 | 1 | 0 | 0 | 0 | 0 | 1 | 1 | 1 | 1 | 19 | 19 |
| 23 | 0 | 0 | 1 | 0 | 0 | 0 | 8 | 2 | 0 | 0 | 1 | 1 | 0 | 0 | 0 | 0 | 1 | 1 | 1 | 9 | 19 |
| 24 | 1 | 1 | 0 | 1 | 0 | 0 | 20 | 5 | 0 | 0 | 0 | 1 | 1 | 0 | 0 | 0 | 0 | 1 | 1 | 9 | 9 |
| 25 | 0 | 1 | 0 | 1 | 0 | 0 | 20 | 5 | 0 | 0 | 0 | 0 | 1 | 1 | 0 | 0 | 0 | 0 | 1 | 4 | 9 |
| 26 | 1 | 0 | 1 | 0 | 1 | 0 | 10 | 2 | 2 | 0 | 0 | 0 | 0 | 1 | 1 | 0 | 0 | 0 | 0 | 4 | 4 |
| 27 | 0 | 0 | 1 | 0 | 1 | 0 | 10 | 2 | 2 | 0 | 0 | 0 | 0 | 0 | 1 | 1 | 0 | 0 | 0 | 2 | 4 |
| 28 | 1 | 1 | 0 | 1 | 0 | 1 | 21 | 5 | 1 | 0 | 0 | 0 | 0 | 0 | 0 | 1 | 1 | 0 | 0 | 2 | 2 |
| 29 | 0 | 1 | 0 | 1 | 0 | 1 | 21 | 5 | 1 | 1 | 0 | 0 | 0 | 0 | 0 | 0 | 1 | 1 | 0 | 17 | 2 |
| 30 | 1 | 1 | 1 | 0 | 1 | 0 | 26 | 6 | 2 | 1 | 1 | 0 | 0 | 0 | 0 | 0 | 0 | 1 | 1 | 17 | 17 |
| 31 | 0 | 1 | 1 | 0 | 1 | 0 | 26 | 6 | 2 | 0 | 1 | 1 | 0 | 0 | 0 | 0 | 0 | 0 | 1 | 8 | 17 |
| 32 | 1 | 1 | 1 | 1 | 0 | 1 | 29 | 7 | 1 | 0 | 0 | 1 | 1 | 0 | 0 | 0 | 0 | 0 | 0 | 8 | 8 |
| 33 | 0 | 1 | 1 | 1 | 0 | 1 | 29 | 7 | 1 | 1 | 0 | 0 | 1 | 1 | 0 | 0 | 0 | 0 | 0 | 20 | 8 |
| 34 | 1 | 1 | 1 | 1 | 1 | 0 | 30 | 7 | 2 | 1 | 1 | 0 | 0 | 1 | 1 | 0 | 0 | 0 | 0 | 20 | 20 |
| 35 | 0 | 1 | 1 | 1 | 1 | 0 | 30 | 7 | 2 | 1 | 1 | 1 | 0 | 0 | 1 | 1 | 0 | 0 | 0 | 10 | 20 |
| 36 | 1 | 0 | 1 | 1 | 1 | 1 | 15 | 3 | 3 | 0 | 1 | 1 | 1 | 0 | 0 | 1 | 1 | 0 | 0 | 10 | 10 |
| 37 | 0 | 0 | 1 | 1 | 1 | 1 | 15 | 3 | 3 | 1 | 0 | 1 | 1 | 1 | 0 | 0 | 1 | 1 | 0 | 21 | 10 |
| 38 | 1 | 1 | 0 | 1 | 1 | 1 | 23 | 5 | 3 | 1 | 1 | 0 | 1 | 1 | 1 | 0 | 0 | 1 | 1 | 21 | 21 |
| 39 | 0 | 1 | 0 | 1 | 1 | 1 | 23 | 5 | 3 | 1 | 1 | 1 | 0 | 1 | 1 | 1 | 0 | 0 | 1 | 26 | 21 |
| 40 | 1 | 1 | 1 | 0 | 1 | 1 | 27 | 6 | 3 | 1 | 1 | 1 | 1 | 0 | 1 | 1 | 1 | 0 | 0 | 26 | 26 |
| 41 | 0 | 1 | 1 | 0 | 1 | 1 | 27 | 6 | 3 | 1 | 1 | 1 | 1 | 1 | 0 | 1 | 1 | 1 | 0 | 29 | 26 |
| 42 | 1 | 0 | 1 | 1 | 0 | 1 | 13 | 3 | 1 | 1 | 1 | 1 | 1 | 1 | 1 | 0 | 1 | 1 | 1 | 29 | 29 |
| 43 | 0 | 0 | 1 | 1 | 0 | 1 | 13 | 3 | 1 | 1 | 1 | 1 | 1 | 1 | 1 | 1 | 0 | 0 | 1 | 30 | 29 |
| 44 | 1 | 1 | 0 | 1 | 1 | 0 | 22 | 5 | 2 | 1 | 1 | 1 | 1 | 1 | 1 | 1 | 0 | 0 | 0 | 30 | 30 |
| 45 | 0 | 1 | 0 | 1 | 1 | 0 | 22 | 5 | 2 | 0 | 1 | 1 | 1 | 1 | 1 | 1 | 1 | 0 | 0 | 15 | 30 |
| 46 | 1 | 0 | 1 | 0 | 1 | 1 | 11 | 2 | 3 | 0 | 0 | 1 | 1 | 1 | 1 | 1 | 1 | 1 | 0 | 15 | 15 |
| 47 | 0 | 0 | 1 | 0 | 1 | 1 | 11 | 2 | 3 | 1 | 0 | 0 | 1 | 1 | 1 | 1 | 1 | 1 | 1 | 23 | 15 |
| 48 | 1 | 0 | 0 | 1 | 0 | 1 | 5 | 1 | 1 | 1 | 1 | 0 | 0 | 1 | 1 | 1 | 1 | 1 | 1 | 23 | 23 |
| 49 | 0 | 0 | 0 | 1 | 0 | 1 | 5 | 1 | 1 | 0 | 1 | 1 | 0 | 0 | 1 | 1 | 1 | 1 | 1 | 27 | 23 |
| 50 | 1 | 1 | 0 | 0 | 1 | 0 | 18 | 4 | 2 | 1 | 0 | 1 | 1 | 0 | 0 | 1 | 1 | 1 | 1 | 27 | 27 |
| 51 | 0 | 1 | 0 | 0 | 1 | 0 | 18 | 4 | 2 | 0 | 1 | 0 | 1 | 1 | 0 | 0 | 1 | 1 | 1 | 13 | 27 |
| 52 | 1 | 1 | 1 | 0 | 0 | 1 | 25 | 6 | 1 | 1 | 0 | 1 | 0 | 1 | 1 | 0 | 0 | 1 | 1 | 13 | 13 |
| 53 | 0 | 1 | 1 | 0 | 0 | 1 | 25 | 6 | 1 | 1 | 1 | 0 | 1 | 0 | 1 | 1 | 0 | 0 | 1 | 22 | 13 |
| 54 | 1 | 0 | 1 | 1 | 0 | 0 | 12 | 3 | 0 | 0 | 1 | 1 | 0 | 1 | 0 | 1 | 1 | 0 | 0 | 22 | 22 |
| 55 | 0 | 0 | 1 | 1 | 0 | 0 | 12 | 3 | 0 | 0 | 0 | 1 | 1 | 0 | 1 | 0 | 1 | 1 | 0 | 11 | 22 |
| 56 | 1 | 0 | 0 | 1 | 1 | 0 | 6 | 1 | 2 | 0 | 0 | 0 | 1 | 1 | 0 | 1 | 0 | 1 | 1 | 11 | 11 |
| 57 | 0 | 0 | 0 | 1 | 1 | 0 | 6 | 1 | 2 | 0 | 0 | 0 | 0 | 1 | 1 | 0 | 1 | 0 | 1 | 5 | 11 |
| 58 | 1 | 0 | 0 | 0 | 1 | 1 | 3 | 0 | 3 | 0 | 0 | 0 | 0 | 0 | 1 | 1 | 0 | 1 | 0 | 5 | 5 |
| 59 | 0 | 0 | 0 | 0 | 1 | 1 | 3 | 0 | 3 | 1 | 0 | 0 | 0 | 0 | 0 | 1 | 1 | 0 | 1 | 18 | 5 |
| 60 | 1 | 0 | 0 | 0 | 0 | 1 | 1 | 0 | 1 | 1 | 1 | 0 | 0 | 0 | 0 | 0 | 1 | 1 | 0 | 18 | 18 |
| 61 | 0 | 0 | 0 | 0 | 0 | 1 | 1 | 0 | 1 | 1 | 1 | 1 | 0 | 0 | 0 | 0 | 0 | 1 | 0 | 25 | 18 |
| 62 | 1 | 0 | 0 | 0 | 0 | 0 | 0 | 0 | 0 | 1 | 1 | 1 | 1 | 0 | 0 | 0 | 0 | 1 | 1 | 25 | 25 |
| 63 | 0 | 0 | 0 | 0 | 0 | 0 | 0 | 0 | 0 | 0 | 1 | 1 | 1 | 1 | 0 | 0 | 0 | 0 | 1 | 12 | 25 |
| 64 | 1 | 1 | 0 | 0 | 0 | 0 | 16 | 4 | 0 | 0 | 0 | 1 | 1 | 1 | 1 | 0 | 0 | 0 | 0 | 12 | 12 |
| 65 | 0 | 1 | 0 | 0 | 0 | 0 | 16 | 4 | 0 | 0 | 0 | 0 | 1 | 1 | 1 | 1 | 0 | 0 | 0 | 6 | 12 |
| 66 | 1 | 1 | 1 | 0 | 0 | 0 | 24 | 6 | 0 | 0 | 0 | 0 | 0 | 1 | 1 | 1 | 1 | 0 | 0 | 6 | 6 |
| 67 | 0 | 1 | 1 | 0 | 0 | 0 | 24 | 6 | 0 | 0 | 0 | 0 | 0 | 0 | 1 | 1 | 1 | 1 | 0 | 3 | 6 |
| 68 | 1 | 1 | 1 | 1 | 0 | 0 | 28 | 7 | 0 | 0 | 0 | 0 | 0 | 0 | 0 | 1 | 1 | 1 | 1 | 3 | 3 |
| 69 | 0 | 1 | 1 | 1 | 0 | 0 | 28 | 7 | 0 | 0 | 0 | 0 | 0 | 0 | 0 | 0 | 1 | 1 | 1 | 1 | 3 |
| 70 | 1 | 0 | 1 | 1 | 1 | 0 | 14 | 3 | 2 | 0 | 0 | 0 | 0 | 0 | 0 | 0 | 0 | 1 | 1 | 1 | 1 |
| 71 | 0 | 0 | 1 | 1 | 1 | 0 | 14 | 3 | 2 | 0 | 0 | 0 | 0 | 0 | 0 | 0 | 0 | 0 | 1 | 0 | 1 |
| 72 | 1 | 0 | 0 | 1 | 1 | 1 | 7 | 1 | 3 | 0 | 0 | 0 | 0 | 0 | 0 | 0 | 0 | 0 | 0 | 0 | 0 |
| 73 | 0 | 0 | 0 | 1 | 1 | 1 | 7 | 1 | 3 | 1 | 0 | 0 | 0 | 0 | 0 | 0 | 0 | 0 | 0 | 16 | 0 |
| 74 | 1 | 1 | 0 | 0 | 1 | 1 | 19 | 4 | 3 | 1 | 1 | 0 | 0 | 0 | 0 | 0 | 0 | 0 | 0 | 16 | 16 |
| 75 | 0 | 1 | 0 | 0 | 1 | 1 | 19 | 4 | 3 | 1 | 1 | 1 | 0 | 0 | 0 | 0 | 0 | 0 | 0 | 24 | 16 |

| CYCLE | AP4 | AQ4 | AP3 | AQ3 | AP2 | AQ2 | AP1 | AQ1 | AP0 | AQ0 | AP (Decimal) | AQ (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | X | X | X | X | X | X | X | X | X | X | X | X |
| 1 | 1 | 0 | 0 | 0 | 0 | 0 | 0 | 0 | 0 | 0 | 16 | 0 | 0 | X | X | X | X | X | X | X | X | X | X | X |
| 2 | 1 | 1 | 0 | 0 | 0 | 0 | 0 | 0 | 0 | 0 | 16 | 16 | 0 | 0 | X | X | X | X | X | X | X | X | X | X |
| 3 | 1 | 1 | 1 | 0 | 0 | 0 | 0 | 0 | 0 | 0 | 24 | 16 | 0 | 0 | 0 | X | X | X | X | X | X | X | X | X |
| 4 | 1 | 1 | 1 | 1 | 0 | 0 | 0 | 0 | 0 | 0 | 24 | 24 | 0 | 0 | 0 | 0 | X | X | X | X | X | X | X | X |
| 5 | 1 | 1 | 1 | 1 | 1 | 0 | 0 | 0 | 0 | 0 | 28 | 24 | 0 | 0 | 0 | 0 | 0 | X | X | X | X | X | X | X |
| 6 | 1 | 1 | 1 | 1 | 1 | 1 | 0 | 0 | 0 | 0 | 28 | 28 | 0 | 0 | 0 | 0 | 0 | 0 | X | X | X | X | X | X |
| 7 | 0 | 1 | 1 | 1 | 1 | 1 | 1 | 0 | 0 | 0 | 14 | 28 | 0 | 0 | 0 | 0 | 0 | 0 | 0 | X | X | X | X | X |
| 8 | 0 | 0 | 1 | 1 | 1 | 1 | 1 | 1 | 0 | 0 | 14 | 14 | 0 | 0 | 0 | 0 | 0 | 0 | 0 | 0 | X | X | X | X |
| 9 | 0 | 0 | 0 | 1 | 1 | 1 | 1 | 1 | 1 | 0 | 7 | 14 | 0 | 0 | 0 | 0 | 0 | 0 | 0 | 0 | 0 | X | 0 | X |
| 10 | 0 | 0 | 0 | 0 | 1 | 1 | 1 | 1 | 1 | 1 | 7 | 7 | 0 | 0 | 0 | 0 | 0 | 0 | 0 | 0 | 0 | 0 | 0 | 0 |
| 11 | 1 | 0 | 0 | 0 | 0 | 1 | 1 | 1 | 1 | 1 | 19 | 7 | 1 | 0 | 0 | 0 | 0 | 0 | 0 | 0 | 0 | 0 | 16 | 0 |
| 12 | 1 | 1 | 0 | 0 | 0 | 0 | 1 | 1 | 1 | 1 | 19 | 19 | 1 | 1 | 0 | 0 | 0 | 0 | 0 | 0 | 0 | 0 | 16 | 16 |
| 13 | 0 | 1 | 1 | 0 | 0 | 0 | 0 | 1 | 1 | 1 | 9 | 19 | 1 | 1 | 1 | 0 | 0 | 0 | 0 | 0 | 0 | 0 | 24 | 16 |
| 14 | 0 | 0 | 1 | 1 | 0 | 0 | 0 | 0 | 1 | 1 | 9 | 9 | 1 | 1 | 1 | 1 | 0 | 0 | 0 | 0 | 0 | 0 | 24 | 24 |
| 15 | 0 | 0 | 0 | 1 | 1 | 0 | 0 | 0 | 0 | 1 | 4 | 9 | 1 | 1 | 1 | 1 | 1 | 0 | 0 | 0 | 0 | 0 | 28 | 24 |
| 16 | 0 | 0 | 0 | 0 | 1 | 1 | 0 | 0 | 0 | 0 | 4 | 4 | 1 | 1 | 1 | 1 | 1 | 1 | 0 | 0 | 0 | 0 | 28 | 28 |
| 17 | 0 | 0 | 0 | 0 | 0 | 1 | 1 | 0 | 0 | 0 | 2 | 4 | 0 | 1 | 1 | 1 | 1 | 1 | 1 | 0 | 0 | 0 | 14 | 28 |
| 18 | 0 | 0 | 0 | 0 | 0 | 0 | 1 | 1 | 0 | 0 | 2 | 2 | 0 | 0 | 1 | 1 | 1 | 1 | 1 | 1 | 0 | 0 | 14 | 14 |
| 19 | 1 | 0 | 0 | 0 | 0 | 0 | 0 | 1 | 1 | 0 | 17 | 2 | 0 | 0 | 0 | 1 | 1 | 1 | 1 | 1 | 1 | 0 | 7 | 14 |
| 20 | 1 | 1 | 0 | 0 | 0 | 0 | 0 | 0 | 1 | 1 | 17 | 17 | 0 | 0 | 0 | 0 | 1 | 1 | 1 | 1 | 1 | 1 | 7 | 7 |
| 21 | 0 | 1 | 1 | 0 | 0 | 0 | 0 | 0 | 0 | 1 | 8 | 17 | 0 | 0 | 0 | 0 | 0 | 1 | 1 | 1 | 1 | 1 | 19 | 7 |
| 22 | 0 | 0 | 1 | 1 | 0 | 0 | 0 | 0 | 0 | 0 | 8 | 8 | 1 | 1 | 0 | 0 | 0 | 0 | 1 | 1 | 1 | 1 | 19 | 19 |
| 23 | 1 | 0 | 0 | 1 | 1 | 0 | 0 | 0 | 0 | 0 | 20 | 8 | 0 | 1 | 1 | 0 | 0 | 0 | 0 | 1 | 1 | 1 | 9 | 19 |
| 24 | 1 | 1 | 0 | 0 | 1 | 1 | 0 | 0 | 0 | 0 | 20 | 20 | 0 | 0 | 1 | 1 | 0 | 0 | 0 | 0 | 1 | 1 | 9 | 9 |
| 25 | 0 | 1 | 1 | 0 | 0 | 1 | 1 | 0 | 0 | 0 | 10 | 20 | 0 | 0 | 0 | 1 | 1 | 0 | 0 | 0 | 0 | 1 | 4 | 9 |
| 26 | 0 | 0 | 1 | 1 | 0 | 0 | 1 | 1 | 0 | 0 | 10 | 10 | 0 | 0 | 0 | 0 | 1 | 1 | 0 | 0 | 0 | 0 | 4 | 4 |
| 27 | 1 | 0 | 0 | 1 | 1 | 0 | 0 | 1 | 1 | 0 | 21 | 10 | 0 | 0 | 0 | 0 | 0 | 1 | 1 | 0 | 0 | 0 | 2 | 4 |
| 28 | 1 | 1 | 0 | 0 | 1 | 1 | 0 | 0 | 1 | 1 | 21 | 21 | 0 | 0 | 0 | 0 | 0 | 0 | 1 | 1 | 0 | 0 | 2 | 2 |
| 29 | 1 | 1 | 1 | 0 | 0 | 1 | 1 | 0 | 0 | 1 | 26 | 21 | 1 | 0 | 0 | 0 | 0 | 0 | 0 | 1 | 1 | 0 | 17 | 2 |
| 30 | 1 | 1 | 1 | 1 | 0 | 0 | 1 | 1 | 0 | 0 | 26 | 26 | 1 | 1 | 0 | 0 | 0 | 0 | 0 | 0 | 1 | 1 | 17 | 17 |
| 31 | 0 | 1 | 1 | 1 | 1 | 0 | 0 | 1 | 1 | 0 | 28 | 26 | 0 | 1 | 1 | 0 | 0 | 0 | 0 | 0 | 0 | 1 | 8 | 17 |
| 32 | 1 | 1 | 1 | 1 | 1 | 1 | 0 | 0 | 1 | 1 | 29 | 28 | 0 | 0 | 1 | 1 | 0 | 0 | 0 | 0 | 0 | 0 | 8 | 8 |
| 33 | 1 | 1 | 1 | 1 | 1 | 1 | 0 | 0 | 0 | 1 | 30 | 29 | 1 | 0 | 0 | 1 | 1 | 0 | 0 | 0 | 0 | 0 | 20 | 8 |
| 34 | 1 | 1 | 1 | 1 | 1 | 1 | 1 | 1 | 0 | 0 | 30 | 30 | 1 | 1 | 0 | 0 | 1 | 1 | 0 | 0 | 0 | 0 | 20 | 20 |
| 35 | 0 | 1 | 1 | 1 | 1 | 1 | 1 | 1 | 1 | 0 | 15 | 30 | 0 | 1 | 1 | 0 | 0 | 1 | 1 | 0 | 0 | 0 | 10 | 20 |
| 36 | 0 | 0 | 1 | 1 | 1 | 1 | 1 | 1 | 1 | 1 | 15 | 15 | 0 | 0 | 1 | 1 | 0 | 0 | 1 | 1 | 0 | 0 | 10 | 10 |
| 37 | 1 | 0 | 0 | 1 | 1 | 1 | 1 | 1 | 1 | 1 | 23 | 15 | 1 | 0 | 0 | 1 | 1 | 0 | 0 | 1 | 1 | 0 | 21 | 10 |
| 38 | 1 | 1 | 0 | 0 | 1 | 1 | 1 | 1 | 1 | 1 | 23 | 23 | 1 | 1 | 0 | 0 | 1 | 1 | 0 | 0 | 1 | 1 | 21 | 21 |
| 39 | 1 | 1 | 1 | 0 | 0 | 1 | 1 | 1 | 1 | 1 | 27 | 23 | 1 | 1 | 1 | 0 | 0 | 1 | 1 | 0 | 0 | 1 | 26 | 21 |
| 40 | 1 | 1 | 1 | 1 | 0 | 0 | 1 | 1 | 1 | 1 | 27 | 27 | 1 | 1 | 1 | 1 | 0 | 0 | 1 | 1 | 0 | 0 | 26 | 26 |
| 41 | 0 | 1 | 1 | 1 | 1 | 0 | 0 | 1 | 1 | 1 | 13 | 27 | 1 | 1 | 1 | 1 | 1 | 0 | 0 | 1 | 1 | 0 | 28 | 26 |
| 42 | 0 | 0 | 1 | 1 | 1 | 1 | 0 | 0 | 1 | 1 | 13 | 13 | 1 | 1 | 1 | 1 | 1 | 1 | 0 | 0 | 1 | 1 | 29 | 28 |
| 43 | 1 | 0 | 0 | 1 | 1 | 1 | 1 | 0 | 0 | 1 | 22 | 13 | 1 | 1 | 1 | 1 | 1 | 1 | 1 | 0 | 0 | 1 | 30 | 29 |
| 44 | 1 | 1 | 0 | 0 | 1 | 1 | 1 | 1 | 0 | 0 | 22 | 22 | 1 | 1 | 1 | 1 | 1 | 1 | 1 | 1 | 0 | 0 | 30 | 30 |
| 45 | 0 | 1 | 1 | 0 | 0 | 1 | 1 | 1 | 1 | 0 | 11 | 22 | 0 | 1 | 1 | 1 | 1 | 1 | 1 | 1 | 1 | 0 | 15 | 30 |
| 46 | 0 | 0 | 1 | 1 | 0 | 0 | 1 | 1 | 1 | 1 | 11 | 11 | 0 | 0 | 1 | 1 | 1 | 1 | 1 | 1 | 1 | 1 | 15 | 15 |
| 47 | 0 | 0 | 0 | 1 | 1 | 0 | 0 | 1 | 1 | 1 | 5 | 11 | 1 | 0 | 0 | 1 | 1 | 1 | 1 | 1 | 1 | 1 | 23 | 15 |
| 48 | 0 | 0 | 0 | 0 | 1 | 1 | 0 | 0 | 1 | 1 | 5 | 5 | 1 | 1 | 0 | 0 | 1 | 1 | 1 | 1 | 1 | 1 | 23 | 23 |
| 49 | 1 | 0 | 0 | 0 | 0 | 1 | 1 | 0 | 0 | 1 | 18 | 5 | 1 | 1 | 1 | 0 | 0 | 1 | 1 | 1 | 1 | 1 | 27 | 23 |
| 50 | 1 | 1 | 0 | 0 | 0 | 0 | 1 | 1 | 0 | 0 | 18 | 18 | 1 | 1 | 1 | 1 | 0 | 0 | 1 | 1 | 1 | 1 | 27 | 27 |
| 51 | 1 | 1 | 1 | 0 | 0 | 0 | 0 | 1 | 1 | 0 | 25 | 18 | 0 | 1 | 1 | 1 | 1 | 0 | 0 | 1 | 1 | 1 | 13 | 27 |
| 52 | 1 | 1 | 1 | 1 | 0 | 0 | 0 | 0 | 1 | 1 | 25 | 25 | 0 | 0 | 1 | 1 | 1 | 1 | 0 | 0 | 1 | 1 | 13 | 13 |
| 53 | 0 | 1 | 1 | 1 | 1 | 0 | 0 | 0 | 0 | 1 | 12 | 25 | 1 | 0 | 0 | 1 | 1 | 1 | 1 | 0 | 0 | 1 | 22 | 13 |
| 54 | 0 | 0 | 1 | 1 | 1 | 1 | 0 | 0 | 0 | 0 | 12 | 12 | 1 | 1 | 0 | 0 | 1 | 1 | 1 | 1 | 0 | 0 | 22 | 22 |
| 55 | 0 | 0 | 0 | 1 | 1 | 1 | 1 | 0 | 0 | 0 | 6 | 12 | 0 | 1 | 1 | 0 | 0 | 1 | 1 | 1 | 1 | 0 | 11 | 22 |
| 56 | 0 | 0 | 0 | 0 | 1 | 1 | 1 | 1 | 0 | 0 | 6 | 6 | 0 | 0 | 1 | 1 | 0 | 0 | 1 | 1 | 1 | 1 | 11 | 11 |
| 57 | 0 | 0 | 0 | 0 | 0 | 1 | 1 | 1 | 1 | 0 | 3 | 6 | 1 | 0 | 0 | 1 | 1 | 0 | 0 | 1 | 1 | 1 | 5 | 11 |
| 58 | 0 | 0 | 0 | 0 | 0 | 0 | 1 | 1 | 1 | 1 | 3 | 3 | 0 | 0 | 0 | 0 | 1 | 1 | 0 | 0 | 1 | 1 | 5 | 5 |
| 59 | 0 | 0 | 0 | 0 | 0 | 0 | 0 | 1 | 1 | 1 | 1 | 3 | 1 | 0 | 0 | 0 | 0 | 1 | 1 | 0 | 0 | 1 | 18 | 5 |
| 60 | 0 | 0 | 0 | 0 | 0 | 0 | 0 | 0 | 1 | 1 | 1 | 1 | 1 | 1 | 0 | 0 | 0 | 0 | 1 | 1 | 0 | 0 | 18 | 18 |
| 61 | 0 | 0 | 0 | 0 | 0 | 0 | 0 | 0 | 0 | 1 | 0 | 1 | 1 | 1 | 1 | 0 | 0 | 0 | 0 | 1 | 1 | 0 | 25 | 18 |
| 62 | 0 | 0 | 0 | 0 | 0 | 0 | 0 | 0 | 0 | 0 | 0 | 0 | 1 | 1 | 1 | 1 | 0 | 0 | 0 | 0 | 1 | 1 | 25 | 25 |
| 63 | 1 | 0 | 0 | 0 | 0 | 0 | 0 | 0 | 0 | 0 | 16 | 0 | 0 | 1 | 1 | 1 | 1 | 0 | 0 | 0 | 0 | 1 | 12 | 25 |
| 64 | 1 | 1 | 0 | 0 | 0 | 0 | 0 | 0 | 0 | 0 | 16 | 16 | 0 | 0 | 1 | 1 | 1 | 1 | 0 | 0 | 0 | 0 | 12 | 12 |
| 65 | 1 | 1 | 1 | 0 | 0 | 0 | 0 | 0 | 0 | 0 | 24 | 16 | 0 | 0 | 0 | 1 | 1 | 1 | 1 | 0 | 0 | 0 | 6 | 12 |
| 66 | 1 | 1 | 1 | 1 | 0 | 0 | 0 | 0 | 0 | 0 | 24 | 24 | 0 | 0 | 0 | 0 | 1 | 1 | 1 | 1 | 0 | 0 | 6 | 6 |
| 67 | 1 | 1 | 1 | 1 | 1 | 0 | 0 | 0 | 0 | 0 | 28 | 24 | 0 | 0 | 0 | 0 | 0 | 1 | 1 | 1 | 1 | 0 | 3 | 6 |
| 68 | 1 | 1 | 1 | 1 | 1 | 1 | 0 | 0 | 0 | 0 | 28 | 28 | 0 | 0 | 0 | 0 | 0 | 0 | 1 | 1 | 1 | 1 | 3 | 3 |
| 69 | 0 | 1 | 1 | 1 | 1 | 1 | 1 | 0 | 0 | 0 | 14 | 28 | 0 | 0 | 0 | 0 | 0 | 0 | 0 | 1 | 1 | 1 | 1 | 3 |
| 70 | 0 | 0 | 1 | 1 | 1 | 1 | 1 | 1 | 0 | 0 | 14 | 14 | 0 | 0 | 0 | 0 | 0 | 0 | 0 | 0 | 1 | 1 | 1 | 1 |
| 71 | 0 | 0 | 0 | 1 | 1 | 1 | 1 | 1 | 1 | 0 | 7 | 14 | 0 | 0 | 0 | 0 | 0 | 0 | 0 | 0 | 0 | 1 | 0 | 1 |
| 72 | 0 | 0 | 0 | 0 | 1 | 1 | 1 | 1 | 1 | 1 | 7 | 7 | 0 | 0 | 0 | 0 | 0 | 0 | 0 | 0 | 0 | 0 | 0 | 0 |
| 73 | 1 | 0 | 0 | 0 | 0 | 1 | 1 | 1 | 1 | 1 | 19 | 7 | 1 | 0 | 0 | 0 | 0 | 0 | 0 | 0 | 0 | 0 | 16 | 0 |
| 74 | 1 | 1 | 0 | 0 | 0 | 0 | 1 | 1 | 1 | 1 | 19 | 19 | 1 | 1 | 0 | 0 | 0 | 0 | 0 | 0 | 0 | 0 | 16 | 16 |
| 75 | 0 | 1 | 1 | 0 | 0 | 0 | 0 | 1 | 1 | 1 | 9 | 19 | 1 | 1 | 1 | 0 | 0 | 0 | 0 | 0 | 0 | 0 | 24 | 16 |

FIG.18

| CYCLE | AP4 | AQ4 | AP3 | AQ3 | AP2 | AQ2 | AP1 | AQ1 | AP0 | AQ0 | AP (Decimal) | AQ (Decimal) | AR4 | AW4 | AR3 | AW3 | AR2 | AW2 | AR1 | AW1 | AR0 | AW0 | AR (Decimal) | AW (Decimal) |
|---|---|---|---|---|---|---|---|---|---|---|---|---|---|---|---|---|---|---|---|---|---|---|---|---|
| 0 | 1 | 0 | 1 | 0 | 1 | 0 | 0 | 0 | 1 | 0 | 29 | 0 | X | X | X | X | X | X | X | X | X | X | X | X |
| 1 | 1 | 1 | 0 | 1 | 0 | 1 | 0 | 0 | 0 | 1 | 16 | 29 | 0 | X | X | X | X | X | X | X | X | X | X | X |
| 2 | 1 | 1 | 1 | 0 | 1 | 0 | 1 | 0 | 0 | 0 | 30 | 16 | 1 | 0 | X | X | X | X | X | X | X | X | X | X |
| 3 | 1 | 1 | 1 | 1 | 0 | 1 | 0 | 1 | 0 | 0 | 24 | 30 | 0 | 1 | 0 | X | X | X | X | X | X | X | X | X |
| 4 | 0 | 1 | 1 | 1 | 1 | 0 | 1 | 0 | 1 | 0 | 15 | 24 | 0 | 0 | 1 | 0 | X | X | X | X | X | X | X | X |
| 5 | 1 | 0 | 1 | 1 | 1 | 1 | 0 | 1 | 0 | 1 | 28 | 15 | 0 | 0 | 0 | 1 | 0 | X | X | X | X | X | X | X |
| 6 | 1 | 1 | 0 | 1 | 1 | 1 | 1 | 0 | 1 | 0 | 23 | 28 | 1 | 0 | 0 | 0 | 1 | 0 | X | X | X | X | X | X |
| 7 | 0 | 1 | 1 | 0 | 1 | 1 | 1 | 1 | 0 | 1 | 14 | 23 | 0 | 1 | 0 | 0 | 0 | 1 | 0 | X | X | X | X | X |
| 8 | 1 | 0 | 1 | 1 | 0 | 1 | 1 | 1 | 1 | 0 | 27 | 14 | 1 | 0 | 1 | 0 | 0 | 0 | 1 | 0 | X | X | X | X |
| 9 | 0 | 1 | 0 | 1 | 1 | 0 | 1 | 1 | 1 | 1 | 7 | 27 | 0 | 1 | 0 | 1 | 0 | 0 | 0 | 1 | 0 | X | 0 | X |
| 10 | 0 | 0 | 1 | 0 | 1 | 1 | 0 | 1 | 0 | 1 | 13 | 7 | 1 | 0 | 1 | 0 | 1 | 0 | 0 | 0 | 1 | 0 | 29 | 0 |
| 11 | 1 | 0 | 0 | 1 | 0 | 1 | 1 | 0 | 1 | 1 | 19 | 13 | 1 | 1 | 0 | 1 | 0 | 1 | 0 | 0 | 0 | 1 | 16 | 29 |
| 12 | 1 | 1 | 0 | 0 | 1 | 0 | 1 | 1 | 0 | 1 | 22 | 19 | 1 | 1 | 1 | 0 | 1 | 0 | 1 | 0 | 0 | 0 | 30 | 16 |
| 13 | 0 | 1 | 1 | 0 | 0 | 1 | 0 | 1 | 1 | 0 | 9 | 22 | 1 | 1 | 1 | 1 | 0 | 1 | 0 | 1 | 0 | 0 | 24 | 30 |
| 14 | 0 | 0 | 1 | 1 | 0 | 0 | 1 | 0 | 1 | 1 | 11 | 9 | 0 | 1 | 1 | 1 | 1 | 0 | 1 | 0 | 1 | 0 | 15 | 24 |
| 15 | 0 | 0 | 0 | 1 | 1 | 0 | 0 | 1 | 0 | 1 | 4 | 11 | 1 | 0 | 1 | 1 | 1 | 1 | 0 | 1 | 0 | 1 | 28 | 15 |
| 16 | 0 | 0 | 0 | 0 | 1 | 1 | 0 | 0 | 1 | 0 | 5 | 4 | 1 | 1 | 0 | 1 | 1 | 1 | 1 | 0 | 1 | 0 | 23 | 28 |
| 17 | 0 | 0 | 0 | 0 | 0 | 1 | 1 | 0 | 0 | 1 | 2 | 5 | 0 | 1 | 1 | 0 | 1 | 1 | 1 | 1 | 0 | 1 | 14 | 23 |
| 18 | 1 | 0 | 0 | 0 | 0 | 0 | 1 | 1 | 0 | 0 | 18 | 2 | 1 | 0 | 1 | 1 | 0 | 1 | 1 | 1 | 1 | 0 | 27 | 14 |
| 19 | 1 | 1 | 0 | 0 | 0 | 0 | 0 | 1 | 1 | 0 | 17 | 18 | 0 | 1 | 0 | 1 | 1 | 0 | 1 | 1 | 1 | 1 | 7 | 27 |
| 20 | 1 | 1 | 1 | 0 | 0 | 0 | 0 | 0 | 1 | 1 | 25 | 17 | 1 | 0 | 1 | 0 | 1 | 1 | 0 | 1 | 1 | 1 | 13 | 7 |
| 21 | 0 | 1 | 1 | 1 | 0 | 0 | 0 | 0 | 0 | 1 | 8 | 25 | 1 | 1 | 0 | 1 | 0 | 1 | 1 | 0 | 1 | 1 | 19 | 13 |
| 22 | 0 | 0 | 1 | 1 | 1 | 0 | 0 | 0 | 0 | 0 | 12 | 8 | 1 | 1 | 1 | 0 | 1 | 0 | 1 | 1 | 0 | 1 | 22 | 19 |
| 23 | 1 | 0 | 0 | 1 | 1 | 1 | 0 | 0 | 0 | 0 | 20 | 12 | 0 | 1 | 1 | 1 | 0 | 1 | 0 | 1 | 1 | 0 | 9 | 22 |
| 24 | 0 | 1 | 0 | 0 | 1 | 1 | 1 | 0 | 0 | 0 | 8 | 20 | 0 | 0 | 1 | 1 | 1 | 0 | 1 | 0 | 1 | 1 | 11 | 9 |
| 25 | 0 | 0 | 1 | 0 | 0 | 1 | 1 | 1 | 0 | 0 | 10 | 8 | 0 | 0 | 0 | 1 | 1 | 1 | 0 | 1 | 0 | 1 | 4 | 11 |
| 26 | 0 | 0 | 0 | 0 | 0 | 0 | 1 | 1 | 1 | 0 | 3 | 10 | 0 | 0 | 0 | 0 | 1 | 1 | 1 | 0 | 1 | 0 | 5 | 4 |
| 27 | 1 | 0 | 0 | 0 | 1 | 0 | 0 | 1 | 1 | 1 | 21 | 3 | 0 | 0 | 0 | 0 | 0 | 1 | 1 | 0 | 0 | 1 | 2 | 5 |
| 28 | 0 | 1 | 0 | 0 | 0 | 1 | 0 | 0 | 1 | 1 | 1 | 21 | 1 | 0 | 0 | 0 | 0 | 0 | 1 | 1 | 0 | 0 | 18 | 2 |
| 29 | 1 | 0 | 1 | 0 | 0 | 0 | 1 | 0 | 0 | 1 | 26 | 1 | 1 | 1 | 0 | 0 | 0 | 0 | 0 | 1 | 1 | 0 | 17 | 18 |
| 30 | 0 | 1 | 0 | 1 | 0 | 0 | 0 | 1 | 0 | 0 | 0 | 26 | 1 | 1 | 1 | 0 | 0 | 0 | 0 | 0 | 1 | 1 | 25 | 17 |
| 31 | 1 | 0 | 1 | 0 | 1 | 0 | 0 | 0 | 1 | 0 | 29 | 0 | 0 | 1 | 1 | 1 | 0 | 0 | 0 | 0 | 0 | 1 | 8 | 25 |
| 32 | 1 | 1 | 0 | 1 | 0 | 1 | 0 | 0 | 0 | 1 | 16 | 29 | 1 | 0 | 1 | 1 | 1 | 0 | 0 | 0 | 0 | 0 | 12 | 8 |
| 33 | 1 | 1 | 1 | 0 | 1 | 0 | 1 | 0 | 0 | 0 | 30 | 16 | 1 | 1 | 0 | 1 | 1 | 1 | 0 | 0 | 0 | 0 | 20 | 12 |
| 34 | 1 | 1 | 1 | 1 | 0 | 1 | 0 | 1 | 0 | 0 | 24 | 30 | 0 | 1 | 1 | 0 | 1 | 1 | 1 | 0 | 0 | 0 | 8 | 20 |
| 35 | 0 | 1 | 1 | 1 | 1 | 0 | 1 | 0 | 1 | 0 | 15 | 24 | 0 | 0 | 1 | 1 | 0 | 1 | 1 | 1 | 0 | 0 | 10 | 8 |
| 36 | 1 | 0 | 1 | 1 | 1 | 1 | 0 | 1 | 0 | 1 | 28 | 15 | 0 | 0 | 0 | 1 | 1 | 0 | 1 | 1 | 1 | 0 | 3 | 10 |
| 37 | 1 | 1 | 0 | 1 | 1 | 1 | 1 | 0 | 1 | 0 | 23 | 28 | 1 | 0 | 0 | 0 | 1 | 1 | 0 | 1 | 1 | 1 | 21 | 3 |
| 38 | 0 | 1 | 1 | 0 | 1 | 1 | 1 | 1 | 0 | 1 | 14 | 23 | 0 | 1 | 0 | 0 | 0 | 1 | 1 | 0 | 1 | 1 | 1 | 21 |
| 39 | 1 | 0 | 1 | 1 | 0 | 1 | 1 | 1 | 1 | 0 | 27 | 14 | 1 | 0 | 1 | 0 | 0 | 0 | 1 | 1 | 0 | 1 | 26 | 1 |
| 40 | 0 | 1 | 0 | 1 | 1 | 0 | 1 | 1 | 1 | 1 | 7 | 27 | 0 | 1 | 0 | 1 | 0 | 0 | 0 | 1 | 0 | 0 | 0 | 26 |
| 41 | 0 | 0 | 1 | 0 | 1 | 1 | 0 | 1 | 1 | 1 | 13 | 7 | 1 | 0 | 1 | 0 | 1 | 0 | 0 | 0 | 1 | 0 | 29 | 0 |
| 42 | 1 | 0 | 0 | 1 | 0 | 1 | 1 | 0 | 1 | 1 | 19 | 13 | 1 | 1 | 0 | 1 | 0 | 1 | 0 | 0 | 0 | 0 | 16 | 29 |
| 43 | 1 | 1 | 0 | 0 | 1 | 0 | 1 | 1 | 0 | 1 | 22 | 19 | 1 | 1 | 1 | 0 | 1 | 0 | 1 | 0 | 0 | 0 | 30 | 16 |
| 44 | 0 | 1 | 1 | 0 | 0 | 1 | 0 | 1 | 1 | 0 | 9 | 22 | 1 | 1 | 1 | 1 | 0 | 1 | 0 | 1 | 0 | 0 | 24 | 30 |
| 45 | 0 | 0 | 1 | 1 | 0 | 0 | 1 | 0 | 1 | 1 | 11 | 9 | 0 | 1 | 1 | 1 | 1 | 0 | 1 | 0 | 1 | 0 | 15 | 24 |
| 46 | 0 | 0 | 0 | 1 | 1 | 0 | 0 | 1 | 0 | 1 | 4 | 11 | 1 | 0 | 1 | 1 | 1 | 1 | 0 | 1 | 0 | 1 | 28 | 15 |
| 47 | 0 | 0 | 0 | 0 | 1 | 1 | 0 | 0 | 1 | 0 | 5 | 4 | 1 | 1 | 0 | 1 | 1 | 1 | 1 | 0 | 1 | 0 | 23 | 28 |
| 48 | 0 | 0 | 0 | 0 | 0 | 1 | 1 | 0 | 0 | 1 | 2 | 5 | 0 | 1 | 1 | 0 | 1 | 1 | 1 | 1 | 0 | 1 | 14 | 23 |
| 49 | 1 | 0 | 0 | 0 | 0 | 0 | 1 | 1 | 0 | 0 | 18 | 2 | 1 | 0 | 1 | 1 | 0 | 1 | 1 | 1 | 1 | 0 | 27 | 14 |
| 50 | 1 | 1 | 0 | 0 | 0 | 0 | 0 | 1 | 1 | 0 | 17 | 18 | 0 | 1 | 0 | 1 | 1 | 0 | 1 | 1 | 1 | 1 | 7 | 27 |
| 51 | 1 | 1 | 1 | 0 | 0 | 0 | 0 | 0 | 1 | 1 | 25 | 17 | 1 | 0 | 1 | 0 | 1 | 1 | 0 | 1 | 1 | 1 | 13 | 7 |
| 52 | 0 | 1 | 1 | 1 | 0 | 0 | 0 | 0 | 0 | 1 | 8 | 25 | 1 | 1 | 0 | 1 | 0 | 1 | 1 | 0 | 1 | 1 | 19 | 13 |
| 53 | 0 | 0 | 1 | 1 | 1 | 0 | 0 | 0 | 0 | 0 | 12 | 8 | 1 | 1 | 1 | 0 | 1 | 0 | 1 | 1 | 0 | 1 | 22 | 19 |
| 54 | 1 | 0 | 0 | 1 | 1 | 1 | 0 | 0 | 0 | 0 | 20 | 12 | 0 | 1 | 1 | 1 | 0 | 1 | 0 | 1 | 1 | 0 | 9 | 22 |
| 55 | 0 | 1 | 0 | 0 | 1 | 1 | 1 | 0 | 0 | 0 | 8 | 20 | 0 | 0 | 1 | 1 | 1 | 0 | 1 | 0 | 1 | 1 | 11 | 9 |
| 56 | 0 | 0 | 1 | 0 | 0 | 1 | 1 | 1 | 0 | 0 | 10 | 8 | 0 | 0 | 0 | 1 | 1 | 1 | 0 | 1 | 0 | 1 | 4 | 11 |
| 57 | 0 | 0 | 0 | 0 | 0 | 0 | 1 | 1 | 1 | 0 | 3 | 10 | 0 | 0 | 0 | 0 | 1 | 1 | 1 | 0 | 1 | 0 | 5 | 4 |
| 58 | 1 | 0 | 0 | 0 | 1 | 0 | 0 | 1 | 1 | 1 | 21 | 3 | 0 | 0 | 0 | 0 | 0 | 1 | 1 | 0 | 0 | 1 | 2 | 5 |
| 59 | 0 | 1 | 0 | 0 | 0 | 1 | 0 | 0 | 1 | 1 | 1 | 21 | 1 | 0 | 0 | 0 | 0 | 0 | 1 | 1 | 0 | 0 | 18 | 2 |
| 60 | 1 | 0 | 1 | 0 | 0 | 0 | 1 | 0 | 0 | 1 | 26 | 1 | 1 | 1 | 0 | 0 | 0 | 0 | 0 | 1 | 1 | 0 | 17 | 18 |
| 61 | 0 | 1 | 0 | 1 | 0 | 0 | 0 | 1 | 0 | 0 | 0 | 26 | 1 | 1 | 1 | 0 | 0 | 0 | 0 | 0 | 1 | 1 | 25 | 17 |
| 62 | 1 | 0 | 1 | 0 | 1 | 0 | 0 | 0 | 1 | 0 | 29 | 0 | 0 | 1 | 1 | 1 | 0 | 0 | 0 | 0 | 0 | 1 | 8 | 25 |
| 63 | 1 | 1 | 0 | 1 | 0 | 1 | 0 | 0 | 0 | 1 | 16 | 29 | 1 | 0 | 1 | 1 | 1 | 0 | 0 | 0 | 0 | 0 | 12 | 8 |
| 64 | 1 | 1 | 1 | 0 | 1 | 0 | 1 | 0 | 0 | 0 | 30 | 16 | 1 | 1 | 0 | 1 | 1 | 1 | 0 | 0 | 0 | 0 | 20 | 12 |
| 65 | 1 | 1 | 1 | 1 | 0 | 1 | 0 | 1 | 0 | 0 | 24 | 30 | 0 | 1 | 1 | 0 | 1 | 1 | 1 | 0 | 0 | 0 | 8 | 20 |
| 66 | 0 | 1 | 1 | 1 | 1 | 0 | 1 | 0 | 1 | 0 | 15 | 24 | 0 | 0 | 1 | 1 | 0 | 1 | 1 | 1 | 0 | 0 | 10 | 8 |
| 67 | 1 | 0 | 1 | 1 | 1 | 1 | 0 | 1 | 0 | 1 | 28 | 15 | 0 | 0 | 0 | 1 | 1 | 0 | 1 | 1 | 1 | 0 | 3 | 10 |
| 68 | 1 | 1 | 0 | 1 | 1 | 1 | 1 | 0 | 1 | 0 | 23 | 28 | 1 | 0 | 0 | 0 | 1 | 1 | 0 | 1 | 1 | 1 | 21 | 3 |
| 69 | 0 | 1 | 1 | 0 | 1 | 1 | 1 | 1 | 0 | 1 | 14 | 23 | 0 | 1 | 0 | 0 | 0 | 1 | 1 | 0 | 1 | 1 | 1 | 21 |
| 70 | 1 | 0 | 1 | 1 | 0 | 1 | 1 | 1 | 1 | 0 | 27 | 14 | 1 | 0 | 1 | 0 | 0 | 0 | 1 | 1 | 0 | 1 | 26 | 1 |
| 71 | 0 | 1 | 0 | 1 | 1 | 0 | 1 | 1 | 1 | 1 | 7 | 27 | 0 | 1 | 0 | 1 | 0 | 0 | 0 | 1 | 0 | 0 | 0 | 26 |
| 72 | 0 | 0 | 1 | 0 | 1 | 1 | 0 | 1 | 1 | 1 | 13 | 7 | 1 | 0 | 1 | 0 | 1 | 0 | 0 | 0 | 1 | 0 | 29 | 0 |
| 73 | 1 | 0 | 0 | 1 | 0 | 1 | 1 | 0 | 1 | 1 | 19 | 13 | 1 | 1 | 0 | 1 | 0 | 1 | 0 | 0 | 0 | 1 | 16 | 29 |
| 74 | 1 | 1 | 0 | 0 | 1 | 0 | 1 | 1 | 0 | 1 | 22 | 19 | 1 | 1 | 1 | 0 | 1 | 0 | 1 | 0 | 0 | 0 | 30 | 16 |
| 75 | 0 | 1 | 1 | 0 | 0 | 1 | 0 | 1 | 1 | 0 | 9 | 22 | 1 | 1 | 1 | 1 | 0 | 1 | 0 | 1 | 0 | 0 | 24 | 30 |

FIG.24 (PRIOR ART)

| CYCLE | A4 | A3 | A2 | A1 | A0 | A (Decimal) | XA (Decimal) | YA (Decimal) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 0 | 0 | 1 | 0 | 0 | 4 | 1 | 0 |
| 4 | 1 | 0 | 0 | 1 | 0 | 18 | 4 | 2 |
| 5 | 0 | 1 | 0 | 0 | 1 | 9 | 2 | 1 |
| 6 | 1 | 0 | 1 | 0 | 0 | 20 | 5 | 0 |
| 7 | 1 | 1 | 0 | 1 | 0 | 26 | 6 | 2 |
| 8 | 0 | 1 | 1 | 0 | 1 | 13 | 3 | 1 |
| 9 | 0 | 0 | 1 | 1 | 0 | 6 | 1 | 2 |
| 10 | 1 | 0 | 0 | 1 | 1 | 19 | 4 | 3 |
| 11 | 1 | 1 | 0 | 0 | 1 | 25 | 6 | 1 |
| 12 | 1 | 1 | 1 | 0 | 0 | 28 | 7 | 0 |
| 13 | 1 | 1 | 1 | 1 | 0 | 30 | 7 | 2 |
| 14 | 1 | 1 | 1 | 1 | 1 | 31 | 7 | 3 |
| 15 | 0 | 1 | 1 | 1 | 1 | 15 | 3 | 3 |
| 16 | 0 | 0 | 1 | 1 | 1 | 7 | 1 | 3 |
| 17 | 0 | 0 | 0 | 1 | 1 | 3 | 0 | 3 |
| 18 | 1 | 0 | 0 | 0 | 1 | 17 | 4 | 1 |
| 19 | 1 | 1 | 0 | 0 | 0 | 24 | 6 | 0 |
| 20 | 0 | 1 | 1 | 0 | 0 | 12 | 3 | 0 |
| 21 | 1 | 0 | 1 | 1 | 0 | 22 | 5 | 2 |
| 22 | 1 | 1 | 0 | 1 | 1 | 27 | 6 | 3 |
| 23 | 1 | 1 | 1 | 0 | 1 | 29 | 7 | 1 |
| 24 | 0 | 1 | 1 | 1 | 0 | 14 | 3 | 2 |
| 25 | 1 | 0 | 1 | 1 | 1 | 23 | 5 | 3 |
| 26 | 0 | 1 | 0 | 1 | 1 | 11 | 2 | 3 |
| 27 | 1 | 0 | 1 | 0 | 1 | 21 | 5 | 1 |
| 28 | 0 | 1 | 0 | 1 | 0 | 10 | 2 | 2 |
| 29 | 0 | 0 | 1 | 0 | 1 | 5 | 1 | 1 |
| 30 | 0 | 0 | 0 | 1 | 0 | 2 | 0 | 2 |
| 31 | 0 | 0 | 0 | 0 | 1 | 1 | 0 | 1 |

FIG.25 (PRIOR ART)

| CYCLE | HOLD | A4 | A3 | A2 | A1 | A0 | A (Decimal) | XA (Decimal) | YA (Decimal) | AR4 | AR3 | AR2 | AR1 | AR0 | AW4 | AW3 | AW2 | AW1 | AW0 | AR (Decimal) | AW (Decimal) |
|---|---|---|---|---|---|---|---|---|---|---|---|---|---|---|---|---|---|---|---|---|---|
| 0 | 1 | 0 | 0 | 0 | 0 | 0 | 0 | 0 | 0 | X | X | X | X | X | X | X | X | X | X | X | X |
| 1 | 0 | 0 | 0 | 0 | 0 | 0 | 0 | 0 | 0 | X | X | X | X | X | X | X | X | X | X | X | X |
| 2 | 1 | 1 | 0 | 0 | 0 | 0 | 16 | 4 | 0 | 0 | X | X | X | X | 0 | X | X | X | X | X | X |
| 3 | 0 | 1 | 0 | 0 | 0 | 0 | 16 | 4 | 0 | 0 | X | X | X | X | 0 | X | X | X | X | X | X |
| 4 | 1 | 0 | 1 | 0 | 0 | 0 | 8 | 2 | 0 | 0 | 0 | X | X | X | 0 | 0 | X | X | X | X | X |
| 5 | 0 | 0 | 1 | 0 | 0 | 0 | 8 | 2 | 0 | 0 | 0 | X | X | X | 0 | 0 | X | X | X | X | X |
| 6 | 1 | 0 | 0 | 1 | 0 | 0 | 4 | 1 | 0 | 0 | 0 | 0 | X | X | 0 | 0 | 0 | X | X | X | X |
| 7 | 0 | 0 | 0 | 1 | 0 | 0 | 4 | 1 | 0 | 0 | 0 | 0 | X | X | 0 | 0 | 0 | X | X | X | X |
| 8 | 1 | 1 | 0 | 0 | 1 | 0 | 18 | 4 | 2 | 0 | 0 | 0 | 0 | X | 0 | 0 | 0 | 0 | X | X | X |
| 9 | 0 | 1 | 0 | 0 | 1 | 0 | 18 | 4 | 2 | 0 | 0 | 0 | 0 | X | 0 | 0 | 0 | 0 | X | X | X |
| 10 | 1 | 0 | 1 | 0 | 0 | 1 | 9 | 2 | 1 | 0 | 0 | 0 | 0 | 0 | 0 | 0 | 0 | 0 | 0 | 0 | 0 |
| 11 | 0 | 0 | 1 | 0 | 0 | 1 | 9 | 2 | 1 | 0 | 0 | 0 | 0 | 0 | 0 | 0 | 0 | 0 | 0 | 0 | 0 |
| 12 | 1 | 1 | 0 | 1 | 0 | 0 | 20 | 5 | 0 | 1 | 0 | 0 | 0 | 0 | 1 | 0 | 0 | 0 | 0 | 16 | 16 |
| 13 | 0 | 1 | 0 | 1 | 0 | 0 | 20 | 5 | 0 | 1 | 0 | 0 | 0 | 0 | 1 | 0 | 0 | 0 | 0 | 16 | 16 |
| 14 | 1 | 1 | 1 | 0 | 1 | 0 | 26 | 6 | 2 | 0 | 1 | 0 | 0 | 0 | 0 | 1 | 0 | 0 | 0 | 8 | 8 |
| 15 | 0 | 1 | 1 | 0 | 1 | 0 | 26 | 6 | 2 | 0 | 1 | 0 | 0 | 0 | 0 | 1 | 0 | 0 | 0 | 8 | 8 |
| 16 | 1 | 0 | 1 | 1 | 0 | 1 | 13 | 3 | 1 | 0 | 0 | 1 | 0 | 0 | 0 | 0 | 1 | 0 | 0 | 4 | 4 |
| 17 | 0 | 0 | 1 | 1 | 0 | 1 | 13 | 3 | 1 | 0 | 0 | 1 | 0 | 0 | 0 | 0 | 1 | 0 | 0 | 4 | 4 |
| 18 | 1 | 0 | 0 | 1 | 1 | 0 | 6 | 1 | 2 | 1 | 0 | 0 | 1 | 0 | 1 | 0 | 0 | 1 | 0 | 18 | 18 |
| 19 | 0 | 0 | 0 | 1 | 1 | 0 | 6 | 1 | 2 | 1 | 0 | 0 | 1 | 0 | 1 | 0 | 0 | 1 | 0 | 18 | 18 |
| 20 | 1 | 1 | 0 | 0 | 1 | 1 | 19 | 4 | 3 | 0 | 1 | 0 | 0 | 1 | 0 | 1 | 0 | 0 | 1 | 9 | 9 |
| 21 | 0 | 1 | 0 | 0 | 1 | 1 | 19 | 4 | 3 | 0 | 1 | 0 | 0 | 1 | 0 | 1 | 0 | 0 | 1 | 9 | 9 |
| 22 | 1 | 1 | 1 | 0 | 0 | 1 | 25 | 6 | 1 | 1 | 0 | 1 | 0 | 0 | 1 | 0 | 1 | 0 | 0 | 20 | 20 |
| 23 | 0 | 1 | 1 | 0 | 0 | 1 | 25 | 6 | 1 | 1 | 0 | 1 | 0 | 0 | 1 | 0 | 1 | 0 | 0 | 20 | 20 |
| 24 | 1 | 1 | 1 | 1 | 0 | 0 | 28 | 7 | 0 | 1 | 1 | 0 | 1 | 0 | 1 | 1 | 0 | 1 | 0 | 26 | 26 |
| 25 | 0 | 1 | 1 | 1 | 0 | 0 | 28 | 7 | 0 | 1 | 1 | 0 | 1 | 0 | 1 | 1 | 0 | 1 | 0 | 26 | 26 |
| 26 | 1 | 1 | 1 | 1 | 1 | 0 | 30 | 7 | 2 | 0 | 1 | 1 | 0 | 1 | 0 | 1 | 1 | 0 | 1 | 13 | 13 |
| 27 | 0 | 1 | 1 | 1 | 1 | 0 | 30 | 7 | 2 | 0 | 1 | 1 | 0 | 1 | 0 | 1 | 1 | 0 | 1 | 13 | 13 |
| 28 | 1 | 1 | 1 | 1 | 1 | 1 | 31 | 7 | 3 | 0 | 0 | 1 | 1 | 0 | 0 | 0 | 1 | 1 | 0 | 6 | 6 |
| 29 | 0 | 1 | 1 | 1 | 1 | 1 | 31 | 7 | 3 | 0 | 0 | 1 | 1 | 0 | 0 | 0 | 1 | 1 | 0 | 6 | 6 |
| 30 | 1 | 0 | 1 | 1 | 1 | 1 | 15 | 3 | 3 | 1 | 0 | 0 | 1 | 1 | 1 | 0 | 0 | 1 | 1 | 19 | 19 |
| 31 | 0 | 0 | 1 | 1 | 1 | 1 | 15 | 3 | 3 | 1 | 0 | 0 | 1 | 1 | 1 | 0 | 0 | 1 | 1 | 19 | 19 |
| 32 | 1 | 0 | 0 | 1 | 1 | 1 | 7 | 1 | 3 | 1 | 1 | 0 | 0 | 1 | 1 | 1 | 0 | 0 | 1 | 25 | 25 |
| 33 | 0 | 0 | 0 | 1 | 1 | 1 | 7 | 1 | 3 | 1 | 1 | 0 | 0 | 1 | 1 | 1 | 0 | 0 | 1 | 25 | 25 |
| 34 | 1 | 0 | 0 | 0 | 1 | 1 | 3 | 0 | 3 | 1 | 1 | 1 | 0 | 0 | 1 | 1 | 1 | 0 | 0 | 28 | 28 |
| 35 | 0 | 0 | 0 | 0 | 1 | 1 | 3 | 0 | 3 | 1 | 1 | 1 | 0 | 0 | 1 | 1 | 1 | 0 | 0 | 28 | 28 |
| 36 | 1 | 1 | 0 | 0 | 0 | 1 | 17 | 4 | 1 | 1 | 1 | 1 | 1 | 0 | 1 | 1 | 1 | 1 | 0 | 30 | 30 |
| 37 | 0 | 1 | 0 | 0 | 0 | 1 | 17 | 4 | 1 | 1 | 1 | 1 | 1 | 0 | 1 | 1 | 1 | 1 | 0 | 30 | 30 |
| 38 | 1 | 1 | 1 | 0 | 0 | 0 | 24 | 6 | 0 | 1 | 1 | 1 | 1 | 1 | 1 | 1 | 1 | 1 | 1 | 31 | 31 |
| 39 | 0 | 1 | 1 | 0 | 0 | 0 | 24 | 6 | 0 | 1 | 1 | 1 | 1 | 1 | 1 | 1 | 1 | 1 | 1 | 31 | 31 |
| 40 | 1 | 0 | 1 | 1 | 0 | 0 | 12 | 3 | 0 | 0 | 1 | 1 | 1 | 1 | 0 | 1 | 1 | 1 | 1 | 15 | 15 |
| 41 | 0 | 0 | 1 | 1 | 0 | 0 | 12 | 3 | 0 | 0 | 1 | 1 | 1 | 1 | 0 | 1 | 1 | 1 | 1 | 15 | 15 |
| 42 | 1 | 1 | 0 | 1 | 1 | 0 | 22 | 5 | 2 | 0 | 0 | 1 | 1 | 1 | 0 | 0 | 1 | 1 | 1 | 7 | 7 |
| 43 | 0 | 1 | 0 | 1 | 1 | 0 | 22 | 5 | 2 | 0 | 0 | 1 | 1 | 1 | 0 | 0 | 1 | 1 | 1 | 7 | 7 |
| 44 | 1 | 1 | 1 | 0 | 1 | 1 | 27 | 6 | 3 | 0 | 0 | 0 | 1 | 1 | 0 | 0 | 0 | 1 | 1 | 3 | 3 |
| 45 | 0 | 1 | 1 | 0 | 1 | 1 | 27 | 6 | 3 | 0 | 0 | 0 | 1 | 1 | 0 | 0 | 0 | 1 | 1 | 3 | 3 |
| 46 | 1 | 1 | 1 | 1 | 0 | 1 | 29 | 7 | 1 | 1 | 0 | 0 | 0 | 1 | 1 | 0 | 0 | 0 | 1 | 17 | 17 |
| 47 | 0 | 1 | 1 | 1 | 0 | 1 | 29 | 7 | 1 | 1 | 0 | 0 | 0 | 1 | 1 | 0 | 0 | 0 | 1 | 17 | 17 |
| 48 | 1 | 0 | 1 | 1 | 1 | 0 | 14 | 3 | 2 | 1 | 1 | 0 | 0 | 0 | 1 | 1 | 0 | 0 | 0 | 24 | 24 |
| 49 | 0 | 0 | 1 | 1 | 1 | 0 | 14 | 3 | 2 | 1 | 1 | 0 | 0 | 0 | 1 | 1 | 0 | 0 | 0 | 24 | 24 |
| 50 | 1 | 1 | 0 | 1 | 1 | 1 | 23 | 5 | 3 | 0 | 1 | 1 | 0 | 0 | 0 | 1 | 1 | 0 | 0 | 12 | 12 |
| 51 | 0 | 1 | 0 | 1 | 1 | 1 | 23 | 5 | 3 | 0 | 1 | 1 | 0 | 0 | 0 | 1 | 1 | 0 | 0 | 12 | 12 |
| 52 | 1 | 0 | 1 | 0 | 1 | 1 | 11 | 2 | 3 | 1 | 0 | 1 | 1 | 0 | 1 | 0 | 1 | 1 | 0 | 22 | 22 |
| 53 | 0 | 0 | 1 | 0 | 1 | 1 | 11 | 2 | 3 | 1 | 0 | 1 | 1 | 0 | 1 | 0 | 1 | 1 | 0 | 22 | 22 |
| 54 | 1 | 1 | 0 | 1 | 0 | 1 | 21 | 5 | 1 | 1 | 1 | 0 | 1 | 1 | 1 | 1 | 0 | 1 | 1 | 27 | 27 |
| 55 | 0 | 1 | 0 | 1 | 0 | 1 | 21 | 5 | 1 | 1 | 1 | 0 | 1 | 1 | 1 | 1 | 0 | 1 | 1 | 27 | 27 |
| 56 | 1 | 0 | 1 | 0 | 1 | 0 | 10 | 2 | 2 | 1 | 1 | 1 | 0 | 1 | 1 | 1 | 1 | 0 | 1 | 29 | 29 |
| 57 | 0 | 0 | 1 | 0 | 1 | 0 | 10 | 2 | 2 | 1 | 1 | 1 | 0 | 1 | 1 | 1 | 1 | 0 | 1 | 29 | 29 |
| 58 | 1 | 0 | 0 | 1 | 0 | 1 | 5 | 1 | 1 | 0 | 1 | 1 | 1 | 0 | 0 | 1 | 1 | 1 | 0 | 14 | 14 |
| 59 | 0 | 0 | 0 | 1 | 0 | 1 | 5 | 1 | 1 | 0 | 1 | 1 | 1 | 0 | 0 | 1 | 1 | 1 | 0 | 14 | 14 |
| 60 | 1 | 0 | 0 | 0 | 1 | 0 | 2 | 0 | 2 | 1 | 0 | 1 | 1 | 1 | 1 | 0 | 1 | 1 | 1 | 23 | 23 |
| 61 | 0 | 0 | 0 | 0 | 1 | 0 | 2 | 0 | 2 | 1 | 0 | 1 | 1 | 1 | 1 | 0 | 1 | 1 | 1 | 23 | 23 |
| 62 | 1 | 0 | 0 | 0 | 0 | 1 | 1 | 0 | 1 | 1 | 0 | 1 | 0 | 1 | 1 | 0 | 1 | 0 | 1 | 11 | 11 |
| 63 | 0 | 0 | 0 | 0 | 0 | 1 | 1 | 0 | 1 | 1 | 0 | 1 | 0 | 1 | 1 | 0 | 1 | 0 | 1 | 11 | 11 |
| 64 | 1 | 0 | 0 | 0 | 0 | 0 | 0 | 0 | 0 | 1 | 1 | 0 | 1 | 0 | 1 | 1 | 0 | 1 | 0 | 21 | 21 |
| 65 | 0 | 0 | 0 | 0 | 0 | 0 | 0 | 0 | 0 | 1 | 1 | 0 | 1 | 0 | 1 | 1 | 0 | 1 | 0 | 21 | 21 |
| 66 | 1 | 1 | 0 | 0 | 0 | 0 | 16 | 4 | 0 | 0 | 1 | 0 | 1 | 0 | 0 | 1 | 0 | 1 | 0 | 10 | 10 |
| 67 | 0 | 1 | 0 | 0 | 0 | 0 | 16 | 4 | 0 | 0 | 1 | 0 | 1 | 0 | 0 | 1 | 0 | 1 | 0 | 10 | 10 |
| 68 | 1 | 0 | 1 | 0 | 0 | 0 | 8 | 2 | 0 | 0 | 0 | 1 | 0 | 1 | 0 | 0 | 1 | 0 | 1 | 5 | 5 |
| 69 | 0 | 0 | 1 | 0 | 0 | 0 | 8 | 2 | 0 | 0 | 0 | 1 | 0 | 1 | 0 | 0 | 1 | 0 | 1 | 5 | 5 |
| 70 | 1 | 0 | 0 | 1 | 0 | 0 | 4 | 1 | 0 | 0 | 0 | 0 | 1 | 0 | 0 | 0 | 0 | 1 | 0 | 2 | 2 |
| 71 | 0 | 0 | 0 | 1 | 0 | 0 | 4 | 1 | 0 | 0 | 0 | 0 | 1 | 0 | 0 | 0 | 0 | 1 | 0 | 2 | 2 |
| 72 | 1 | 1 | 0 | 0 | 1 | 0 | 18 | 4 | 2 | 0 | 0 | 0 | 0 | 1 | 0 | 0 | 0 | 0 | 1 | 1 | 1 |
| 73 | 0 | 1 | 0 | 0 | 1 | 0 | 18 | 4 | 2 | 0 | 0 | 0 | 0 | 1 | 0 | 0 | 0 | 0 | 1 | 1 | 1 |
| 74 | 1 | 0 | 1 | 0 | 0 | 1 | 9 | 2 | 1 | 0 | 0 | 0 | 0 | 0 | 0 | 0 | 0 | 0 | 0 | 0 | 0 |
| 75 | 0 | 0 | 1 | 0 | 0 | 1 | 9 | 2 | 1 | 0 | 0 | 0 | 0 | 0 | 0 | 0 | 0 | 0 | 0 | 0 | 0 |

SEMICONDUCTOR INTEGRATED CIRCUIT DEVICE HAVING A TEST CIRCUIT OF A RANDOM ACCESS MEMORY

BACKGROUND OF THE INVENTION

1. Field of the Invention

The present invention relates generally to a semiconductor integrated circuit having both a random access memory (hereinafter, called RAM) and a RAM test circuit in which test addresses are generated in the test circuit according to pseudo-random numbers to test memory cells of the RAM.

2. Description of Related Art

FIG. 22 is a circuit view of a conventional semiconductor integrated circuit device. In FIG. 22, 150 indicates a two-port RAM having both a read port and a write port. 200 indicates a RAM test circuit, formed of a built-in self test (BIST) circuit, for testing the two-port RAM 150. A portion of the BIST circuit relating to an address signal is shown in FIG. 22.

In the RAM test circuit 200, 100 indicates an address hold control unit for outputting a hold signal Hld. Values "1" and "0" of the hold signal Hld are alternately set on a clock cycle.

110 indicates a test address generating unit for producing five parallel output signals A4, A3, A2, A1 and A0 respectively set to a binary value "0" or "1" every two clock cycles in synchronization with the hold signal Hld of the address hold control unit 100 and outputting the parallel output signal A0 as one bit of a serial output signal SO every clock cycle. The test address generating unit 110 is formed of a linear feedback shift register (LFSR) type pseudo-random number generating circuit to generate $2^5$ (=32) pseudo-random numbers ranging from "0" to "31" in a pseudo-random number generating cycle equal to $2^6$ (=64) clock cycles by generating one pseudo-random number every two clock cycles. The five parallel output signals A4, A3, A2, A1 and A0 are output from a plurality of parallel output terminals of the test address generating unit 110. The string of the five parallel output signals A4, A3, A2, A1 and A0 produced every two clock cycles indicates one pseudo-random number. The binary value of the parallel output signal A4 denotes a most significant digit of the string, and the binary value of the parallel output signal A0 denotes a least significant digit of the string.

120 indicates a read address shift register for producing a read address classified into an X directional read address and a Y directional read address according to a serial input read address signal SIAR denoting the serial output signal SO of the test address generating unit 110 in synchronization with a read address hold signal HldAr denoting the hold signal Hld of the address hold control unit 100. The read address is renewed every two clock cycles. The X directional read address is formed of three parallel read address signals AR4, AR3 and AR2 respectively set to a binary value "0" or "1" and is output from three parallel output terminals of the read address shift register 120. The Y directional read address is formed of two parallel read address signals AR1 and AR0 respectively set to a binary value "0" or "1" and is output from other two parallel output terminals of the read address shift register 120.

130 indicates a write address shift register for producing a write address classified into an X directional write address and a Y directional write address according to a serial input write address signal SIAW denoting the serial output signal SO of the test address generating unit 110 in synchronization with a write address hold signal HldAw denoting the hold signal Hld of the address hold control unit 100. The write address is renewed every two clock cycles. The X directional write address is formed of three parallel read address signals AW4, AW3 and AW2 respectively set to a binary value "0" or "1" and is output from three parallel output terminals of the write address shift register 130. The Y directional write address is formed of two parallel write address signals AW1 and AW0 respectively set to a binary value "0" or "1" and is output from other two parallel output terminals of the write address shift register 130.

In the address hold control unit 100, 101 indicates a flip-flop circuit, and 102 indicates an NOT circuit arranged in parallel to the flip-flop circuit 101. The hold signal Hld is output from a connection point of the output terminal of the flip-flop circuit 101 and the input terminal of the NOT circuit 102.

In the test address generating unit 110, 114 indicates each of a plurality of flip-flop circuits serially arranged in five stages. 111 indicates an EXOR circuit for producing an EXOR signal according to an EXOR logic for two binary values of the parallel output signals A2 and A0 output from the flip-flop circuits 114 of the third and fifth stages. 113 indicates an NOR circuit for producing an NOR signal according to an NOR logic for four binary values of the parallel output signals A4 to A1 output from the flip-flop circuits 114 of the first, second, third and fourth stages. 112 indicates another EXOR circuit for producing an EXOR signal according to an EXOR logic for two binary values output from the EXOR circuit 111 and the NOR circuit 113 and outputting a binary value to the flip-flop circuit 114 of the first stage. The hold signal Hld is input to a hold terminal H of each flip-flop circuit 114, so that the shift operation is performed in each flip-flop circuit 114 every two clock cycles. Because the binary value output from the EXOR circuit 112 is shifted in each of the flip-flop circuit 114 and is set as each of the parallel output signals A4, A3, A2, A1 and A0 in that order every two clock cycles, five bits of the serial output signal SO are set in a current shift operation and four preceding shift operations, and the string of five bits of the serial output signal SO expresses one pseudo-random number indicated by the string of the parallel output signals A4 to A0 which is set at a time corresponding to the earliest preceding shift operation among the four preceding shift operations. Therefore, the read address shift register 120 substantially receives one pseudo-random number every two clock cycles, and the write address shift register 130 substantially receives one pseudo-random number every two clock cycles.

The serial output signal SO is output from a serial output terminal of the test address generating unit 110. Also, the parallel output signals A4 to A0 are respectively output from the flip-flop circuits 114 every two clock cycles.

In the read address shift register 120, 121 indicates each of a plurality of flip-flop circuits serially arranged in five stages. The serial input read address signal SIAR denoting the serial output signal SO is input to an address terminal D of the flip-flop circuit 121 of the first stage, and the read address hold signal HldAr is input to a hold terminal H of each flip-flop circuit 121. The shift operation is performed in each flip-flop circuits 121 every two clock cycles. Therefore, the serial input read address signal SIAR is shifted in each flip-flop circuit 121 every two clock cycles and is set as each of the parallel read address signals AR4, AR3, AR2, AR1 and AR0 in that order every two clock cycles. The parallel read address signals AR4 to AR0 are respectively output from the flip-flop circuits 121 of the first to fifth stages every two clock cycles.

In the write address shift register 130, 131 indicates each of a plurality of flip-flop circuits serially arranged in five stages. The serial input write address signal SIAW denoting the serial output signal SO is input to an address terminal D of the flip-flop circuit 131 of the first stage, and the write address hold signal HldAw is input to a hold terminal H of each flip-flop circuit 131. The shift operation is performed in each flip-flop circuit 131 every two clock cycles. Therefore, the serial input write address signal SIAW is shifted in each flip-flop circuit 131 every two clock cycles and is set as each of the parallel write address signals AW4, AW3, AW2, AW1 and AW0 in that order every two clock cycles. The parallel write address signals AW4 to AW0 are respectively output from the flip-flop circuits 131 of the first to fifth stages every two clock cycles.

In the two-port RAM 150, 151a indicates an X read decoder having input terminals XA2, XA1 and XA0. 151b indicates an X write decoder having input terminals XA2, XA1 and XA0. 152a indicates a Y read decoder having input terminals YA1 and YA0. 152b indicates a Y write decoder having input terminals YA1 and YA0. 153 indicates a memory cell array having thirty-two memory cells to which thirty-two address numbers from "0" to "31" are allocated respectively. The thirty-two memory cells correspond to thirty-two words. The memory cell array has a width of four memory cells in the Y direction and has a width of eight memory cells in the X direction. The read port of the two-port RAM 150 is formed of the X read decoder 151a and the Y read decoder 152a, and the parallel read address signals AR4 to AR0 of the read address shift register 120 are input to the input terminals XA2, XA1, XA0, YA1 and YA0 of the read port (composed of the decoders 151a and 152a) respectively every two clock cycles. The write port of the two-port RAM 150 is formed of the X write decoder 151b and the Y write decoder 152b, and the parallel write address signals AW4 to AW0 of the write address shift register 130 are input to the input terminals XA2, XA1, XA0, YA1 and YA0 of the write port (composed of the decoders 151b and 152b) respectively every two clock cycles. When a write enable signal WE is set to a high level, a write operation is performed in the two-port RAM 150 by specifying one memory cell according to the parallel write address signals AW4 to AW0 input to the write port. In the other case, a read operation is performed in the two-port RAM 150 by specifying one memory cell according to the parallel read address signals AR4 to AR0 input to the read port.

The simultaneous access to two memory cells of the two-port RAM 150 is possible. For example, a read operation for the memory cell of the address "16", and a write operation for the memory cell of the address "0" can be simultaneously performed.

FIG. 23A is a circuit view of a shift register applied to both the read address shift register 120 and the write address shift register 130, and FIG. 23B is a circuit view of another shift register applied to both the read address shift register 120 and the write address shift register 130.

In each of the shift registers shown in FIG. 23A and FIG. 23B, an operation mode for a scan pass circuit is set to a serial shift operation mode (shift mode SM=1). Therefore, the serial input read address signal SIAR input to the read address shift register 120 is always output from the flip-flop circuit 121 of the first stage after two clock cycles, and a signal output from each flip-flop circuit 121 is always output from another flip-flop circuit 121 of a next stage after two clock cycles. Also, the serial input write address signal SIAW input to the write address shift register 130 is always output from the flip-flop circuit 131 of the first stage after two clock cycles, and a signal output from each flip-flop circuit 131 is always output from another flip-flop circuit 131 of a next stage after two clock cycles.

Any of the shift registers shown in FIG. 23A and FIG. 23B can be used for each of the address shift registers 120 and 130. Here, in a case where each of the shift registers shown in FIG. 23A and FIG. 23B is used to perform a desired normal operation, the operation mode for the scan pass circuit is set to a parallel shift operation mode (shift mode SM=0) to send address signals Sa output from other logical circuits (not shown) of a semiconductor integrated circuit to the input terminals XA0, XA1 XA2, YA0 and YA1 of the two-port RAM 150 through the address shift registers 120 and 130.

Next, an operation of the conventional semiconductor integrated circuit device shown in FIG. 22 will be described below.

FIG. 24 shows binary values of the parallel output signals A4, A3, A2, A1 and A0 output from the test address generating unit 110 in a tabular form in a case of a non-holding state.

In FIG. 24, to merely describe the generation of pseudo-random numbers (or test addresses) performed in the test address generating unit 110, it is assumed that the shift operation is performed in each flip-flop circuit 114 every clock cycle by setting the hold signal Hld indicating a non-holding state. CYCLE denotes a clock cycle. A decimal value A is expressed by a string of binary values of the parallel output signals A4, A3, A2, A1 and A0, and the decimal value A indicates one pseudo-random number. An X directional address XA is expressed by a string of binary values of the parallel output signals A4, A3 and A2, and a Y directional address YA is expressed by a string of binary values of the parallel output signals A1 and A0. It is assumed that the shift operation of each flip-flop circuit 114 is performed every pulse of a clock signal.

In CYCLE=0, A4=A3=A2=A1=A0=0 is preset, the EXOR circuit 111 receiving binary values "0" of the signals A2 and A0 outputs a binary value "0", the NOR circuit 113 receiving binary values "0" of the signals A4 to A0 outputs a binary value "1", and the EXOR circuit 112 receiving the binary value "0" of the EXOR circuit 111 and the binary value "1" of the NOR circuit 113 outputs a binary value "1". Therefore, in CYCLE=1, A4=1 and A3=A2=A1= A0=0 are set, the EXOR circuit 111 outputs a binary value "0", the NOR circuit 113 receiving the binary value "1" of the signal A4 and binary values "0" of the signals A3 to A0 outputs a binary value "0", and the EXOR circuit 112 receiving the binary value "0" of the EXOR circuit 111 and the binary value "0" of the NOR circuit 113 outputs a binary value "0". Therefore, in CYCLE=2, A4=0, A3=1 and A2= A1=A0=0 are set, the EXOR circuit 111 outputs a binary value "0", the NOR circuit 113 outputs a binary value "0", and the EXOR circuit 112 outputs a binary value "0". Therefore, in CYCLE=3, A4=0, A3=0, A2=1 and A1= A0=0 are set, the EXOR circuit 111 receiving a binary value "1" of the signal A2 and a binary value "0" of the signal A0 outputs a binary value "1", the NOR circuit 113 outputs a binary value "0", and the EXOR circuit 112 receiving the binary value "1" of the EXOR circuit 111 and the binary value "0" of the NOR circuit 113 outputs a binary value "1". Therefore, in CYCLE=4, A4=1, A3=0, A2= 0 and A1=1 and A0=0 are set, the EXOR circuit 111 outputs a binary value "0", the NOR circuit 113 outputs a binary value "0", and the EXOR circuit 112 outputs a binary value "0". Therefore, in CYCLE=5, A4=0, A3=1, A2=0 and A1=0 and A0=1 are set. Thereafter, the shift operation of the flip-flop circuits 114 is performed every clock cycle.

In this test address generation, the decimal value A can be randomly set to each of the values from "0" to "31" in the thirty-two clock cycles. The values from "0" to "31" correspond to the address numbers of the thirty-two memory cells of the two-port RAM 150. Therefore, when the values from "0" to "31" are transmitted one by one to the two-port RAM 150, all the memory cells of the two-port RAM 150 can be tested.

FIG. 25 shows an operation result obtained in the RAM test circuit 200 in a tabular form. Because the values "1" and "0" of the hold signal Hld are alternately set, the shift operation of the test address generating unit 110 and the shift registers 120 and 130 are performed every two clock cycles. Therefore, the binary values A4 to A0 shown in FIG. 24 for one clock cycle correspond to those shown in FIG. 25 for two clock cycles. Also, in FIG. 25, a decimal value AR is expressed by a string of binary values of the parallel read address signals AR4 to AR0, and a decimal value AW is expressed by a string of binary values of the parallel write address signals AW4 to AW0.

In CYCLE=0, A4=A3=A2=A1=A0=0, AR4=AR3= AR2=AR1=AR0=X (undefined binary value) and AW4=AW3= AW2=AW1=AW0=X are preset, the serial input signals SIAR and SIAW set to "0" together are output to the address shift registers 120 and 130, and the EXOR circuit 112 outputs a binary value "1". In CYCLE=1, the binary values A4 to A1 are held in the flip-flop circuits 114 of the second to fifth stages respectively, the binary value "1" output from the EXOR circuit 112 is held in the flip-flop circuit 114 of the first stage, and the serial input signals SIAR and SIAW are held in the flip-flop circuits 121 and 131 of the first stage respectively. In CYCLE=2, the binary values held in the flip-flop circuit 114, 121 and 131 are output, so that A4=1, A3=A2=A1=A0=0, AR4=AW4= 0, AR3=AR2=AR1=AR0=X and AW3=AW2=AW1=AW0= X are set. Also, the EXOR circuit 112 outputs a binary value "0". In CYCLE=3, the binary values input to the flip-flop circuits 114, 121 and 131 are held. In CYCLE=4, the binary values held in the flip-flop circuit 114, 121 and 131 are output, so that A4=0, A3=1, A2=A1= A0=0, AR4=AR3=AW4=AW3=0, AR2=AR1=AR0=X and AW2=AW1=AW0=X are set. Thereafter, the shift operation of the flip-flop circuits 114 is performed every two cycles to generate the test address in the test address generating unit 110, and the shift operation of the flip-flop circuits 121 and 131 is performed every two cycles to shift the test address in the address shift registers 120 and 130. As a result, a shift operation result shown in FIG. 25 is obtained.

As shown in FIG. 25, the read address AR is equal to the write address AW, and the read address AR is set to the same value during two clock cycles. Also, the group of binary values of the parallel read address signals AR4 to AR0 and the group of binary values of the parallel write address signals AW4 to AW0 set in a current clock cycle are respectively equal to that of the parallel output signals A4 to A0 set in a preceding clock cycle earlier than the current clock cycle by ten clock cycles. Therefore, a read operation test for the read address AR=0 is performed in CYCLE=10, and a write operation test for the write address AW=0 is performed in CYCLE=11. Also, a read operation test for the read address AR=16 is performed in CYCLE=12, and a write operation test for the write address AW=16 is performed in CYCLE=13. In the same manner, the read operation test and the write operation test are alternately performed in clock cycles from CYCLE=14 to CYCLE=73. In this case, both the read operation test and the write operation test are performed for all the memory cells of the two-port RAM 150 set to addresses "0" to "31" in the sixty-four clock cycles in the random address order. This operation test can be applied to a part of a march test performed according to a typical test algorithm of RAM.

However, because the conventional semiconductor integrated circuit device has the above-described configuration, to test the two-port RAM 150, both the read address shift register 120 and the write address shift register 130 are necessarily required. Therefore, a problem has arisen that the configuration of the RAM test circuit 200 is complicated so as to increase a size of the RAM test circuit 200 and to increase a manufacturing cost of a semiconductor integrated circuit device.

SUMMARY OF THE INVENTION

An object of the present invention is to provide, with due consideration to the drawbacks of the conventional semiconductor integrated circuit device, a semiconductor integrated circuit device which is manufactured at a low cost by using a small-sized RAM test circuit.

The object is achieved by the provision of a semiconductor integrated circuit device including a random access memory having a plurality of memory cells and a serial shift register having a plurality of flip-flops serially arranged. In the serial shift register, a parallel signal is output from each flip-flop, a first address is produced from a first string of the parallel signals output from the flip-flops of a first group, a second address is produced from a second string of the parallel signals output from the flip-flops of a second group, the first string of the parallel signals expressing the first address is transmitted to the random access memory so as to specify the memory cell of the first address, and the second string of the parallel signals expressing the second address is transmitted to the random access memory so as to specify the memory cell of the second address.

Therefore, even though the serial shift register denoting a RAM test circuit has no hold function, the read test and the write test for all memory cells of the RAM can be performed while using a small-sized serial shift register, and a small-sized semiconductor integrated circuit device can be manufactured at a low cost.

BRIEF DESCRIPTION OF THE DRAWINGS

FIG. 3 shows an operation result obtained in a RAM test circuit shown in FIG. 1;

FIG. 5 shows an operation result obtained in a RAM test circuit shown in FIG. 4;

FIG. 7 shows an operation result obtained in a RAM test circuit shown in FIG. 5;

FIG. 8 shows another operation result obtained in a RAM test circuit shown in FIG. 5;

FIG. 13 shows an operation result obtained in a RAM test circuit shown in FIG. 12;

FIG. 15 shows an operation result obtained in a RAM test circuit shown in FIG. 14;

FIG. 17 shows an operation result obtained in a RAM test circuit shown in FIG. 16;

FIG. 18 shows another operation result obtained in a RAM test circuit shown in FIG. 16;

FIG. 24 shows binary values of parallel output signals output from a test address generating unit shown in FIG. 22 in a tabular form in a case of a non-holding state; and FIG. 25 shows an operation result obtained in a RAM test circuit shown in FIG. 22 in a tabular form.

DETAILED DESCRIPTION OF THE PREFERRED EMBODIMENTS

Embodiments of the present invention will now be described with reference to the accompanying drawings.

Embodiment 1

Figure 1:
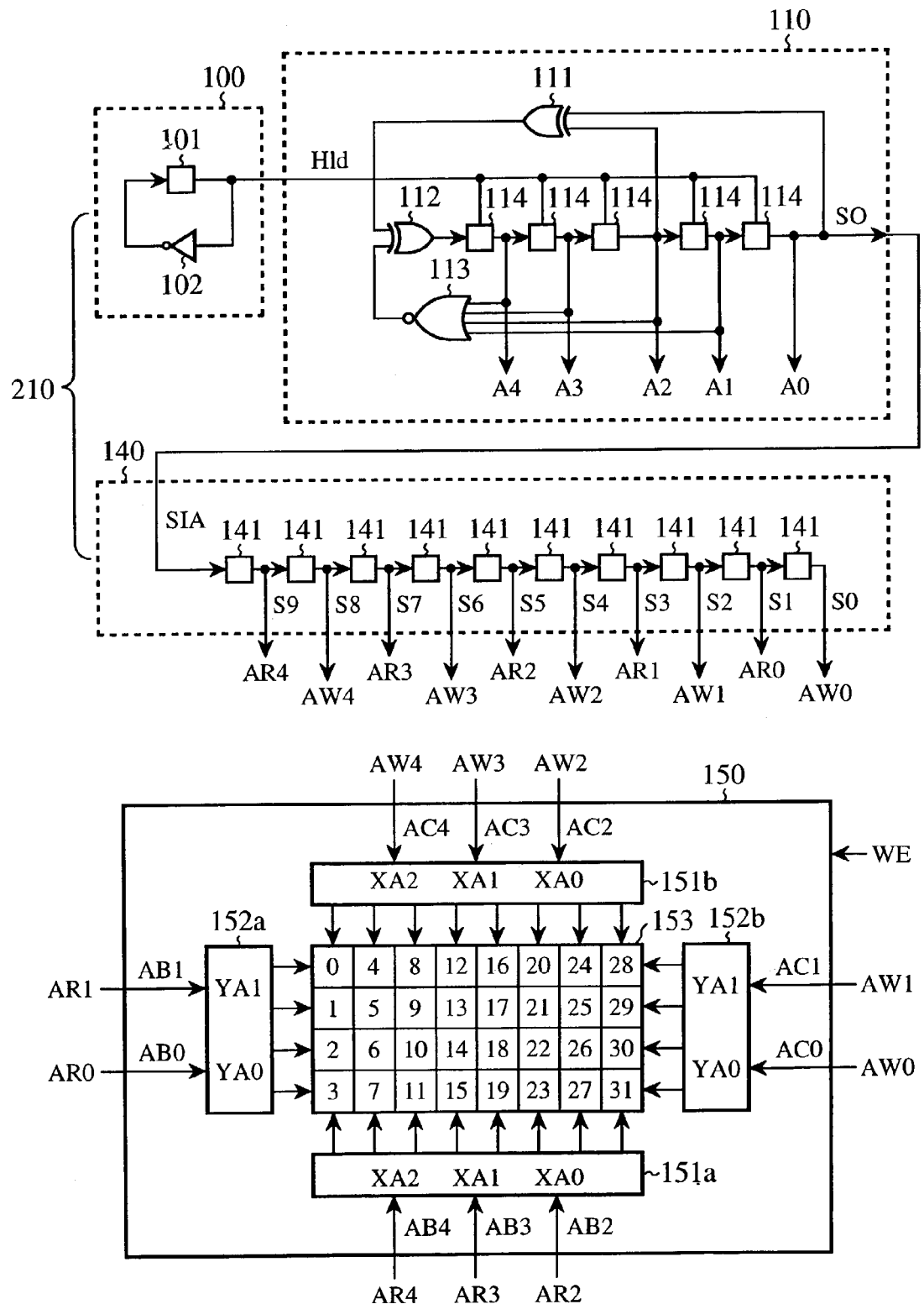
FIG. 1 is a circuit view of a semiconductor integrated circuit device according to a first embodiment of the present invention.
Figure 22:
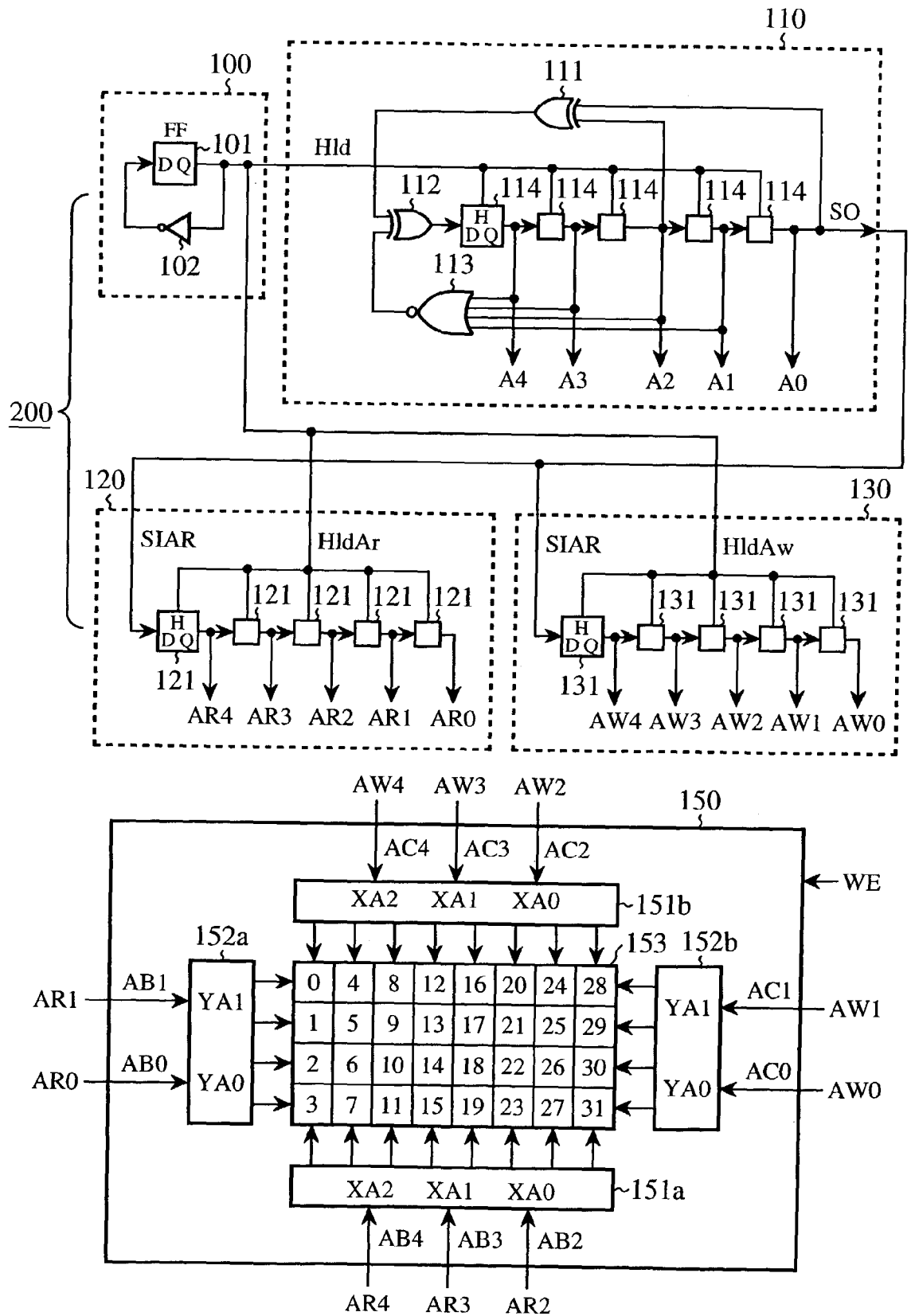
FIG. 22 is a circuit view of a conventional semiconductor integrated circuit device.
Figure 23A:
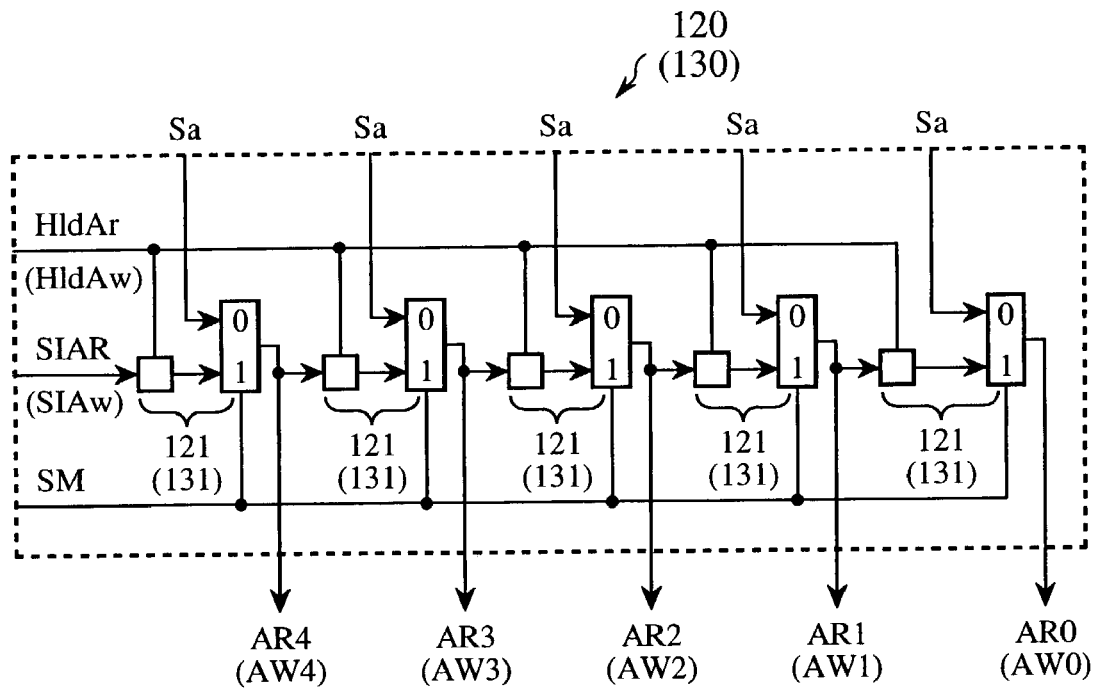
FIG. 23A is a circuit view of a shift register applied to both a read address shift register and a write address shift register shown in FIG. 22.
Figure 23B:
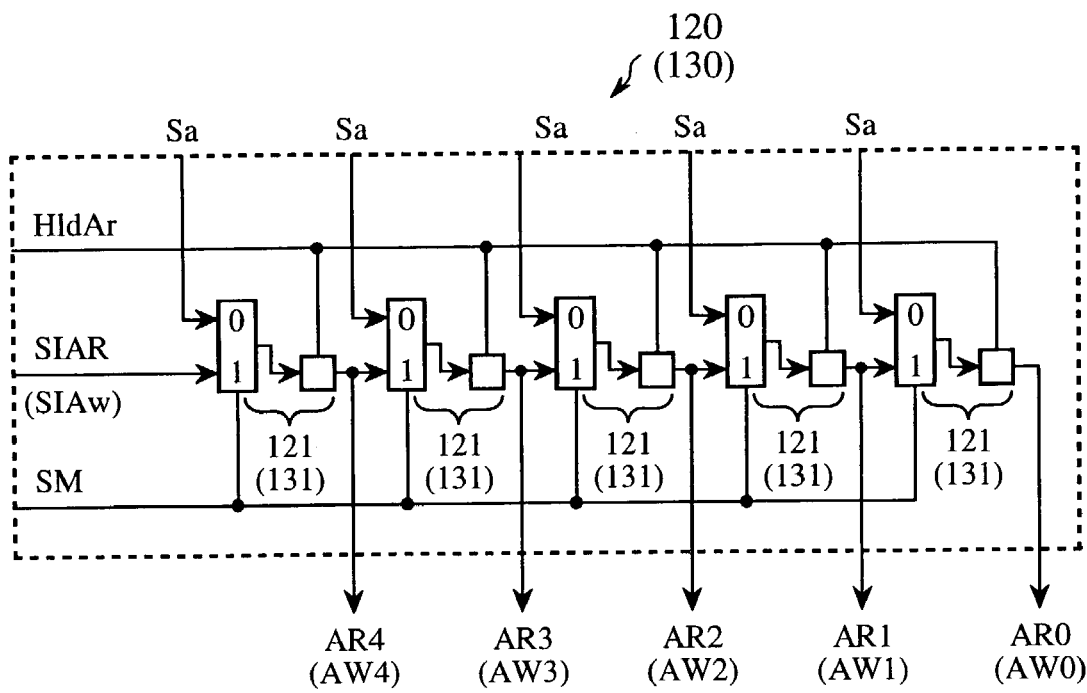
FIG. 23B is a circuit view of another shift register applied to both a read address shift register and a write address shift register shown in FIG. 22.

FIG. 1 is a circuit view of a semiconductor integrated circuit device according to a first embodiment of the present invention. The constituent elements, which are the same as those shown in FIG. 22, are indicated by the same reference numerals as those of the constituent elements shown in FIG. 22, and additional description of those constituent elements is omitted.

In FIG. 1, a semiconductor integrated circuit device comprises a RAM test circuit 210 and the two-port RAM 150. The RAM test circuit 210 comprises the address hold control unit 100, the test address generating unit (or a pseudo-random number generating unit) 110 and an address shift register (or a serial shift register) 140 for receiving one bit of the serial output signal SO output from the test address generating unit 110 as one bit of a serial input address signal SIA every clock cycle and outputting ten parallel output signals S9 to S0 every clock cycle. The serial output signal SO received in the address shift register 140 every clock cycle substantially indicates one pseudo-random number.

The address shift register 140 comprises ten flip-flop circuits (or flip-flops) 141 serially arranged in stages. A one-bit shift operation is performed in each flip-flop circuit 141 every clock cycle, the flip-flop circuits 141 output the parallel output signals S9 to S0 respectively. The parallel output signals S9, S7, S5, S3 and S1 are output from the flip-flop circuits 141 of odd-numbered (first, third, fifth, seventh and ninth) stages as the parallel read address signals AR4 to AR0, and the parallel read address signals AR4 to AR0 are sent to a plurality of address terminals AB4, AB3, AB2, AB1 and AB0 of the read port (the X read decoder 151a and the Y read decoder 152a) of the two-port RAM 150 respectively. The parallel output signals S8, S6, S4, S2 and S0 are output from the flip-flop circuits 141 of even-numbered (zero-th, second, fourth, sixth and eighth) stages as the parallel write address signals AW4 to AW0, and the parallel write address signals AW4 to AW0 are sent to a plurality of address terminals AC4, AC3, AC2, AC1 and AC0 of the write port (the X write decoder 151b and the Y write decoder 152b) of the two-port RAM 150 respectively.

Because the one-bit shift operation is performed in the flip-flop circuits 141 every clock cycle, the parallel write address signals AW4 to AW0 set in a current clock cycle are equal to the parallel read address signals AR4 to AR0 set in a preceding clock cycle earlier than the current clock cycle by one clock cycle.

Here, the number of memory cells of the two-port RAM 150 is equal to $2^N$ (N=5). Therefore, the number of flip-flop circuits (or flip-flops) 114 serially arranged in the test address generating unit 110 is set to N, and the number of address terminals AB4 to AB0 of the read port of the two-port RAM 150 and the number of address terminals AC4 to AC0 of the write port of the two-port RAM 150 are respectively set to N. Each of all memory cells of the two-port RAM 150 is specified by a string of binary values of which the number is equal to N.

Figure 2A:
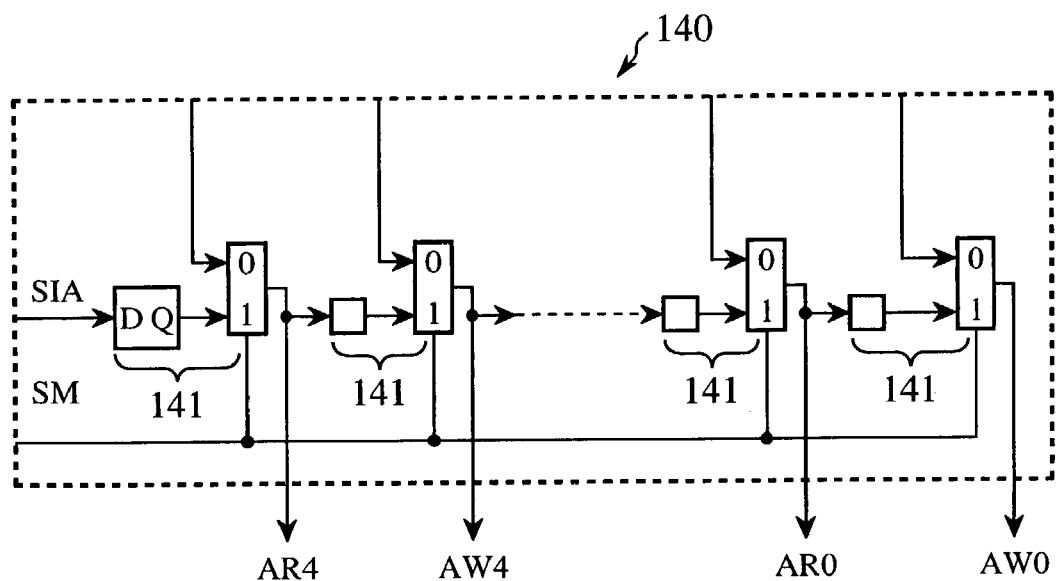
FIG. 2A is a circuit view of a shift register applied to an address shift register shown in FIG. 1.
Figure 2B:
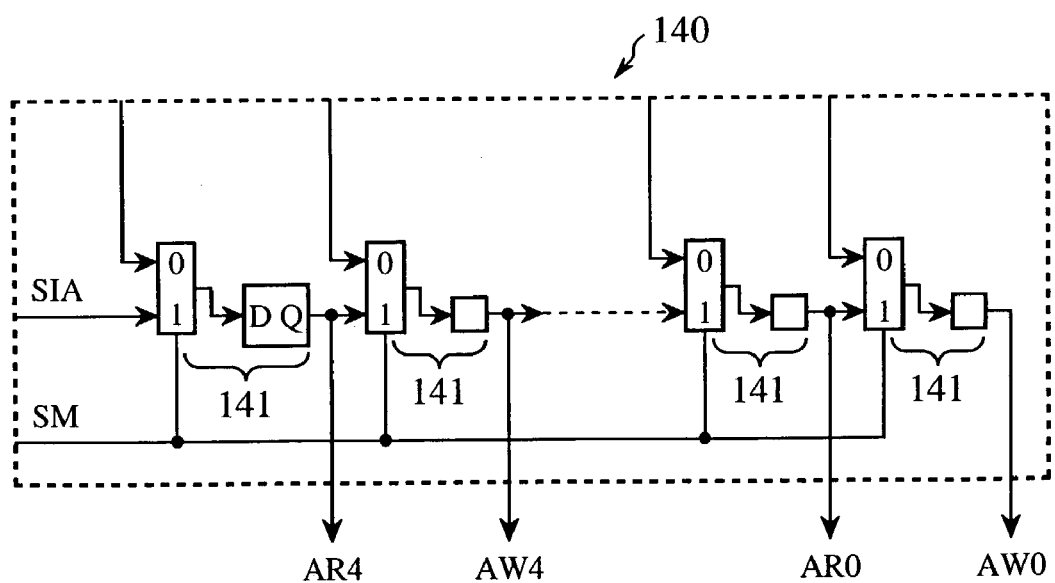
FIG. 2B is a circuit view of another shift register applied to an address shift register shown in FIG. 1.

FIG. 2A is a circuit view of a shift register applied to the address shift register 140, and FIG. 2B is a circuit view of another shift register applied to the address shift register 140. In each of the shift registers shown in FIG. 2A and FIG. 2B, an operation mode for a scan pass circuit is set to a serial shift operation mode (shift mode SM=1). Therefore, each flip-flop circuit 141 always selects the serial input address signal SIA or a signal output from an adjacent flip-flop circuit 141 of an upper stage. Each of the shift registers shown in FIG. 2A and FIG. 2B can be used for the address shift register 140.

Next, an operation of the semiconductor integrated circuit device will be described below.

FIG. 3 shows an operation result obtained in the RAM test circuit 210 in a tabular form.

The hold signal Hld alternately set to the values "1" and "0" on a clock cycle is output from the address hold control unit 100 to the test address generating unit 110, and binary values of the parallel output signals A4, A3, A2, A1 and A0 are renewed in the test address generating unit 110 every two clock cycles in the same manner as in the conventional semiconductor integrated circuit device. In detail, as shown in FIG. 3, in CYCLE=0, A4=A3=A2= A1=A0=0 and AR4=Aw4=AR3=AW3=AR2=AW2=AR1= AW1=AR0=AW0=X (X denotes an undefined binary value) are preset. Also a binary value "1" is output from the EXOR circuit 112. In CYCLE=1, the binary values A4 to A1 are held in the flip-flop circuits 114 of the second to fourth stages, and the binary value "1" output from the EXOR circuit 112 is held in the flip-flop circuit 114 of the first stage. In CYCLE=2, in response to the hold signal Hld set to "1", the binary value input to each flip-flop circuit 114 is output. Therefore, A4=1 and A3=A2=A1= A0=0 are set. Thereafter, the shift operation of each flip-flop circuit 114 is performed every two clock cycles in the same manner.

As a result, as shown in FIG. 3, because the test address generating unit 110 is formed of an LFSR type pseudo-random number generating circuit, $2^5$ (the numeral "5" denotes the number of flip-flop circuits 114) pseudo-random numbers from "0" to "31" are generated in the test address generating unit 110 in a pseudo-random number generating cycle equal to a time period from CYCLE=0 to CYCLE=63, and each pseudo-random number is indicated by a string of binary values of the parallel output signals A4 to A0. This pseudo-random number generating cycle is equal to $2^6$ clock cycles.

Here, the binary values of the parallel output signals A4 to A0 set in each clock cycle are output to the address shift register 140 as five bits of the serial output signal SO in the clock cycle and four succeeding clock cycles. Therefore, the serial output signal SO indicating one pseudo-random number is substantially output to the address shift register 140 every clock cycle.

In the address shift register 140, an address shift operation is performed in each flip-flop circuit 141 of the address shift register 140 every clock cycle (or every pulse of a clock signal). Therefore, the serial output signal SO output from the test address generating unit 110 is input to the flip-flop circuit 141 of the first stage as the serial input address signal SIA every clock cycle, and the serial input address signal SIA is output from the flip-flop circuit 141 of the first stage every clock cycle as the parallel read address signal AR4. Also, one parallel read address signal input to each flip-flop circuit 141 is output from the flip-flop circuit 141 every clock cycle. In detail, in CYCLE=1, the binary value "0" of the serial input address signal SIA is set as that of the parallel read address signal AR4, so that AR4=0 and AW4=AR3= AW3=AR2=AW2=AR1=AW1=AR0=AW0=X are set. In CYCLE=2, the binary value "0" of the serial input address signal SIA is set as that of the parallel read address signal AR4, and the parallel read address signal AR4 is set as the parallel read address signal AR3. Therefore, AR4=AW4=0 and AR3=AW3=AR2=AW2=AR1=AW1=AR0= AW0=X are set. In the same manner, AR4=AW4=AR3= 0 and AW3=AR2=AW2=AR1=AW1=AR0=AW0=X are set in CYCLE=3, AR4=AW4=AR3=AW3=0 and AR2=AW2= AR1=AW1=AR0=AW0=X are set in CYCLE=4, and AR4= AW4=AR3=AW3=AR2=0 and AW2=AR1=AW1=AR0= AW0=X are set in CYCLE=5. Thereafter, the shift operation is repeatedly performed in each flip-flop circuit 141 of the address shift register 140 every clock cycle, and AR4= AW4=AR3=AW3=AR2=AW2=AR1=AW1=AR0=0 and AW0=1 are set in CYCLE=73.

As a result, as shown in FIG. 3, the binary values of the parallel read address signals AR4 to AR0 set in a current clock cycle are equal to those of the parallel output signals A4 to A0 set in a preceding clock cycle earlier than the current clock cycle by nine clock cycles. Therefore, the group of binary values of the parallel read address signals AR4 to AR0 set in each clock cycle indicates one pseudo-random number indicated by the group of binary values of the parallel output signals A4 to A0 set in a preceding clock cycle earlier than the clock cycle by nine clock cycles.

Also, the binary values of the parallel write address signals AW4 to AW0 set in a current clock cycle are equal to those of the parallel output signals A4 to A0 set in a preceding clock cycle earlier than the current clock cycle by ten clock cycles. Therefore, the group of binary values of the parallel write address signals AW4 to AW0 set in each clock cycle indicates one pseudo-random number indicated by the group of binary values of the parallel output signals A4 to A0 set in a preceding clock cycle earlier than the clock cycle by ten clock cycles.

Therefore, the pseudo-random number indicated by the parallel read address signals AR4 to AR0 in each clock cycle is indicated by the parallel write address signals AW4 to AW0 in a succeeding clock cycle later by one clock cycle.

In this case, $2^5$ pseudo-random numbers from "0" to "31" are indicated by the group of parallel read address signals AR4 to AR0 and the group of parallel write address signals AW4 to AW0 in the pseudo-random number generating cycle equal to sixty-four clock cycles. Therefore, the read operation test and the write operation test are alternately performed in sixty-four clock cycles from CYCLE=9 to CYCLE= 72 to perform the read test and the write test for all the memory cells of the two-port RAM 150 in the random order. For example, a read operation test for the read address AR=0 is performed in CYCLE=9, and a write operation test for the write address AW=0 is performed in CYCLE= 10.

This operation test can be applied to a part of a march test performed according to a typical test algorithm of RAM.

As is described above, in the first embodiment, $2^5$ pseudo-random numbers are generated in the test address generating unit 110 in the pseudo-random number generating cycle equal to $2^6$ clock cycles so as to maintain each pseudo-random number in two successive clock cycles, the generated pseudo-random number is renewed every two clock cycles, the serial output signal SO substantially indicating one pseudo-random number in two successive clock cycles is output to the address shift register 140 every clock cycle, the parallel read address signals AR4 to AR0 indicating one pseudo-random number in two successive clock cycles are output from the flip-flop circuits 141 of the odd-numbered stages every clock cycle, the parallel write address signals AW4 to AW0 indicating one pseudo-random number in two successive clock cycles are output from the flip-flop circuits 141 of the even-numbered stages every clock cycle, and both the inputting of the parallel read address signals AR4 to AR0 to the address terminals AB4 to AB0 of the read port (both the X read decoder 151a and the Y read decoder 152a) of the two-port RAM 150 and the inputting of the parallel write address signals AW4 to AW0 to the address terminals AC4 to AC0 of the write port (both the X write decoder 151b and the Y write decoder 152b) of the two-port RAM 150 are alternately performed according to the write enable signal WE so as to perform both the inputting of the parallel read address signals AR4 to AR0 and the inputting of the parallel write address signals AW4 to AW0 every two clocks.

Therefore, even though the address shift register 140 has no hold function, both the read test and the write test can be performed for all the memory cells of the two-port RAM 150. Also, because the address shift register 140 has no hold function, a small-sized RAM test circuit 210 can be manufactured as compared with the RAM test circuit 200 of the conventional semiconductor integrated circuit device.

Accordingly, a small-sized semiconductor integrated circuit device can be manufactured at a low cost.

In particular, because a plurality of random access memories are actually arranged in the semiconductor integrated circuit device, a plurality of address shift registers 140 are required in one-to-one correspondence. In this case, the effect of the manufacturing of the small-sized semiconductor integrated circuit device at a low cost is further heightened.

In the first embodiment, the parallel read address signals AR4 to AR0 output from the flip-flop circuits 141 of the odd-numbered stages are input to the address terminals AB4 to AB0 of both the X read decoder 151a and the Y read decoder 152a of the two-port RAM 150, and the parallel write address signals AW4 output from the flip-flop circuits 141 of the even-numbered stages are input to the address terminals AC4 to AC0 of both the X write decoder 151b and the Y write decoder 152b of the two-port RAM 150. However, it is applicable that the parallel write address signals AW4 be output from the flip-flop circuits 141 of the odd-numbered stages so as to be input to the address terminals AC4 to AC0 of both the X write decoder 151b and the Y write decoder 152b of the two-port RAM 150, and the parallel read address signals AR4 to AR0 be output from the flip-flop circuits 141 of the even-numbered stages so as to be input to the address terminals AB4 to AB0 of both the X read decoder 151a and the Y read decoder 152a of the two-port RAM 150.

Embodiment 2

Figure 4:
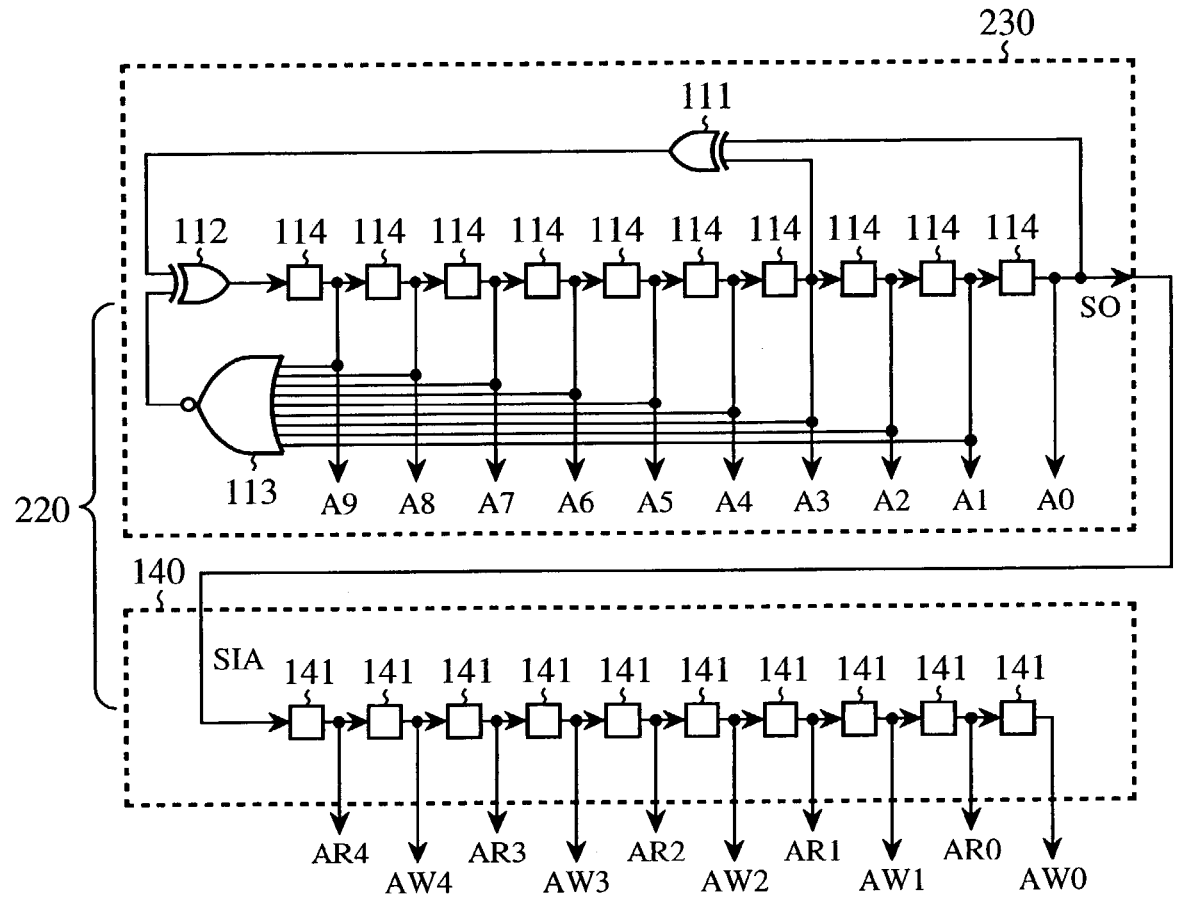
FIG. 4 is a circuit view of a semiconductor integrated circuit device according to a second embodiment of the present invention.
Figure 4:
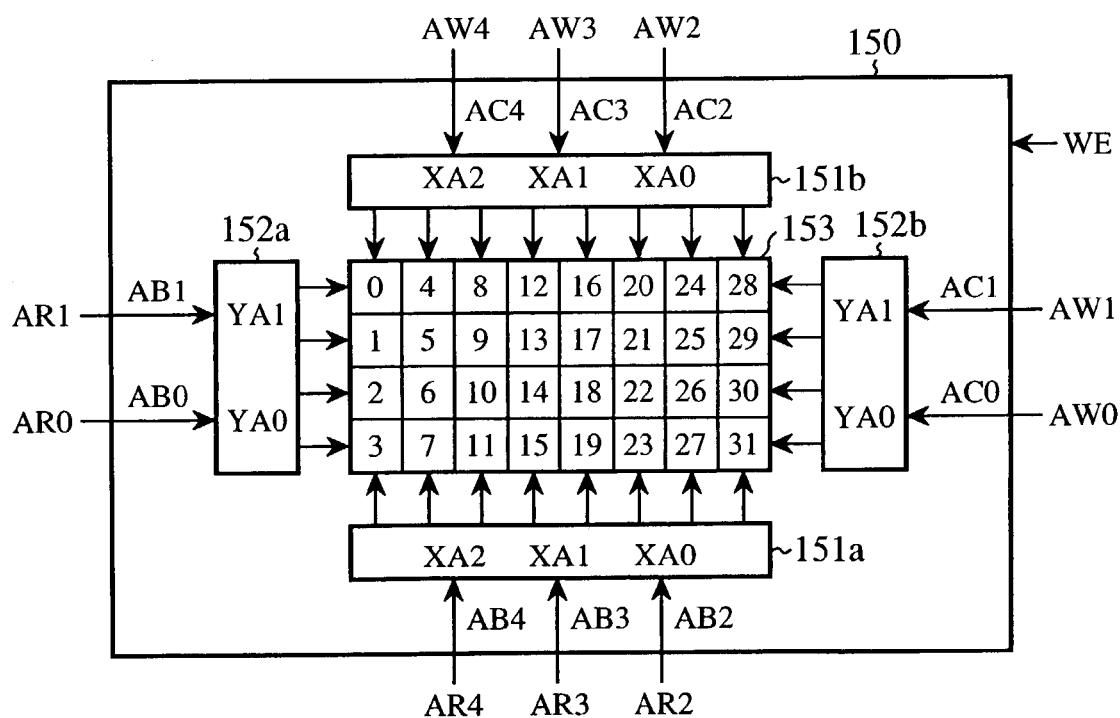

FIG. 4 is a circuit view of a semiconductor integrated circuit device according to a second embodiment of the present invention. The constituent elements, which are the same as those shown in FIG. 1, are indicated by the same reference numerals as those of the constituent elements shown in FIG. 1, and additional description of those constituent elements is omitted.

In FIG. 4, a semiconductor integrated circuit device comprises a RAM test circuit 220 and the two-port RAM 150. The simultaneous access to two memory cells of the two-port RAM 150 is possible. The RAM test circuit 220 comprises a test address generating unit (or a pseudo-random number generating unit) 230 for producing ten parallel output signals A9, A8, A7, A6, A5, A4, A3, A2, A1 and A0 respectively set to a binary value "0" or "1" every clock cycle and outputting the parallel output signal A0 as one bit of a serial output signal SO, and the address shift register 140.

The test address generating unit 230 is formed of an LFSR type pseudo-random number generating circuit. The test address generating unit 230 comprises the ten flip-flop circuits 114 serially arranged in ten stages, the EXOR circuit 111 for producing a signal according to an EXOR logic for two binary values of the parallel output signals A3 and A0 output from the flip-flop circuits 114 of the seventh and tenth stages, the NOR circuit 113 for producing a signal according to an NOR logic for nine binary values of the parallel output signals A9 to A1 output from the flip-flop circuits 114 of the first, second, third, fourth, fifth, sixth, seventh, eighth and ninth stages, and the EXOR circuit 112 for producing a signal according to an EXOR logic for two binary values output from the EXOR circuit 111 and the NOR circuit 113 and outputting a binary value of the produced signal to the flip-flop circuit 114 of the first stage.

In the first embodiment, the number of flip-flop circuits 114 serially arranged in the test address generating unit 110 is set to be equal to both the number of bits of the read address AR input to the address terminals AB4 to AB0 of the read port and the number of bits of the write address AW input to the address terminals AC4 to AC0 of the write port of the two-port RAM 150. In contrast, in the second embodiment, the number of flip-flop circuits 114 serially arranged in the test address generating unit 230 is set to be equal to a sum of the number of bits of the read address AR input to the address terminals AB4 to AB0 of the read port and the number of bits of the write address AW input to the address terminals AC4 to AC0 of the write port in the two-port RAM 150, and the parallel output signals A9 to A0 are output from the test address generating unit 230.

Also, because the test address generating unit 230 is formed of an LFSR type pseudo-random number generating circuit, a pseudo-random number indicated by a string of binary values of the parallel output signals A9 to A0 is generated every clock cycle, and $2^{10}$ (=1024, and the numeral "10" denotes the number of flip-flop circuits 114) pseudo-random numbers different from each other are generated in a pseudo-random number generating cycle equal to $2^{10}$ clock cycles. Therefore, the pseudo-random numbers ranging from "0" to "1023" are generated in the pseudo-random number generating cycle.

Also, because one parallel output signal Ai (i=9, 8, 7, 6, 5, 4, 3, 2 or 1) in a current clock cycle is set as another parallel output signal Aj (j=8, 7, 6, 5, 4, 3, 2, 1 or 0) in a next clock cycle due to the shift operation of each of the flip-flop circuits 114 of the second to tenth stages, ten bits of the serial output signal SO are derived from the parallel output signal A0 set in a current clock cycle and the parallel output signals A9 to A1 set in nine preceding clock cycles and indicate one pseudo-random number. Therefore, each time one bit of the serial output signal SO is output to the address shift register 140 in a current clock cycle, the address shift register 140 substantially receives one pseudo-random number indicated by ten bits of the serial output signal SO output in the current clock cycle and nine preceding clock cycles. That is, each bit of the serial output signal SO output to the address shift register 140 substantially indicates one pseudo-random number.

Next, an operation of the semiconductor integrated circuit device will be described below.

The binary values of the parallel output signals A9 to A0 indicating one pseudo-random number are renewed every clock cycle in the test address generating unit 230, one bit of the serial output signal SO denoting the parallel output signal A0 is input to the address shift register 140 as the serial input address signal SIA every clock cycle. In the address shift register 140, the serial input address signal SIA is shifted in each of the flip-flop circuits 141 of the first to ten stages in that order every clock cycle, the parallel read address signals AR4 to AR0 are output from the flip-flop circuits 141 of the odd-numbered stages every clock cycle, and the parallel write address signals AW4 to AW0 are output from the flip-flop circuits 141 of the even-numbered stages every clock cycle.

FIG. 5 shows an operation result obtained in the RAM test circuit 220 in a tabular form.

The setting of the read address AR and the write address AW will be described in detail. As shown in FIG. 5, in CYCLE=0, A9=A8=A7=A6=A5=A4=A3=A2=A1=A0=0 and
AR4=AW4=AR3=AW3=AR2=AW2=AR1=AW1=AR0=
AW0=X (X denotes an undefined binary value) are preset. In the test address generating unit 230, in CYCLE=0, the EXOR circuit 111 receiving binary values "0" of the signals A3 and A0 outputs a binary value "0", the NOR circuit 113 receiving binary values "0" of the signals A9 to A0 outputs a binary value "1", and the EXOR circuit 112 receiving the binary value "0" of the EXOR circuit 111 and the binary value "1" of the NOR circuit 113 outputs a binary value "1". In CYCLE=1, the parallel output signal A9 is set to the binary value "1" output from the EXOR circuit 112, and A9=1 and A8=A7=A6=A5=A4=A3=A2=A1=A0= 0 are set. Also, the EXOR circuit 111 outputs a binary value "0", the NOR circuit 113 receiving the binary value "1" of the signal A9 and binary values "0" of the signals A8 to A0 outputs a binary value "0", and the EXOR circuit 112 receiving the binary value "0" of the EXOR circuit 111 and the binary value "0" of the NOR circuit 113 outputs a binary value "0". In CYCLE=2, the parallel output signal A9 is set to the binary value "0" output from the EXOR circuit 112, and A9=0, A8=1 and A7=A6=A5=A4= A3=A2=A1=A0=0 are set. Also, the EXOR circuit 111 outputs a binary value "0", the NOR circuit 113 outputs a binary value "0", and the EXOR circuit 112 outputs a binary value "0". Thereafter, the address generating operation in CYCLE=3, CYCLE=4, CYCLE=5 and CYCLE= 6 is performed in the same manner as that in CYCLE=2. In CYCLE=7, A9=A8=A7=A6=A5=A4=0, A3=1 and A2=A1=A0=0 are set, the EXOR circuit 111 receiving the binary value "1" of the signal A3 and the binary value "0" of the signal A0 outputs a binary value "1", the NOR circuit 113 outputs a binary value "0", and the EXOR circuit 112 receiving the binary value "1" of the EXOR circuit 111 and the binary value "0" of the NOR circuit 113 outputs a binary value "1". The test address generating operation of the test address generating unit 230 is repeatedly performed in the same manner.

In the address shift register 140, one binary value "0" of the serial output signal SO is output from the test address generating unit 230 in CYCLE=0. In CYCLE=1, the binary value "0" of the serial output signal SO is output from the flip-flop circuit 141 of the first stage as that of the parallel read address signal AR4, and AR4= 0 and AW4=AR3=AW3=AR2=AW2=AR1=AW1=AR0= AW0=X are set. Thereafter, the address shift operation in CYCLE=2 to CYCLE=10 is performed in the same manner as that in CYCLE=2, and AR4=AW4=AR3=AW3=AR2= AW2=AR1=AW1=AR0=AW0=0 is set in CYCLE=10. In CYCLE=11, one binary value "1" of the serial output signal SO output from the test address generating unit 230 in CYCLE= 10 is output from the flip-flop circuit 141 of the first stage as that of the parallel read address signal AR4, and AR4=1 and AW4=AR3=AW3=AR2=AW2=AR1=AW1=AR0= AW0=0 are set. The address shift operation of the address shift register 140 is repeatedly performed in the same manner.

Here, because each pseudo-random number indicated by the string of binary values of the parallel output signals A9 to A0 in a current clock cycle is indicated by the string of binary values of the parallel address signals AR4, AW4, AR3, AW3, AR2, AW2, AR1, AW1, AR0 and AW1 in a succeeding clock cycle later than the current clock cycle by ten clock cycles, a first pseudo-random number indicated by the string of binary values of the parallel output signals A9, A7, A5, A3 and A1 in the current clock cycle is indicated by the string of binary values of the parallel read address signals AR4 to AR0 in the succeeding clock cycle, and a second pseudo-random number indicated by the string of binary values of the parallel output signals A8, A6, A4, A2 and A0 is indicated by the string of binary values of the parallel write address signals AW4 to AW0 in the current clock cycle in the succeeding clock cycle. The parallel read address signals AR4 to AR0 indicates the read address AR set to the first pseudo-random number ranging from "0" to "31", and the parallel write address signals AW4 to AW0 indicate the write address AW set to the second pseudo-random number ranging from "0" to "31".

Here, because each of the pseudo-random numbers generated in the test address generating unit 230 in the pseudo-random number generating cycle differs from the other pseudo-random numbers, a combination of the read address AR and the write address AR obtained in each clock cycle differs from the other combinations obtained in the other clock cycles in the pseudo-random number generating cycle. Therefore, $2^{10}$ (=1024) combinations of the read addresses AR and the write addresses AR are obtained in the pseudo-random number generating cycle equal to $2^{10}$ clock cycles, and all combinations of the read addresses AR and the write addresses AW are produced in the address shift register 140.

Thereafter, both the inputting of the parallel read address signals AR4 to AR0 to the address terminals AB4 to AB0 of the read port (the X read decoder 151*a* and the Y read decoder 152*a*) of the two-port RAM 150 and the inputting of the parallel write address signals AW4 to AW0 to the address terminals AC4 to AC0 of the write port (the X write decoder 151*b* and the Y write decoder 152*b*) of the two-port RAM 150 are simultaneously performed to simultaneously perform both the read test for the memory cell of the read address AR and the write test for the memory cell of the write address AW. Here, the write enable signal WE is always set to the high level to perform the write operation every clock cycle, and the read operation is performed every clock cycle regardless of the write enable signal WE. Both the read test and the write test for all the memory cells of the two-port RAM 150 is started in CYCLE= 10. For example, a read operation test for the read address AR=0 and a write operation test for the write address AW=0 are simultaneously performed in CYCLE=10.

In FIG. 5, the clock cycles from CYCLE=10 to CYCLE=75 for the combinations of the read addresses AR and the write addresses AW are shown. However, the combination of the read test and write test is performed in the clock cycles from CYCLE=10 to CYCLE=1033.

As is described above, in the second embodiment, the test address generating unit 230 has the ten flip-flop circuits 114, the number of flip-flop circuits 114 is set to be equal to a sum of the number of bits of the read address AR input to the address terminals AB4 to AB0 of the read port and the number of bits of the write address AW input to the address terminals AC4 to AC0 of the write port in the two-port RAM 150, the pseudo-random numbers ranging from "0" to "1023" are generated in the test address generating unit 230 in pseudo-random number generating cycle equal to $2^{10}$ clock cycles, the serial output signal SO substantially expressing one pseudo-random number is output to the address shift register 140 every clock cycle, the parallel read address signals AR4 to AR0 are output from the flip-flop circuits 141 of the odd-numbered stages every clock cycle, the parallel write address signals AW4 to AW0 are output from the flip-flop circuits 141 of the even-numbered stages every clock cycle, and both the inputting of the parallel read address signals AR4 to AR0 to the address terminals AB4 to AB0 of the read port (both the X read decoder 151*a* and the Y read decoder 152*a*) of the two-port RAM 150 and the inputting of the parallel write address signals AW4 to AW0 to the address terminals AC4 to AC0 of the write port (both the X write decoder 151*b* and the Y write decoder 152*b*) of the two-port RAM 150 are simultaneously performed. Therefore, both the read test and the write test for all combinations of two memory cells can be perform in the two-port RAM 150. Accordingly, the two-port RAM 150 can be tested with high reliability, and the semiconductor integrated circuit device having the two-port RAM 150 tested with high reliability can be manufactured.

Also, because both the read test and the write test for two memory cells are performed every clock cycle, the read test and the write test for the two-port RAM 150 can be quickly performed.

Embodiment 3

Figure 6:
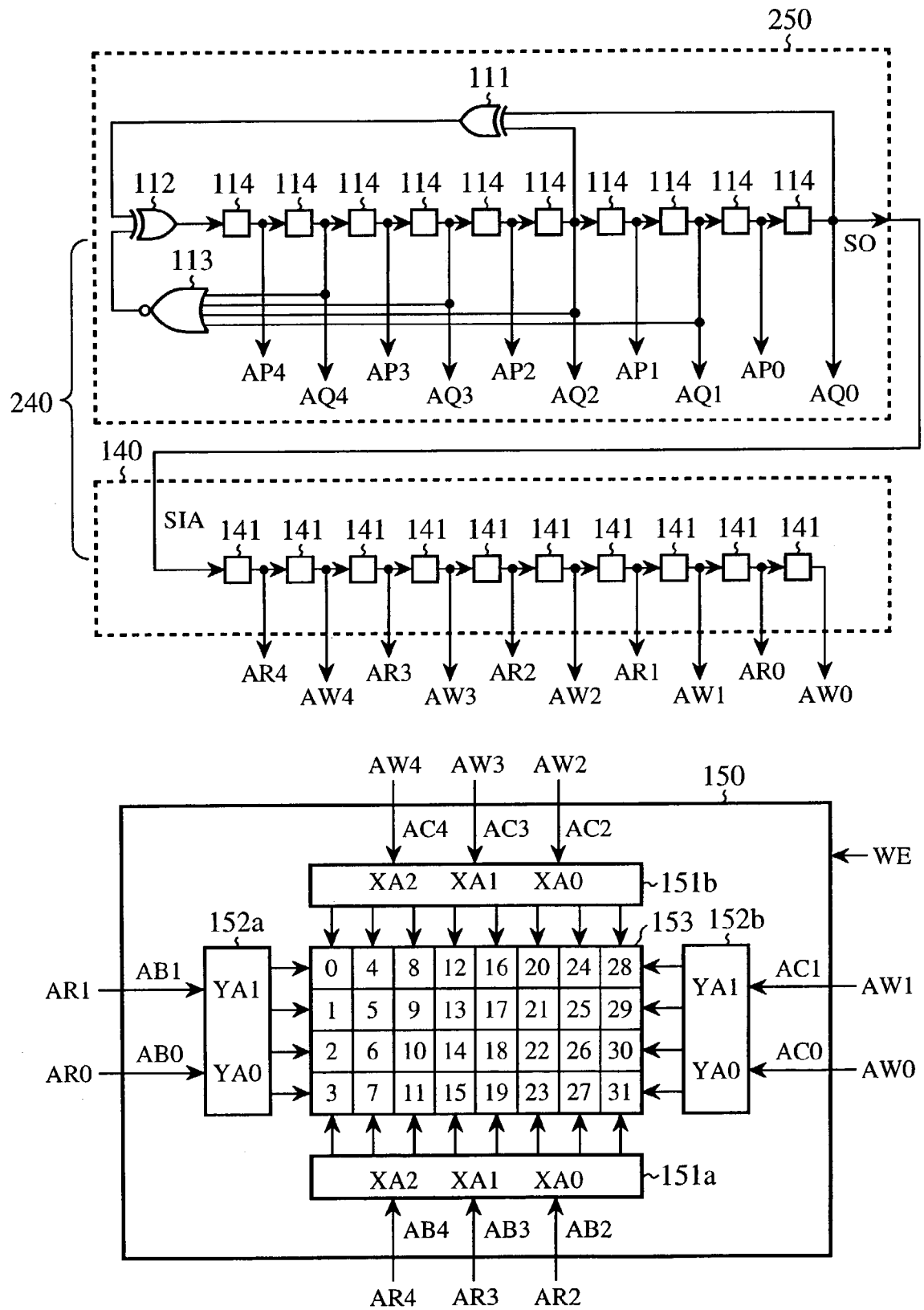
FIG. 6 is a circuit view of a semiconductor integrated circuit device according to a third embodiment of the present invention.

FIG. 6 is a circuit view of a semiconductor integrated circuit device according to a third embodiment of the present invention. The constituent elements, which are the same as those shown in FIG. 1, are indicated by the same reference numerals as those of the constituent elements shown in FIG. 1, and additional description of those constituent elements is omitted.

In FIG. 6, a semiconductor integrated circuit device comprises a RAM test circuit 240 and the two-port RAM 150. The RAM test circuit 240 comprises a test address generating unit (or a pseudo-random number generating unit) 250 for producing five parallel output signals AP4, AP3, AP2, AP1 and AP0 and five parallel output signals AQ4, AQ3, AQ2, AQ1 and AQ0 respectively set to a binary value "0" or "1" every clock cycle and outputting the parallel output signal AQ0 as one bit of a serial output signal SO, and the address shift register 140.

The test address generating unit 250 comprises the ten flip-flop circuits 114 serially arranged in ten stages, the EXOR circuit 111, the NOR circuit 113 and the EXOR circuit 112. The parallel output signals AP4 to AP0 are output from the flip-flop circuits 114 of the odd-numbered stages. The parallel output signals AQ4 to AQ0 are output from the flip-flop circuits 114 of the even-numbered stages. The EXOR circuit 111 outputs a signal according to the EXOR logic for two binary values of the parallel output signals AQ2 and AQ0 output from the flip-flop circuits 114 of the sixth and tenth stages. The NOR circuit 113 outputs a signal according to the NOR logic for four binary values of the parallel output signals AQ4 to AQ1 output from the flip-flop circuits 114 of the second, fourth, sixth and eighth stages. The EXOR circuit 112 produces a signal according to the EXOR logic for two binary values output from the EXOR circuit 111 and the NOR circuit 113 and outputs the produced signal to the flip-flop circuit 114 of the first stage.

Therefore, the test address generating unit 250 is formed of an LFSR type pseudo-random number generating circuit. In this case, $2^5$ (the numeral "5" denotes the number of flip-flop circuits 114 outputting the parallel output signals AP4 to AP0) first pseudo-random numbers ranging from "0" to "31" are generated in a pseudo-random number generating cycle equal to $2^6$ clock cycles or $2^5$ clock cycles, and each first pseudo-random number is indicated by a string of binary values of the parallel output signals AP4 to AP0. Also, $2^5$ (the numeral "5" denotes the number of flip-flop circuits 114 outputting the parallel output signals AQ4 to AQ0) second pseudo-random numbers ranging from "0" to "31" are generated in the pseudo-random number generating cycle, and each second pseudo-random number is indicated by a string of binary values of the parallel output signals AQ4 to AQ0. Because the parallel output signals AP4 to AP0 are set as the parallel output signals AQ4 to AQ0 respectively after one clock, each first pseudo-random number generated in a current clock cycle is the same as the second pseudo-random number generated in a succeeding clock cycle later than the current clock cycle by one clock cycle.

The number of flip-flop circuits 114 outputting the parallel output signals AP4 to AP0 is set to be equal to the number of address terminals AB4 to AB0 of the read port of the two-port RAM 150, and the number of flip-flop circuits 114 outputting the parallel output signals AQ4 to AQ0 is set to be equal to the number of address terminals AC4 to AC0 of the write port of the two-port RAM 150. Therefore, the number of flip-flop circuits 114 of the test address generating unit 250 is equal to a sum of the number of bits of the read address AR input to the address terminals AB4 to AB0 of the read port and the number of bits of the write address AW input to the address terminals AC4 to AC0 of the write port in the two-port RAM 150.

Next, an operation of the semiconductor integrated circuit device will be described below.

FIG. 7 shows an operation result obtained in the RAM test circuit 240 in a tabular form.

In the test address generating unit 250, the shift operation is performed in each flip-flop circuit 114 every clock cycle, and the parallel output signals AP4 to AP0 are output from the flip-flop circuits 114 of the odd-numbered stages. Also, the NOR circuit 113 receives the parallel output signals AQ4 to AQ0, the EXOR circuit 111 receives the binary values of the parallel output signals AQ2 and AQ0, the EXOR circuit 112 receives the binary values output from both the EXOR circuit 111 and the NOR circuit 113, and a binary value output from the EXOR circuit 112 is shifted in each flip-flop circuit 114 every clock cycle. In this case, the binary value output from the EXOR circuit 112 is output as the parallel output signals AQ4 to AQ0 in that order at equal intervals of two clock cycles. Also, because the parallel output signals AP4 to AP0 are output from the flip-flop circuits 114 of the odd-numbered stages, the binary values of the parallel output signals AP4 to AP0 in a current cycle are the same as those of the parallel output signals AQ4 to AQ0 in a succeeding cycle later than the current cycle by one clock cycle. Therefore, in a case the binary values of the parallel output signals AP4 to AP0 are preset to the same binary values as those preset for the parallel output signals AQ4 to AQ0, the change of the binary values of the parallel output signals AQ4 to AQ0 is the same as that in the parallel output signals A4 to A0 of the first embodiment, and the change of the binary values of the parallel output signals AP4 to AP0 is earlier by one clock cycle than that in the parallel output signals A4 to A0.

As shown in FIG. 7, in a case where AP4=AP3=AP2=AP1=AP0=0 and AQ4=AQ3=AQ2=AQ1=AQ0=0 are preset in CYCLE=0, the same changes of both the read address AR and the write address AW as those shown in FIG. 3 are obtained.

In the test address generating unit 250, in response to this presetting, $2^5$ first pseudo-random numbers indicated by the parallel output signals AP4 to AP0 are generated in a pseudo-random number generating cycle equal to $2^6$ clock cycles, and $2^5$ second pseudo-random numbers indicated by the parallel output signals AQ4 to AQ0 are generated in the pseudo-random number generating cycle.

The serial output signal SO substantially expressing both the first pseudo-random numbers and the second pseudo-random numbers in $2^6$ clock cycles is input to the address shift register 140 every clock cycle.

Thereafter, the parallel read address signals AR4 to AR0 indicating the first pseudo-random numbers indicated by the parallel output signals AP4 to AP0 in $2^6$ clock cycles are output from the flip-flop circuits 141 of the odd-numbered stages every clock cycle, the parallel write address signals AW4 to AW0 indicating the second pseudo-random numbers indicated by the parallel output signals AQ4 to AQ0 in $2^6$ clock cycles are output from the flip-flop circuits 141 of the even-numbered stages every clock cycle. Thereafter, both the inputting of the parallel read address signals AR4 to AR0 to the address terminals AB4 to AB0 of the read port (both the X read decoder 151a and the Y read decoder 152a) of the two-port RAM 150 and the inputting of the parallel write address signals AW4 to AW0 to the address terminals AC4 to AC0 of the write port (both the X write decoder 151b and the Y write decoder 152b) of the two-port RAM 150 are alternately performed in the same manner as in the first embodiment so as to perform each pair of the read test and the write test every two clocks.

Therefore, in a case where the presetting of the parallel output signals AP4 to AP0 is the same as that of the parallel output signals AQ4 to AQ0, the read test and the write test for the two-port RAM 150 can be performed in the same manner as those performed in the first embodiment.

As is described above, in the third embodiment, the test address generating unit 250 has the ten flip-flop circuits 114 of which the number is set to be equal to a sum of the number of bits of the read address AR input to the read port and the number of bits of the write address AW input to the write port of the two-port RAM 150, the $2^5$ first pseudo-random numbers indicated by the parallel output signals AP4 to AP0 and the $2^5$ second pseudo-random numbers indicated by the parallel output signals AQ4 to AQ0 in the range from "0" to "31" are generated in the test address generating unit 250 in the pseudo-random number generating cycle equal to $2^6$ clock cycles so as to maintain each pseudo-random number in two successive clock cycles, each first pseudo-random number generated in a current clock cycle is the same as the second pseudo-random number generated in a succeeding clock cycle later than the current clock cycle by one clock cycle, the serial output signal SO substantially expressing both the first pseudo-random numbers and the second pseudo-random numbers in $2^6$ clock cycles is output to the address shift register 140 every clock cycle, the parallel read address signals AR4 to AR0 indicating one first pseudo-random number are output from the flip-flop circuits 141 of the odd-numbered stages every clock cycle, the parallel write address signals AW4 to AW0 indicating one second pseudo-random number are output from the flip-flop circuits 141 of the even-numbered stages every clock cycle, and both the inputting of the parallel read address signals AR4 to AR0 to the address terminals AB4 to AB0 of the read port (both the X read decoder 151a and the Y read decoder 152a) of the two-port RAM 150 and the inputting of the parallel write address signals AW4 to AW0 to the address terminals AC4 to AC0 of the write port (both the X write decoder 151b and the Y write decoder 152b) of the two-port RAM 150 are alternately performed so as to perform both the read test and the write test every two clock cycles.

Therefore, even though the address shift register 140 has no hold function, the read test and the write test for all the memory cells of the two-port RAM 150 can be performed in sixty-four clock cycles. Accordingly, a small-sized RAM test circuit can be manufactured as compared with the RAM test circuit 200 of the conventional semiconductor integrated circuit device, and a small-sized semiconductor integrated circuit device can be manufactured at a low cost.

Next, a modified operation performed in the semiconductor integrated circuit device in a case of the appropriate presetting of the parallel output signals AP4 to AP0 and AQ4 to AQ0 will be described below.

Figure 8:
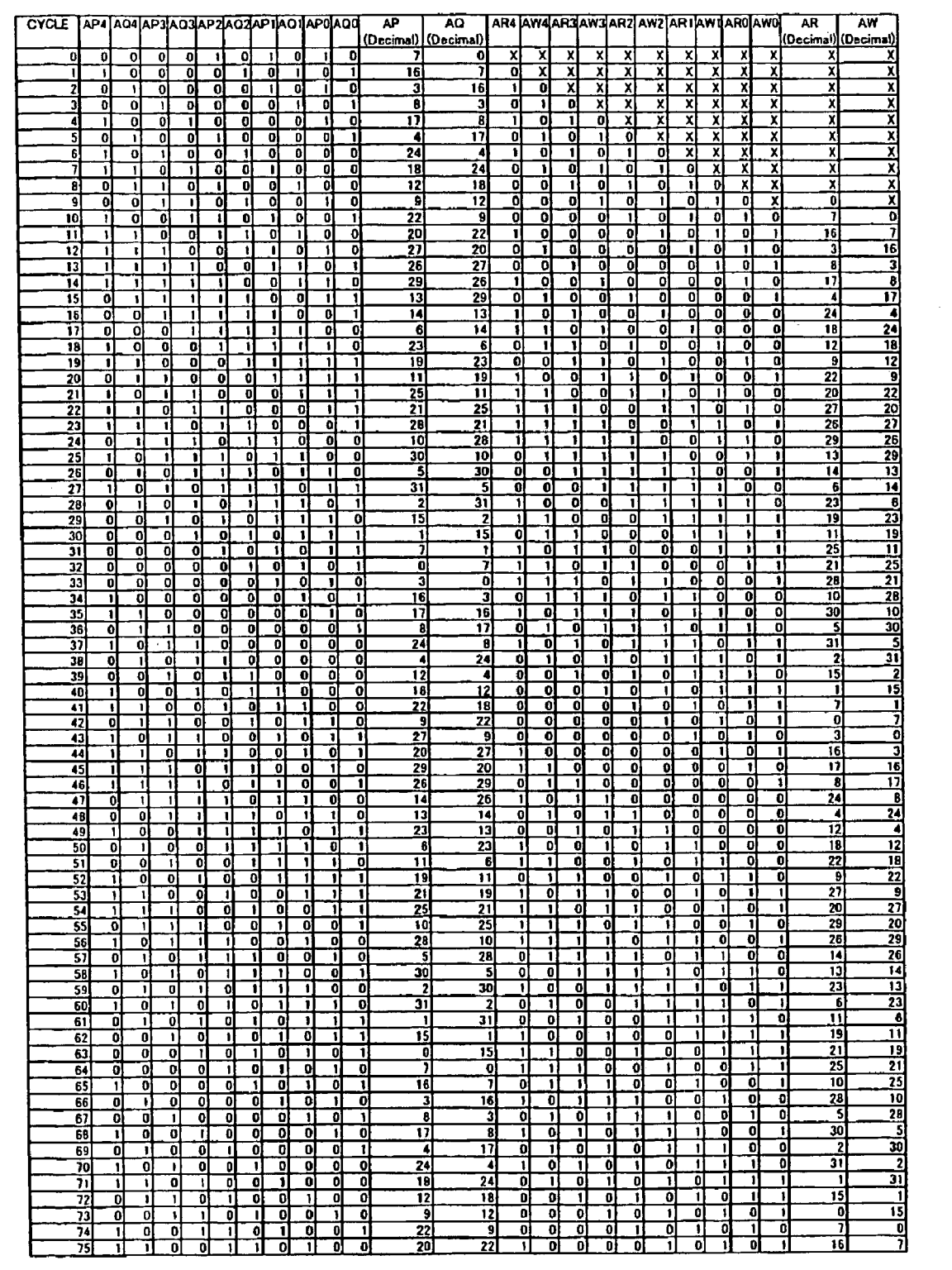

FIG. 8 shows a modified operation result obtained in the RAM test circuit 240 in a tabular form.

To obtain the operation result shown in FIG. 8, AP4=AP3=0, AP2=AP1=AP0=1 and AQ4=AQ3=AQ2=AQ1=AQ0=0 are preset in CYCLE=0.

In this case, referring to FIG. 24 in which the binary values of the parallel output signals A4 to A0 set in the test address generating unit 110 are shown on the assumption that the shift operation is performed every clock cycle, the preset binary values of the parallel output signals AQ4 to AQ0 in CYCLE=0 are the same as those of the parallel output signals A4 to A0 in CYCLE=0 shown in FIG. 24, and the preset binary values of the parallel output signals AP4 to AP0 in CYCLE=0 are the same as the binary values of the parallel output signals A4 to A0 in CYCLE=16 shown in FIG. 24. Therefore, the group of preset binary values of the parallel output signals AP4 to AP0 and the group of preset binary values of the parallel output signals AQ4 to AQ0 differ from each other by the change of binary values in sixteen clock cycles which is equal to half of the pseudo-random number generating cycle (thirty-two clock cycles) in the test address generating unit 250.

When the binary values of the parallel output signals AQ4 to AQ0 and the parallel output signals AP4 to AP0 are preset to AP4=AP3=0, AP2=AP1=AP0=1 and AQ4=AQ3=AQ2=AQ1=AQ0=0 in the test address generating unit 250 as is described above, a combined train of $2^5$ pseudo-random numbers {0, 7, 16, 3, 8, 17, 4, 24, 18, 12, 9, 22, 20, 27, 26, 29, 13, 14, 6, 23, 19, 11, 25, 21, 28, 10, 30, 5, 31, 2, 15, 1} is generated in a pseudo-random number generating cycle equal to $2^5$ clock cycles by alternately combining each of pseudo-random numbers {0, 16, 8, 4, 18, 9, 20, 26, 13, 6, 19, 25, 28, 30, 31, 15} of a first train composed of the decimal values A in clock cycles from CYCLE=0 to CYCLE=15 in the address determination shown in FIG. 24 and each of pseudo-random numbers {7, 3, 17, 24, 12, 22, 27, 29, 14, 23, 11, 21, 10, 5, 2, 1} of a second train composed of the decimal values A in clock cycles from CYCLE=16 to CYCLE=31 in the address determination shown in FIG. 24.

The combined train of $2^5$ pseudo-random numbers is expressed by both the group of the parallel output signals AQ4 to AQ0 and the group of the parallel output signals AP4 to AP0. Because the binary values of the parallel output signals AP4 to AP0 are set as the binary values of the parallel output signals AQ4 to AQ0 after one clock cycle, the combined train expressed by the group of the parallel output signals AQ4 to AQ0 is delayed by one clock cycle as compared with the combined train expressed by the group of the parallel output signals AP4 to AP0.

Thereafter, the serial output signal SO substantially expressing the combined train is output to the address shift register 140 every clock cycle. Therefore, the combined train is set in the address shift register 140 as the read addresses AR in thirty-two clock cycles from CYCLE=9 to CYCLE=40, and the combined train is set in the address shift register 140 as the write addresses WR in thirty-two clock cycles from CYCLE=10 to CYCLE=41.

Thereafter, the parallel read address signals AR4 to AR0 are input to the address terminals AB4 to AB0 of both the X read decoder 151a and the Y read decoder 152a of the two-port RAM 150 in successive thirty-two clock cycles, and the parallel write address signals AW4 to AW0 are input to the address terminals AC4 to AC0 of both the X write decoder 151b and the Y write decoder 152b of the two-port RAM 150 in successive thirty-two clock cycles.

As is described above, in the modification of the third embodiment, in a case where the parallel output signals AP4 to AP0 and the parallel output signals AQ4 to AQ0 are appropriately preset, the $2^5$ pseudo-random numbers ranging from "0" to "31" are generated in successive thirty-two clock cycles. Therefore, the write test for all the memory cells of the two-port RAM 150 can be performed in successive thirty-two clock cycles, and the read test for all the memory cells of the two-port RAM 150 can be performed in successive thirty-two clock cycles. Accordingly, the read test and the write test can be efficiently performed.

Embodiment 4

Figure 9:
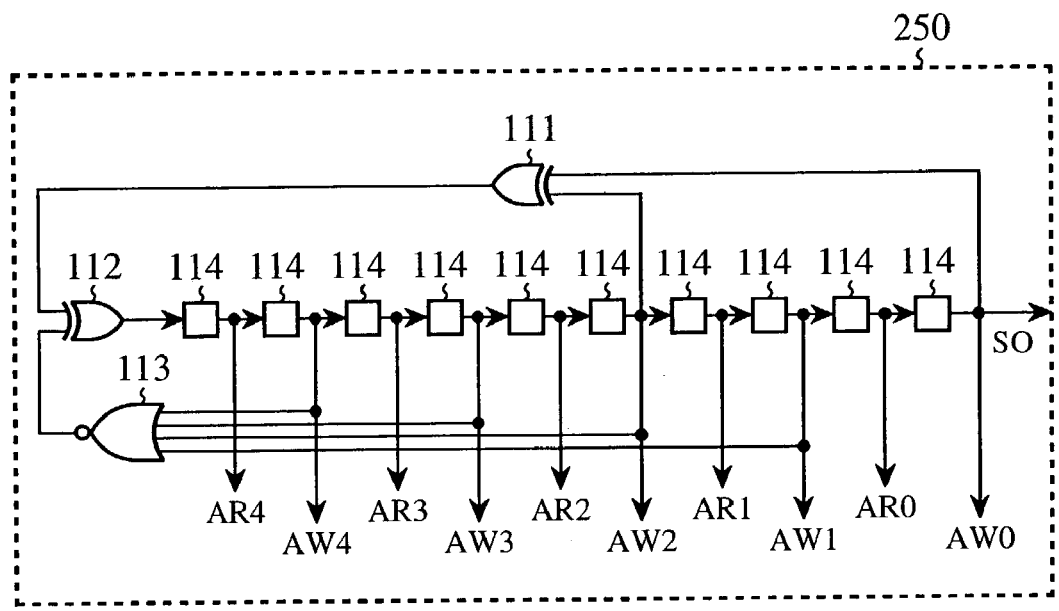
FIG. 9 is a circuit view of a semiconductor integrated circuit device according to a fourth embodiment of the present invention.
Figure 9:
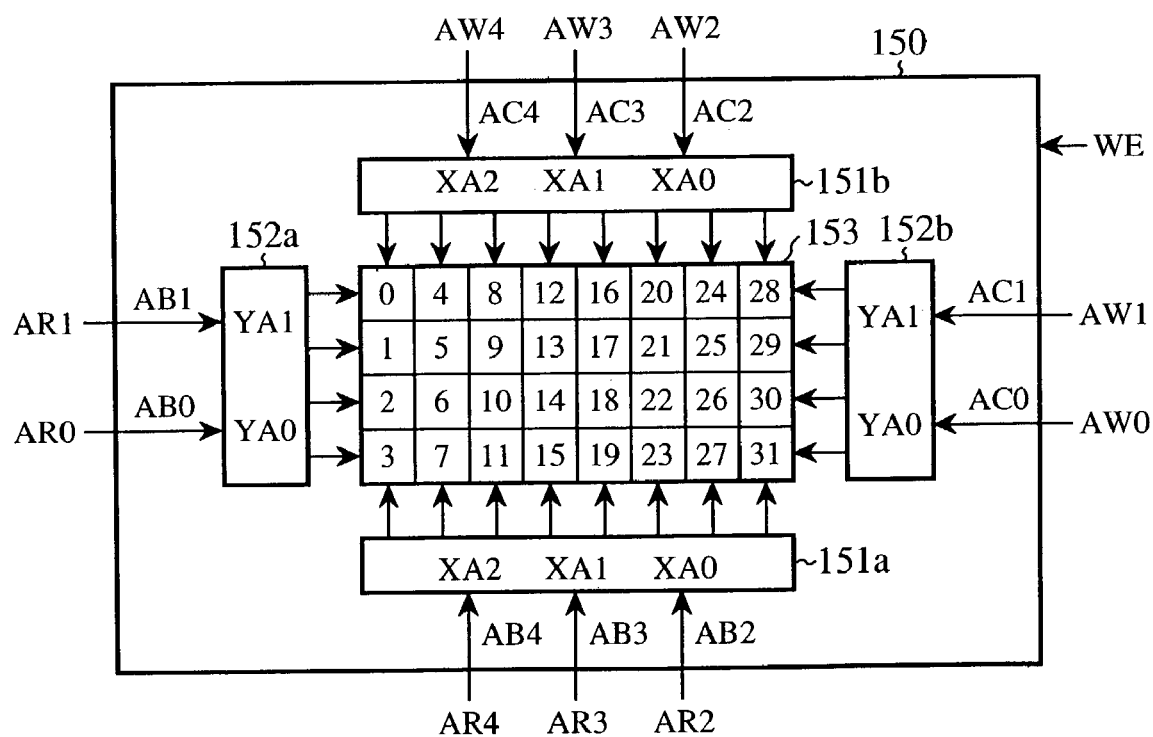

FIG. 9 is a circuit view of a semiconductor integrated circuit device according to a fourth embodiment of the present invention. The constituent elements, which are the same as those shown in FIG. 6, are indicated by the same reference numerals as those of the constituent elements shown in FIG. 6, and additional description of those constituent elements is omitted.

In FIG. 9, a semiconductor integrated circuit device comprises the test address generating unit 250 (or a serial shift register) denoting a RAM test circuit and the two-port RAM 150. In the test address generating unit 250, five parallel read address signals AR4, AR3, AR2, AR1 and AR0 set to a binary value "0" or "1" are output from the flip-flop circuits 114 of odd-numbered stages respectively every clock cycle, and five parallel write address signals AW4, AW3, AW2, AW1 and AW0 set to a binary value "0" or "1" are output from the flip-flop circuits 114 of even-numbered stages respectively every clock cycle.

In the same manner as the parallel read address signals AP4 to AP0 shown in FIG. 6, the binary values of the parallel read address signals AR4 to AR0 are set every clock cycle. Also, in the same manner as the parallel read address signals AQ4 to AQ0 shown in FIG. 6, the binary values of the parallel read address signals AW4 to AW0 are set every clock cycle. The change of the binary values of the parallel read address signals AR4 to AR0 is the same as that in the parallel read address signals AP4 to AP0 shown in FIG. 7 or FIG. 8, and the change of the binary values of the parallel read address signals AW4 to AW0 is the same as that in the parallel read address signals AQ4 to AQ0 shown in FIG. 7 or FIG. 8.

The parallel read address signals AR4 to AR0 output from the test address generating unit 250 are input to the address terminals AB4 to AB0 of the read port (both the X read decoder 151a and the Y read decoder 152a) of the two-port RAM 150, and the parallel write address signals AW4 to AW0 output from the test address generating unit 250 are input to the address terminals AC4 to AC0 of the write port (both the X write decoder 151b and the Y write decoder 152b) of the two-port RAM 150.

Here, in a case where the presetting of the parallel read address signals AR4 to AR0 in CYCLE=0 is the same as that of the parallel write address signals AW4 to AW0, the inputting of the parallel read address signals AR4 to AR0 to the two-port RAM 150 and the inputting of the parallel write address signals AW4 to AW0 to the two-port RAM 150 are alternately performed so as to perform each pair of the read test and the write test every two clocks. Also, in a case where the parallel read address signals AR4 to AR0 and AW4 to AW0 are appropriately preset in CYCLE=0 so as to differ the preset binary values of he parallel read address signals AR4 to AR0 from those of the parallel write address signals AW4 to AW0 by a change equivalent to sixteen clock cycles, the inputting of the parallel read address signals AR4 to AR0 to the two-port RAM 150 is continued during thirty-two clock cycles, and the inputting of the parallel read address signals AW4 to AW0 to the two-port RAM 150 is continued during thirty-two clock cycles.

Therefore, the test address generating unit 250 has both a pseudo-random number generating function and an address shift function.

As is described above, in the fourth embodiment, the test address generating unit 250 has the ten flip-flop circuits 114 of which the number is set to be equal to a sum of the number of bits of the read address AR input to the read port and the number of bits of the write address AW input to the write port of the two-port RAM 150, the parallel read address signals AR4 to AR0 and the parallel write address signals AW4 to AW0 are produced in the test address generating unit 250, and the parallel read address signals AR4 to AR0 and the parallel write address signals AW4 to AW0 are directly input to the two-port RAM 150.

In a case where the parallel read address signals AR4 to AR0 are preset in the same manner as the parallel write address signals AW4 to AW0, the $2^5$ first pseudo-random numbers indicated by the parallel read address signals AR4 to AR0 and the $2^5$ second pseudo-random numbers indicated by the parallel write address signals AW4 to AW0 in a range from "0" to "31" are generated in the test address generating unit 250 in the pseudo-random number generating cycle equal to $2^6$ clock cycles so as to maintain each pseudo-random number in two successive clock cycles, each first pseudo-random number generated in a current clock cycle is the same as the second pseudo-random number generated in a succeeding clock cycle later than the current clock cycle by one clock cycle, and both the inputting of the parallel read address signals AR4 to AR0 to the address terminals AB4 to AB0 of the read port (both the X read decoder 151a and the Y read decoder 152a) of the two-port RAM 150 and the inputting of the parallel write address signals AW4 to AW0 to the address terminals AC4 to AC0 of the write port (both the X write decoder 151b and the Y write decoder 152b) of the two-port RAM 150 are alternately performed.

Also, in a case where the parallel read address signals AR4 to AR0 and the parallel write address signals AW4 to AW0 are appropriately preset, the $2^5$ first pseudo-random numbers indicated by the parallel read address signals AR4 to AR0 are successively generated in a range from "0" to "31" in thirty-two clock cycles in the test address generating unit 250, the $2^5$ second pseudo-random numbers indicated by the parallel read address signals AW4 to AW0 are successively generated in a range from "0" to "31" in thirty-two clock cycles in the test address generating unit 250, the write test for all the memory cells of the two-port RAM 150 is successively performed in thirty-two clock cycles, and the read test for all the memory cells of the two-port RAM 150 is successively performed in thirty-two clock cycles.

Accordingly, in addition to the effects obtained in the third embodiment, a small-sized RAM test circuit can be manufactured as compared with in the third embodiment, and a small-sized semiconductor integrated circuit device can be manufactured at a low cost manufactured as compared with in the third embodiment.

Embodiment 5

Figure 10:
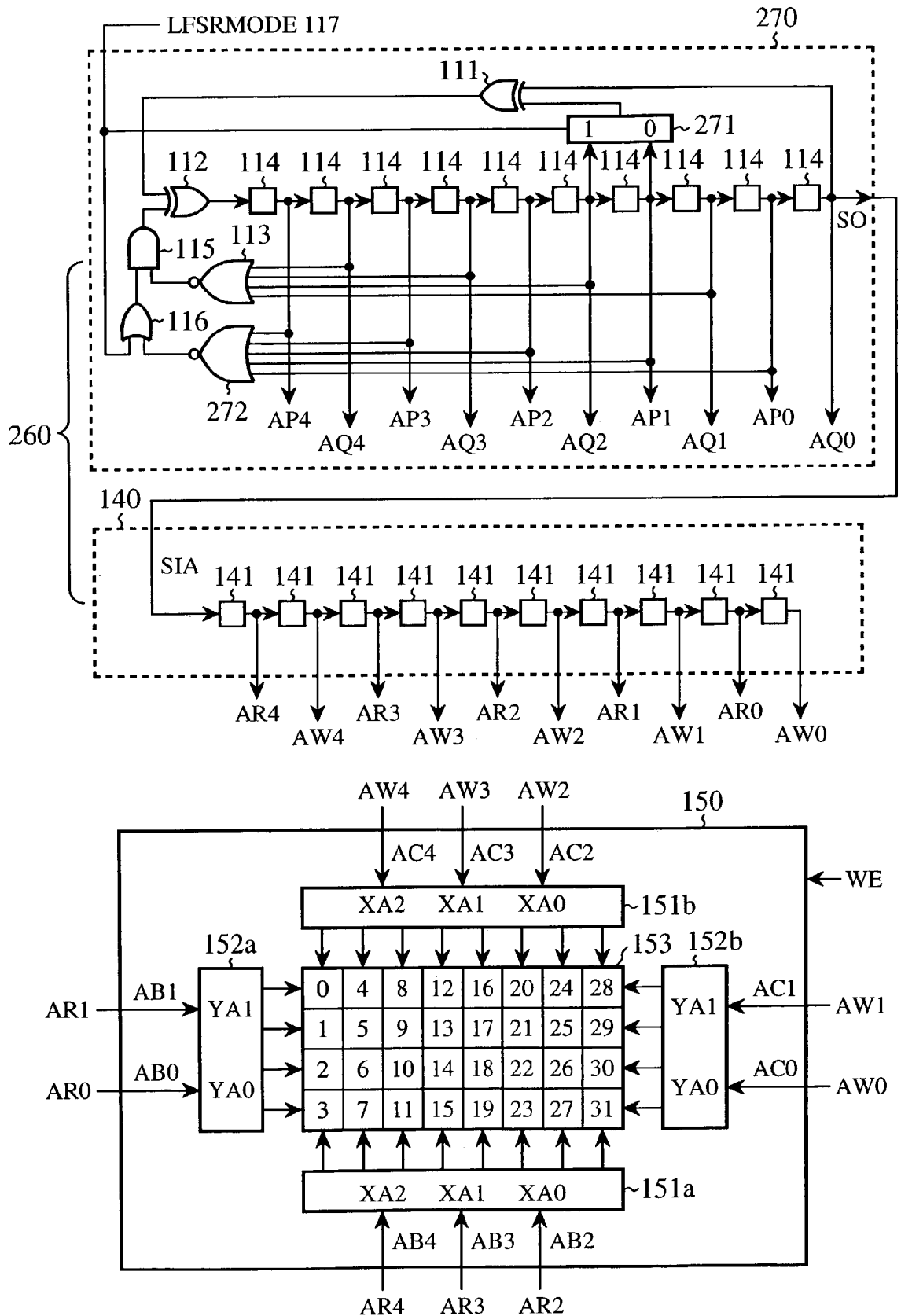
FIG. 10 is a circuit view of a semiconductor integrated circuit device according to a fifth embodiment of the present invention.

FIG. 10 is a circuit view of a semiconductor integrated circuit device according to a fifth embodiment of the present invention. The constituent elements, which are the same as those shown in FIG. 6, are indicated by the same reference numerals as those of the constituent elements shown in FIG. 6, and additional description of those constituent elements is omitted.

In FIG. 10, a semiconductor integrated circuit device comprises a RAM test circuit 260 and the two-port RAM 150. the RAM test circuit 260 comprises a test address generating unit 270 formed of an LFSR type pseudo-random number generating circuit and the address shift register 140.

The test address generating unit 270 comprises the ten flip-flop circuits 114 serially arranged, a selector 271 for selecting the parallel output signal AQ2 output from the flip-flop circuit 114 of the sixth stage or the parallel output signal AP1 output from the flip-flop circuit 114 of the seventh stage according to a linear feedback shift register (LFSR) mode signal 117, the EXOR circuit 111 for producing a signal according to the EXOR logic for both the parallel output signal AQ2 or AP1 selected in the selector 271 and the parallel output signal AQ0 output from the flip-flop circuit 114 of the tenth stage, the NOR circuit 113, an the NOR circuit 272 for producing a signal according to the NOR logic for the parallel output signals AP4 to AP0, an OR circuit 116 for producing a signal according to the OR logic for both the LFSR mode signal 117 and the signal output from the OR circuit 116, an AND circuit 115 for producing a signal according to the AND logic for both the signal output from the OR circuit 116 and the signal output from the NOR circuit 113, and the EXOR circuit 112 for producing a signal according to the EXOR logic for both the signal output from the EXOR circuit 111 and the signal output from the AND circuit 115 and outputting the produced signal to the flip-flop circuit 114 of the first stage.

Next, an operation of the semiconductor integrated circuit device will be described below.

In case of the LFSR mode signal 117 set to "1", the parallel output signal AQ2 selected in the selector 271 is input to the EXOR circuit 111, a signal set to "1" is output from the OR circuit 116, a binary value of a signal output from the AND circuit 115 is the same as that output from the NOR circuit 113, and the signal output from the NOR circuit 113 is substantially input to the EXOR circuit 112. Therefore, the test address generating unit 270 is operated in the same manner as the test address generating unit 250 of the third embodiment shown in FIG. 6. In a case where the parallel output signals AP4 to AP0 are preset in the same manner as the parallel output signals AQ4 to AQ0, the read address AR indicated by the parallel read address signals AR4 to AR0 is renewed every two clock cycles, the write address AW indicated by the parallel write address signals AW4 to AW0 is renewed every two clock cycles, and the read test for one memory cell of the two-port RAM 150 and the write test for one memory cell of the two-port RAM 150 are alternately performed.

Also, in a case where the parallel output signals AP4 to AP0 and the parallel output signals AQ4 to AQ0 are appropriately preset, the read address AR indicated by the parallel read address signals AR4 to AR0 is renewed every clock cycle, the write address AW indicated by the parallel write address signals AW4 to AW0 is renewed every clock cycle, and the read test for all the memory cells of the two-port RAM 150 are successively performed in thirty-two clock cycles, and the write test for all the memory cells of the two-port RAM 150 are successively performed in thirty-two clock cycles.

In contrast, in case of the LFSR mode signal 117 set to "0", the parallel output signal AP1 selected in the selector 271 is input to the EXOR circuit 111. In a case where the parallel output signals AP4 to AP0 and the parallel output signals AQ4 to AQ0 are set to "0" together, a signal set to "1" is output from each of the NOR circuits 113 and 272, a signal set to "1" is output from the OR circuit 116, and a signal set to "1" is output from the AND circuit 115 to the EXOR circuit 112. In a case where at least one of the parallel output signals AQ4 to AQ0 is set to "1", a signal set to "0" is output from the NOR circuit 113, and a signal set to "0" is output from the AND circuit 115 to the EXOR circuit 112. In a case where at least one of the parallel output signals AP4 to AP0 is set to "1", a signal set to "0" is output from the OR circuit 116, and a signal set to "0" is output from the AND circuit 115 to the EXOR circuit 112. Therefore, the test address generating unit 270 is operated in the same manner as the test address generating unit 230 of the second embodiment shown in FIG. 4. In this case, the test for all the combinations of the read addresses AR and the write addresses AW is performed for the two-port RAM 150 in 32×32 clock cycles.

As is described above, in the fifth embodiment, the test address generating unit 270 is operated in the same manner as the test address generating unit 250 of the third embodiment in response to the LFSR mode signal 117 set to "1" and the test address generating unit 270 is operated in the same manner as the test address generating unit 230 of the second embodiment in response to the LFSR mode signal 117 set to "0". Therefore, the effects obtained in the second and third embodiments can be obtained. Also, because various types of tests can be performed for the two-port RAM 150, the semiconductor integrated circuit device operated at high reliability can be manufactured.

In the fifth embodiment, the address shift register 140 is used. However, it is applicable that no address shift register be used. In this case, the parallel output signals AP4 to AP0 output from the test address generating unit 270 are directly input to the address terminals AB4 to AB0 of the read port (both the X read decoder 151a and the Y read decoder 152a) of the two-port RAM 150, and the parallel output signals AQ4 to AQ0 output from the test address generating unit 250 are directly input to the address terminals AC4 to AC0 of the write port (both the X write decoder 151b and the Y write decoder 152b) of the two-port RAM 150. Therefore, a small-sized semiconductor integrated circuit device can be obtained.

Embodiment 6

Figure 11:
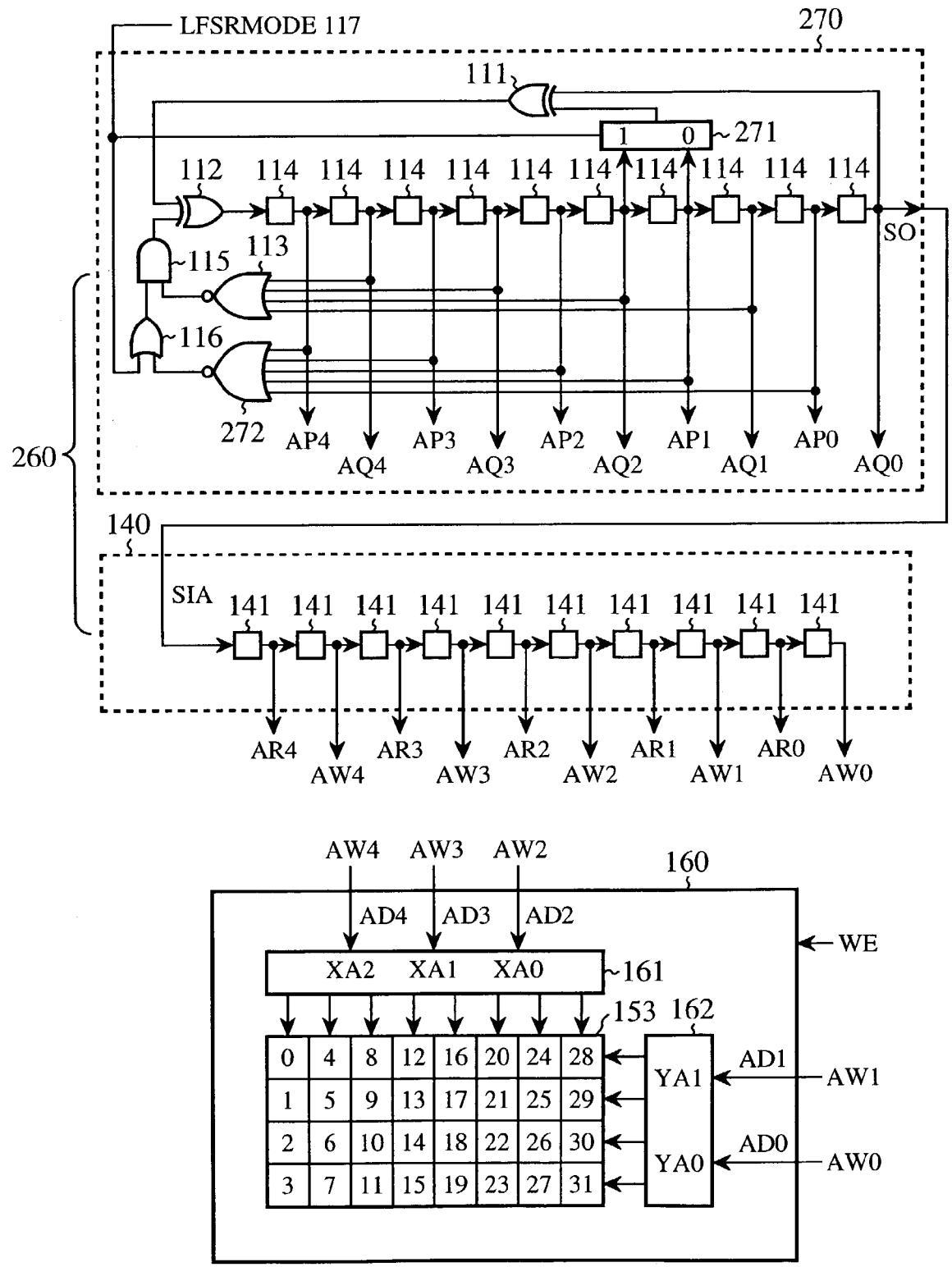
FIG. 11 is a circuit view of a semiconductor integrated circuit device according to a sixth embodiment of the present invention.

FIG. 11 is a circuit view of a semiconductor integrated circuit device according to a sixth embodiment of the present invention. The constituent elements, which are the same as those shown in FIG. 10, are indicated by the same reference numerals as those of the constituent elements shown in FIG. 10, and additional description of those constituent elements is omitted.

In FIG. 11, a semiconductor integrated circuit device comprises the RAM test circuit 260 and a single port RAM 160. The single port RAM 160 comprises an X decoder 161 having three address terminals AD4, AD3 and AD2 to which the parallel read address signals AR4 to AR2 or the parallel write address signals AW4 to AW2 are input, a Y decoder 162 having two address terminals AD1 and AD0 to which the parallel read address signals AR1 to AR0 or the parallel write address signals AW1 to AW0 are input, and the memory cell array 153.

The number of address terminals AD4 to AD0 of both the X decoder 161 and the Y decoder 162 of the single port RAM 160 is equal to both the number of flip-flop circuits 114 of the odd-numbered stages relating to the parallel output signals AP4 to AP0 and the number of flip-flop circuits 114 of the even-numbered stages relating to the parallel output signals AQ4 to AQ0.

In case of the read test, the parallel read address signals AR4 to AR0 output from the address shift register 140 are input to the address terminals AD4 to AD0 of both the X decoder 161 and the Y decoder 162. Also, in case of the write test, the parallel write address signals AW4 to AW0 output from the address shift register 140 are input to the address terminals AD4 to AD0 of both the X decoder 161 and the Y decoder 162.

The selection of the parallel read address signals AR4 to AR0 in case of the read test and the selection of the parallel write address signals AW4 to AW0 in case of the write test are, for example, performed in a selector switch (not shown) arranged between the address shift register 140 and the single port RAM 160.

The RAM test circuit 260 is operated in the same manner as in the fifth embodiment. Therefore, in case of the LFSR mode signal 117 set to "0", the read address AR and the write address AW are set every clock cycle in the same manner as those shown in FIG. 5, the read test and the write test are performed every clock cycle in the pseudo-random number generating cycle equal to 1024 clock cycles, and the read test and the write test are performed for all combinations of the read addresses AR and the write addresses AW.

Also, in case of the LFSR mode signal 117 set to "1", when the parallel output signals AP4 to AP0 are preset to the same binary values of the parallel output signals AQ4 to AQ0 in CYCLE=0, $2^5$ (the numeral "5" denotes the number of flip-flop circuits 114 of the odd-numbered stages relating to the parallel output signals AP4 to AP0) first pseudo-random numbers indicated by the parallel output signals AP4 to AP0 and $2^5$ (the numeral "5" denotes the number of flip-flop circuits 114 of the even-numbered stages relating to the parallel output signals AQ4 to AQ0) second pseudo-random numbers indicated by the parallel output signals AQ4 to AQ0 are generated in a range from "0" to "31" in the test address generating unit 270 in the pseudo-random number generating cycle equal to $2^6$ clock cycles so as to maintain each pseudo-random number in two successive clock cycles, the read address AR and the write address AW are set every clock cycle in the same manner as those shown in FIG. 7, the read test and the write test are alternately performed, the read test and the write test are performed for all the memory cells of the single port RAM 160 in the pseudo-random number generating cycle equal to 64 clock cycles in the random address order. For example, the read test is performed for the read address AR=0 in CYCLE=10, and the write test is performed for the write address AW=0 in CYCLE=11. This RAM test can be applied to a part of the march test performed according to a typical test algorithm of RAM.

Also, when the parallel output signals AP4 to AP0 and the parallel output signals AQ4 to AQ0 are appropriately preset in CYCLE=0, the read test is successively performed for all the memory cells of the single port RAM 160 in one pseudo-random number generating cycle equal to thirty-two clock cycles, and the write test is successively performed for all the memory cells of the single port RAM 160 in another pseudo-random number generating cycle equal to thirty-two clock cycles.

As is described above, in the sixth embodiment, the test address generating unit 270 has the flip-flop circuits 114 of which the number is twice of the number of address terminals AD4 to AD0 of both the X decoder 161 and the Y decoder 162 of the two-port RAM 160. In a case where the LFSR mode signal 117 is set to "1" while presetting the parallel output signals AP4 to AP0 to the same binary values of the parallel output signals AQ4 to AQ0 in CYCLE=0, the $2^5$ first pseudo-random numbers and the $2^5$ second pseudo-random numbers ranging from "0" to "31" are generated in the test address generating unit 270 in the pseudo-random number generating cycle equal to $2^6$ clock cycles, the group of parallel read address signals AR4 to AR0 and the group of parallel write address signals AW4 to AW0 are alternately input to the address terminals AD4 to AD0 of the single port RAM 160, and the read test and the write test are performed for all the memory cells of the single port RAM 160 in the pseudo-random number generating cycle equal to sixty-four clock cycles while alternately performing the read test and the write test.

In a case where the LFSR mode signal 117 is set to "1" while appropriately presetting the parallel output signals AP4 to AP0 and the parallel output signals AQ4 to AQ0 in CYCLE=0, the group of parallel read address signals AR4 to AR0 are successively input to the address terminals AD4 to AD0 of the single port RAM 160 to perform the read test for all the memory cells of the single port RAM 160 in one pseudo-random number generating cycle equal to thirty-two clock cycles, and the group of parallel write address signals AW4 to AW0 are successively input to the address terminals AD4 to AD0 of the single port RAM 160 to perform the write test for all the memory cells of the single port RAM 160 in another pseudo-random number generating cycle equal to thirty-two clock cycles.

In a case where the LFSR mode signal 117 is set to "0", the group of parallel read address signals AR4 to AR0 and the group of parallel write address signals AW4 to AW0 are alternately input to the address terminals AD4 to AD0 of the single port RAM 160, and the read test and the write test are performed for all combinations of the read addresses AR and the write addresses AW. Accordingly, even though the single port RAM 160 is used in place of the two-port RAM 150, because various types of tests can be performed for the single port RAM 160, the semiconductor integrated circuit device operated at high reliability can be manufactured.

Embodiment 7

Figure 12:
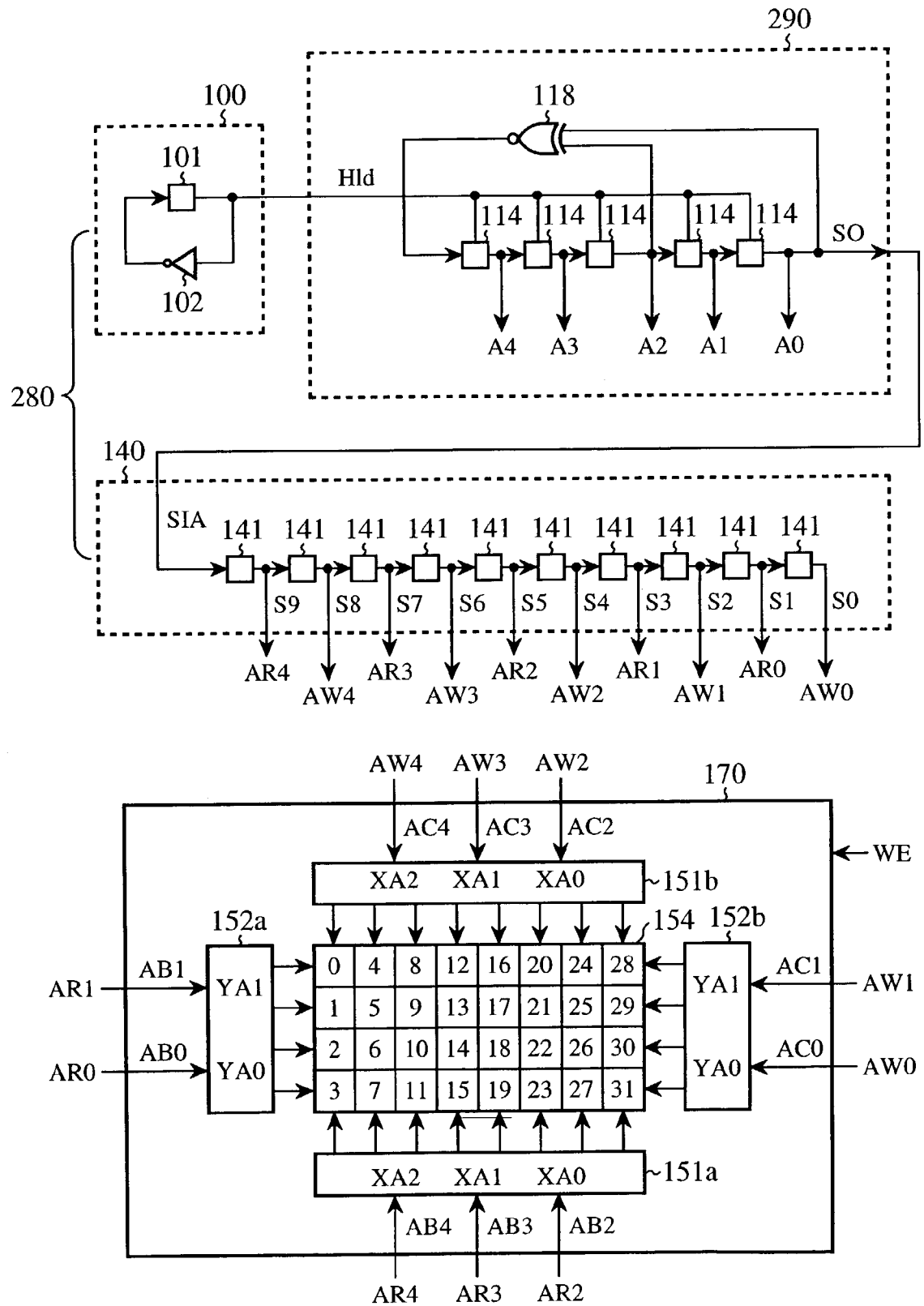
FIG. 12 is a circuit view of a semiconductor integrated circuit device according to a seventh embodiment of the present invention.

FIG. 12 is a circuit view of a semiconductor integrated circuit device according to a seventh embodiment of the present invention. The constituent elements, which are the same as those shown in FIG. 1, are indicated by the same reference numerals as those of the constituent elements shown in FIG. 1, and additional description of those constituent elements is omitted.

In FIG. 12, a semiconductor integrated circuit device comprises a RAM test circuit 280 and a two-port RAM 170. The two-port RAM 170 comprises the X read decoder 151a, the X write decoder 151b, the Y read 152a, the Y write decoder 152b and a memory cell array 154 having twenty-eight memory cells to which twenty-eight address numbers from "0" to "37" are allocated respectively. The twenty-eight memory cells correspond to twenty-eight words. The memory cell array 154 has a width of four memory cells in the Y direction and has a width of seven memory cells in the X direction. The number of memory cells in the two-port RAM 170 represents a value lower than $2^5$ and higher than $2^4$.

The RAM test circuit 280 comprises the address hold control unit 100, a test address generating unit 290 and the address shift register 140. The test address generating unit 290 comprises the five flip-flop circuits 114 serially arranged, and an EXNOR circuit 118 for producing a signal set to a binary value "0" or "1" according to an EXNOR logic for the parallel output signals A2 and A0 output from the flip-flop circuits 114 of the third and fifth stages. The test address generating unit 290 is formed of a simplified LFSR type pseudo-random number generating circuit to generate $2^5-1$ (=31) pseudo-random numbers ranging from "0" to "30" in a pseudo-random number generating cycle equal to $2^6-2$ (=62) clock cycles by generating one pseudo-random number every two clock cycles. In other words, the state A4=A3=A2=A1=A0=1 is not generated in the test address generating unit 290.

In a case where the number of memory cells of a RAM is lower than $2^N$ and is higher than $2^{N-1}$ (N denotes the number of flip-flop circuits 114 of a test address generating unit), the test address generating unit 290 having the simplified configuration is used in place of the test address generating unit 110.

Next, an operation of the semiconductor integrated circuit device will be described below.

FIG. 13 shows an operation result obtained in the RAM test circuit 280 in a tabular form.

The hold signal Hld alternately set to the binary values "1" and "0" on a clock cycle is output from the address hold control unit 100 to the test address generating unit 290, and the binary values of the parallel output signals A4, A3, A2, A1 and A0 are renewed in the test address generating unit 290 every two clock cycles in the same manner as in the first embodiment. In detail, as shown in FIG. 13, A4=A3=A2=A1=A0=0 and AR4=Aw4=AR3= AW3=AR2=AW2=AR1=AW1=AR0=AW0=X (X denotes an undefined binary value) are preset in CYCLE=0. In this case, a binary value "1" is output from the EXNOR circuit 118 in response to A2=0 and A0=0. In CYCLE=1, the binary value "1" output from the EXNOR circuit 118 is held in the flip-flop circuit 114 of the first stage, and the binary values A4 to A0 are held in the flip-flop circuits 114 of the second to fifth stages respectively. Therefore, A4=A3=A2=A1=A0=0 is maintained. In CYCLE=2, the binary value held in each flip-flop circuit 114 is output. Therefore, A4=1 and A3=A2=A1=A0=0 are set. Also, a binary value "1" is output from the EXNOR circuit 118 in response to A2=0 and A0=0. Thereafter, the test address generating operation are performed in CYCLE=3, CYCLE=4, CYCLE=5, CYCLE=6 and CYCLE=7 in the same manner as CYCLE=2. Therefore, in CYCLE=7, A4=A3=A2=1 and A1=A0=0 are set, and a binary value "0" output from the EXNOR circuit 118 in response to A2=1 and A0=0 is held in the flip-flop circuit 114 of the first stage. In CYCLE=8, the binary value held in each flip-flop circuit 114 is output, and A4=0, A3=A2=A1=1 and A0=0 are set. In CYCLE=9, A4=0, A3=A2= A1=1 and A0=0 are maintained, and a binary value "0" output from the EXNOR circuit 118 is held in the flip-flop circuit 114 of the first stage. In CYCLE=10, the binary value held in each flip-flop circuit 114 is output, and A4=A3=0 and A2=A1=A0=1 are set. Thereafter, the shift operation of each flip-flop circuit 114 is performed every two clock cycles in the same manner.

Also, to set an assumed state A4=A3=A2=A1=A0= 1 corresponding to the pseudo-random number of an assumed value "32", it is required that a preceding state A4=A3= A2=A1 and A0=0 is changed to the assumed state. In the actual change of the preceding state, a binary value "0" is necessarily output from the EXNOR circuit 118 in response to A2=1 and A0=0, and A4=0 is necessarily set after two clock cycles. Therefore, the assumed state A4=A3=A2=A1=A0=1 is not actually set in the test address generating unit 290.

In the address shift register 140, an address shift operation is performed in each flip-flop circuit 141 of the address shift register 140 every clock cycle. Therefore, the serial output signal SO output from the test address generating unit 290 is input to the flip-flop circuit 141 of the first stage as the serial input address signal SIA every clock cycle, and the serial input address signal SIA is output from the flip-flop circuit 141 of the first stage every clock cycle as the parallel read address signal AR4. Also, one parallel read address signal input to each flip-flop circuit 141 is output from the flip-flop circuit 141 every clock cycle.

In detail, in each of clock cycles from CYCLE=1 to CYCLE= 10, the binary value "0" of the serial input address signal SIA is set as that of the parallel read address signal AR4 to set AR4=0. Therefore, AR4=AR3=AR2= AR1=AR0=0 (AR=0) is set in CYCLE=9, and AW4=AW3= AW2=AW1=AW0=0 (AW=0) is set in CYCLE=10. In CYCLE=11 and CYCLE=12, the binary value "1" of the serial input address signal SIA is set as that of the parallel read address signal AR4. Therefore, AR4=1 and AR3=AR2= AR1=AR0=0 (AR=16) are set in CYCLE=11, and AW4= 1 and AW3=AW2=AW1=AW0=0 (AW=16) are set in CYCLE=12. Thereafter, the shift operation is repeatedly performed in each flip-flop circuit 141 of the address shift register 140 every clock cycle, AR4=AR3=AR2=AR1=0 and AR0=1 (AR=1) are set in CYCLE=69, and AW4=AW3=AW2=AW1=0 and AW0=1 (AW=1) are set in CYCLE=70.

As a result, as shown in FIG. 13, the binary values of the parallel read address signals AR4 to AR0 set in a current clock cycle are equal to those of the parallel output signals A4 to A0 set in a preceding clock cycle earlier than the current clock cycle by nine clock cycles, and the binary values of the parallel write address signals AW4 to AW0 set in a current clock cycle are equal to those of the parallel output signals A4 to A0 set in a preceding clock cycle earlier than the current clock cycle by ten clock cycles. Therefore, a read operation test for the read address AR=0 is performed in CYCLE=9, and a write operation test for the write address AW=0 is performed in CYCLE=10. The read operation test and the write operation test are alternately performed in sixty-two clock cycles from CYCLE=9 to CYCLE=70 to perform the read test and the write test for all the memory cells of the two-port RAM 170 in the random order. In this case, the pseudo-random numbers, of which the number is equal to $2^5-1$ (the numeral "5" denotes the number of flip-flop circuits 114) in a range from "0" to "30", are generated in the test address generating unit 290 in a pseudo-random number generating cycle equal to a time period from CYCLE=0 to CYCLE=61.

Here, because the pseudo-random numbers range from "0" to "30", the read addresses AR range from "0" to "30", and the write addresses AW range from "0" to "30". In this case, because none of memory cells of address numbers "28", "29" and "30" indicated by the read address AR and the write address AW exist in the two-port RAM 170, the read test and the write test for the read addresses AR=28, AR= 29 and AR=30 and the write addresses AW=28, AW=29 and AW=30 are skipped by setting clock cycles for those read addresses and write addresses as dummy clock cycles.

This operation test can be applied to a part of the march test performed according to a typical test algorithm of RAM.

As is described above, in the seventh embodiment, in a case where the number of memory cells of the two-port RAM 170 arranged in the semiconductor integrated circuit device is lower than $2_N$ (the numeral "N" denotes the number of bits of the parallel read address signals AR4 to AR0 or the number of bits of the parallel write address signals AQ4 to AQ0 input to the address terminals AB4 to AB0 or AC4 to AC0) and is higher than $2^{N-1}$, is, the test address generating unit 290 having the simplified configuration is used to generate the pseudo-random numbers, of which the number is lower than $2^N$ by unity, in the pseudo-random number generating cycle. Therefore, as compared with the configuration in the first embodiment, the configuration of the semiconductor integrated circuit device can be simplified, and a small-sized semiconductor integrated circuit can be manufactured.

Embodiment 8

Figure 14:
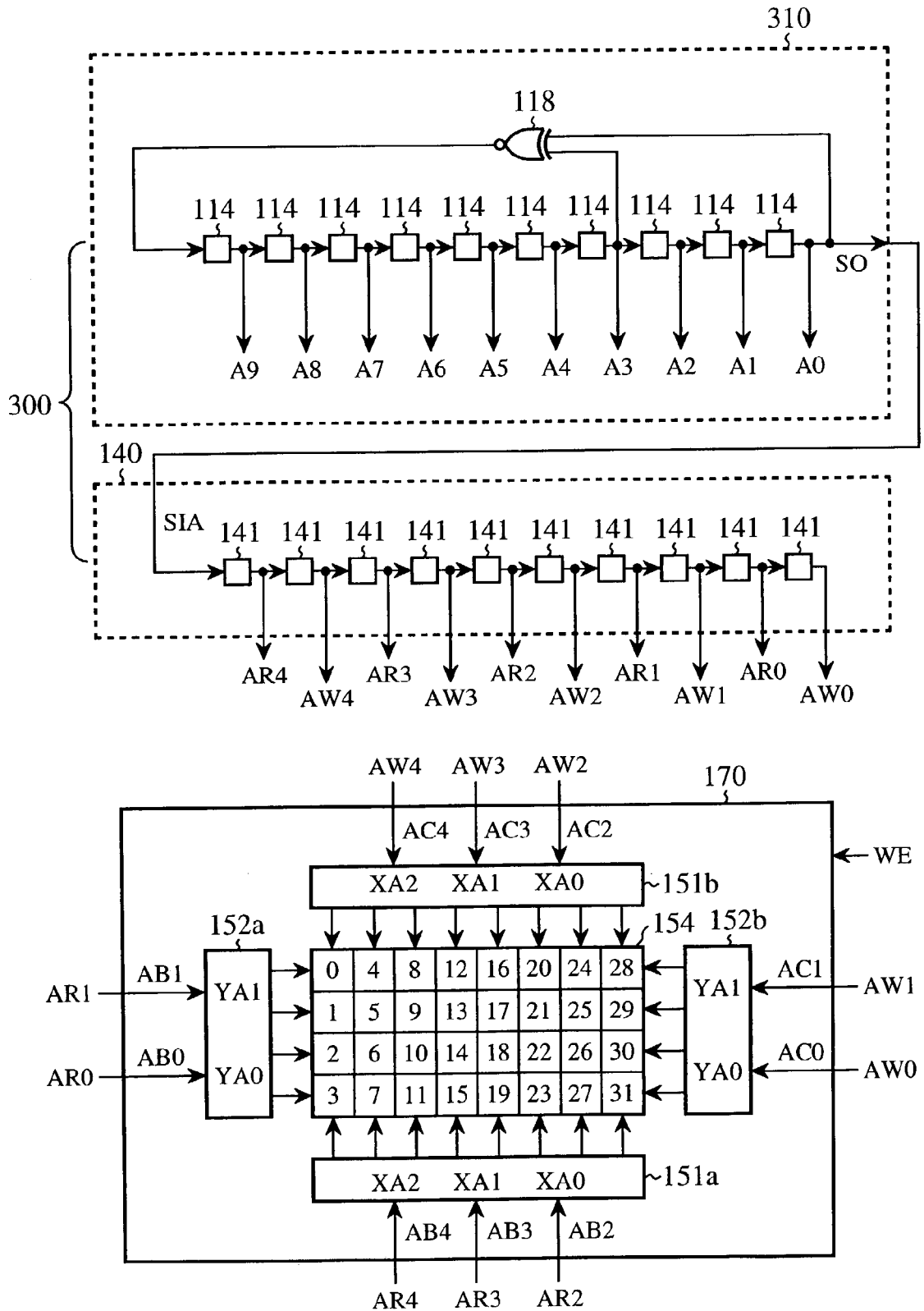
FIG. 14 is a circuit view of a semiconductor integrated circuit device according to an eighth embodiment of the present invention.

FIG. 14 is a circuit view of a semiconductor integrated circuit device according to an eighth embodiment of the present invention. The constituent elements, which are the same as those shown in FIG. 12, are indicated by the same reference numerals as those of the constituent elements shown in FIG. 12, and additional description of those constituent elements is omitted.

In FIG. 14, a semiconductor integrated circuit device comprises a RAM test circuit 300 and the two-port RAM 170. The RAM test circuit 300 comprises a test address generating unit 310 and the address shift register 140. The test address generating unit 310 comprises the ten serially-arranged flip-flop circuits 114 and the EXNOR circuit 118 for producing a signal according to the EXNOR logic for the parallel output signals A3 and A0 output from the flip-flop circuits 114 of the seventh and tenth stages. The test address generating unit 310 is formed of a simplified LFSR type pseudo-random number generating circuit to generate $2^{10}-1$ (=1023) pseudo-random numbers ranging from "0" to "1022" in a pseudo-random number generating cycle equal to $2^{10}-1$ clock cycles by generating one pseudo-random number every clock cycle. In other words, the state A9=A8=A7=A6=A5=A4=A3=A2=A1=A0= 1 is not generated in the test address generating unit 310.

Next, an operation of the semiconductor integrated circuit device will be described below.

Figure 15:
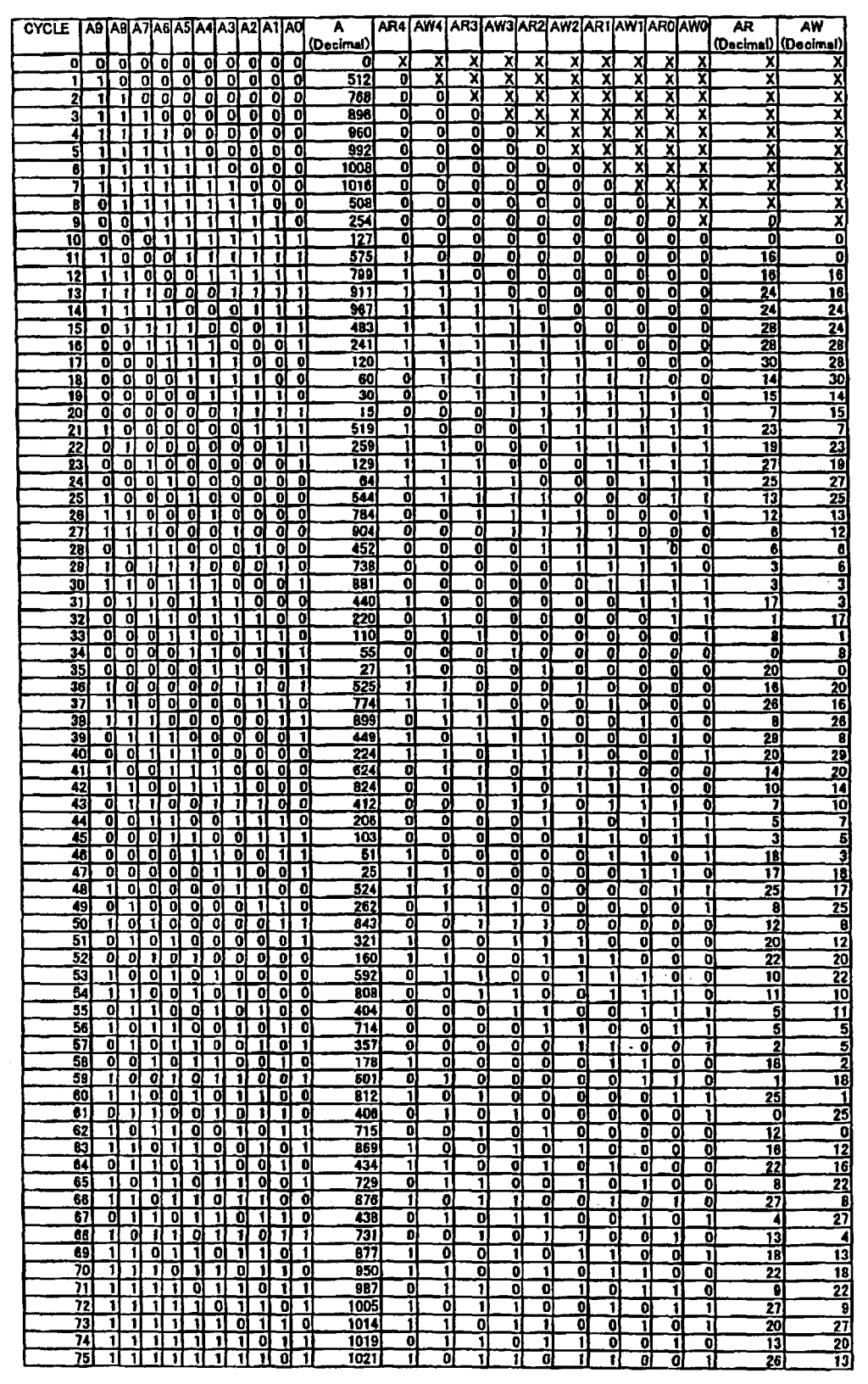

FIG. 15 shows an operation result obtained in the RAM test circuit 310 in a tabular form.

In the test address generating unit 310, the binary values of the parallel output signals A9 to A0 output from the flip-flop circuits 114 are renewed every clock cycle in the same manner as in the second embodiment. In detail, as shown in FIG. 13, A9=A8=A7=A6=A5=A4=A3= A2=A1=A0=0 and AR4=Aw4=AR3=AW3=AR2=AW2= AR1=AW1=AR0=AW0=X (X denotes an undefined binary value) are preset in CYCLE=0. Therefore, a binary value "1" is output from the EXNOR circuit 118 in response to A3=0 and A0=0. In CYCLE=1, the shift operation is performed in each flip-flop circuit 114. Therefore, A9= 1 and A8=A7=A6=A5=A4=A3=A2=A1=A0=0 are set. In the same manner, in the clock cycles from CLOCK= 2 to CLOCK 7, a binary value "1" is output from the EXNOR circuit 118, and the shift operation is performed in each flip-flop circuit 114. Therefore, A9=A8=A7=A6=A5= A4=A3=1 and A2=A1=A0=0 are set in CYCLE=7. In CYCLE=8, a binary value "0" is output from the EXNOR circuit 118 in response to A3=1 and A0=0, and the shift operation is performed in each flip-flop circuit 114. Therefore, A9=0, A8=A7=A6=A5=A4=A3=A2=1 and A1=A0=0 are set in CYCLE=8. The shift operation of the test address generating unit 310 is repeatedly performed.

Also, to set an assumed state A9=A8=A7=A6=A5= A4=A3=A2=A1=A0=1 corresponding to the pseudo-random number of an assumed value "1024", it is required that a preceding state A9=A8=A7=A6=A5=A4=A3=A2= A1 and A0=0 is changed to the assumed state. In the actual change of the preceding state, a binary value "0" is necessarily output from the EXNOR circuit 118 in response to A3=1 and A0=0, and A9=0 is necessarily set after one clock cycle. Therefore, the assumed state A9=A8= A7=A6=A5=A4=A3=A2=A1=A0=1 is not actually set in the test address generating unit 310.

In the address shift register 140, the serial output signal SO output from the test address generating unit 310 is input to the flip-flop circuit 141 of the first stage as the serial input address signal SIA every clock cycle, and an address shift operation is performed in each flip-flop circuit 141 every clock cycle. In detail, in each of clock cycles from CYCLE=1 to CYCLE=10, the binary value "0" of the serial input address signal SIA is set as that of the parallel read address signal AR4 to set AR4=0. Therefore, AR4=AR3=AR2=AR1=AR0=0 (AR=0) is set in CYCLE=9, and AW4=AW3=AW2=AW1=AW0=0 (AW=0) is set in CYCLE=10. In CYCLE=11 to CYCLE=17, the binary value "1" of the serial input address signal SIA is set as that of the parallel read address signal AR4. Therefore, AR4=AR3=AR2=AR1=1 and AR0=0 (AR=30) are set in CYCLE=17, and AW4=AW3=AW2=1 and AW1= AW0=0 (AW=28) are set in CYCLE=16. The address shift operation of the address shift register 140 is repeatedly performed in the same manner.

Here, because each pseudo-random number indicated by the string of binary values of the parallel output signals A9 to A0 in a current clock cycle is indicated by the string of binary values of the parallel address signals AR4, AW4, AR3, AW3, AR2, AW2, AR1, AW1, AR0 and AW1 in a succeeding clock cycle later than the current clock cycle by ten clock cycles, a first pseudo-random number indicated by the string of binary values of the parallel output signals A9, A7, A5, A3 and A1 in the current clock cycle is indicated by the string of binary values of the parallel read address signals AR4 to AR0 in the succeeding clock cycle, and a second pseudo-random number indicated by the string of binary values of the parallel output signals A8, A6, A4, A2 and A0 is indicated by the string of binary values of the parallel write address signals AW4 to AW0 in the current clock cycle in the succeeding clock cycle. Each of the read address AR set to the first pseudo-random number and the write address AW set to the second pseudo-random number ranges from "0" to "31".

Therefore, both the read test and the write test for all the memory cells of the two-port RAM 170 is started in CYCLE= 10. For example, a read operation test for the read address AR=0 and a write operation test for the write address AW=0 are simultaneously performed in CYCLE=10.

Here, because each of the pseudo-random numbers generated in the test address generating unit 310 in the pseudo-random number generating cycle differs from the other pseudo-random numbers, a combination of the read address AR and the write address AR obtained in each clock cycle differs from the other combinations obtained in the other clock cycles in the pseudo-random number generating cycle. Therefore, $2^{10}-1$ (=1023) combinations of the read addresses AR and the write addresses AR other than a non-actual combination of the read address AR=31 and the write address AW=31 are obtained in the pseudo-random number generating cycle equal to $2^{10}-1$ clock cycles.

Therefore, all combinations of the read addresses AR and the write addresses AW except the non-actual combination of the read address AR=31 and the write address AW=31 are produced in the address shift register 140. The parallel read address signals AR4 to AR0 and the parallel write address signals AW4 to AW0 set to each combination are input to the two-port RAM 170, and the read test and the write test for all the memory cells of the two-port RAM 170 are performed in the pseudo-random number generating cycle equal to $2^{10}-1$ clock cycles.

In this case, because none of memory cells of address numbers "28", "29", "30" and "31" indicated by the read address AR and the write address AW exist in the two-port RAM 170, the read test and the write test corresponding to the combinations including the read address AR=28, AR=29, AR=30 or AR=31 or the write address AW=28, AW=29, AW=30 or AW=31 are skipped by setting clock cycles for those read addresses and write addresses as dummy clock cycles.

In FIG. 15, the clock cycles from CYCLE=10 to CYCLE=75 for the combinations of the read addresses AR and the write addresses AW are shown. However, the combination of the read test and write test is performed in the clock cycles from CYCLE=10 to CYCLE=1032.

As is described above, in the eighth embodiment, in a case where the number of memory cells of the two-port RAM 170 arranged in the semiconductor integrated circuit device is lower than $2^N$ (the numeral N denotes the number of bits of the parallel read address signals AR4 to AR0 or the number of bits of the parallel write address signals AQ4 to AQ0 input to the address terminals AB4 to AB0 or AC4 to AC0) and is higher than $2^{N-1}$, the test address generating unit 310 having the simplified configuration is used to generate the $2^{10}-1$ pseudo-random numbers in the pseudo-random number generating cycle to simultaneously perform the read test and the write test for each pair of memory cells of the two-port RAM 170 and to perform the read test and the write test for all combinations of the read addresses AR and the write addresses AW. Therefore, as compared with the configuration in the second embodiment, the configuration of the semiconductor integrated circuit device can be simplified, and a small-sized semiconductor integrated circuit can be manufactured.

Embodiment 9

Figure 16:
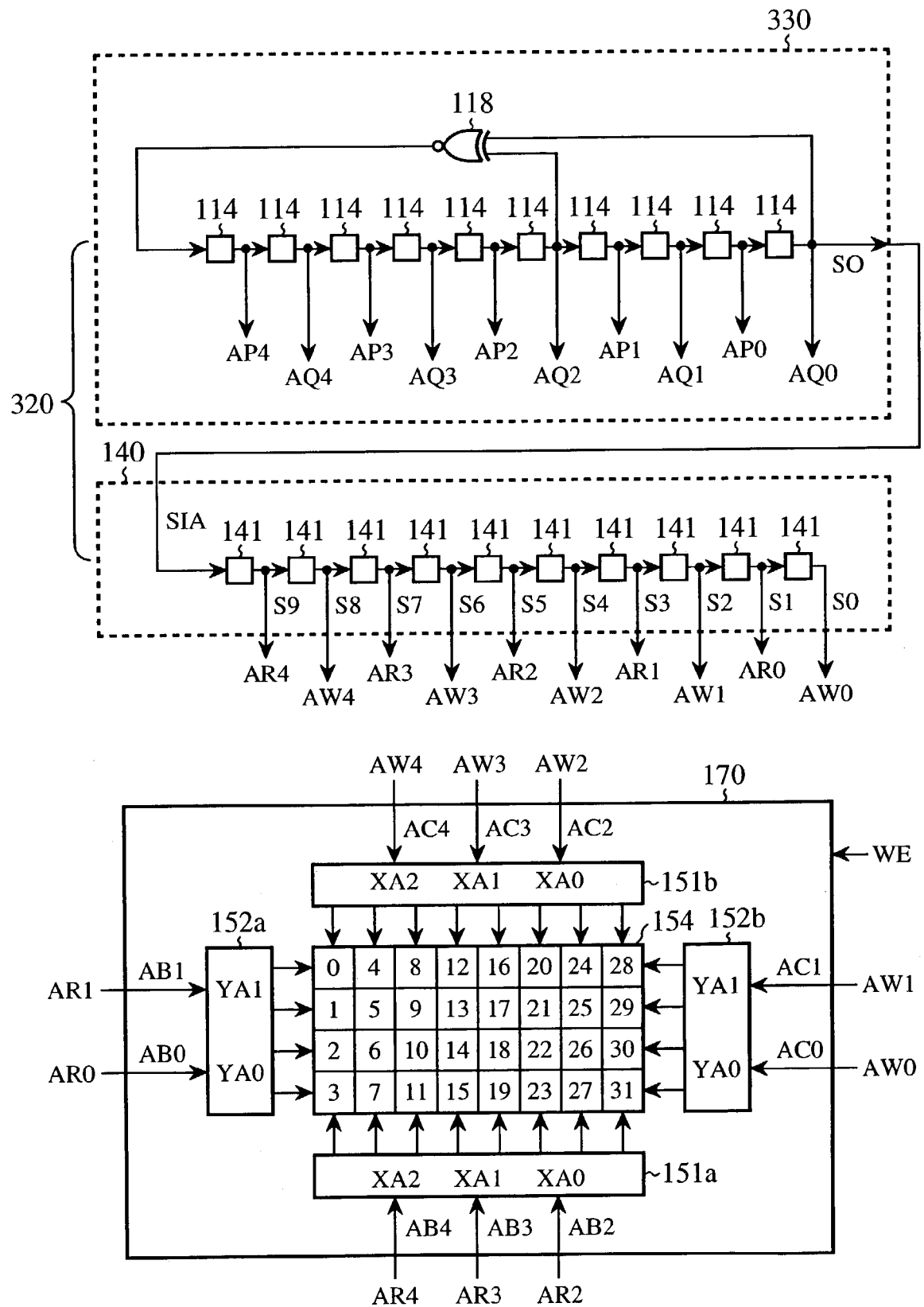
FIG. 16 is a circuit view of a semiconductor integrated circuit device according to a ninth embodiment of the present invention.

FIG. 16 is a circuit view of a semiconductor integrated circuit device according to a ninth embodiment of the present invention. The constituent elements, which are the same as those shown in FIG. 12, are indicated by the same reference numerals as those of the constituent elements shown in FIG. 12, and additional description of those constituent elements is omitted.

In FIG. 16, a semiconductor integrated circuit device comprises a RAM test circuit 320 and the two-port RAM 170. The RAM test circuit 320 comprises a test address generating unit 330 and the address shift register 140. The test address generating unit 330 comprises the ten serially-arranged flip-flop circuits 114 and the EXNOR circuit 118 for producing a signal according to the EXNOR logic for the parallel output signals AQ2 and AQ0 output from the flip-flop circuits 114 of the sixth and tenth stages. The test address generating unit 330 is formed of a simplified LFSR type pseudo-random number generating circuit to generate $2^5-1$ (=31) first pseudo-random numbers AP ranging from "0" to "30" expressed by the string of the parallel output signals AP4 to AP0 in a pseudo-random number generating cycle equal to $2^5-1$ clock cycles and to generate $2^5-1$ second pseudo-random numbers AQ ranging from "0" to "30" expressed by the string of the parallel output signals AQ4 to AQ0 in the pseudo-random number generating cycle. Therefore, neither the state AP4=AP3=AP2=AP1=AP0=1 nor the state AQ4=AQ3=AQ2=AQ1=AQ0=1 is set in the test address generating unit 330.

The reason that neither the state AP4=AP3=AP2=AP1=AP0=1 nor the state AQ4=AQ3=AQ2=AQ1=AQ0=1 is set will be described. To set AQ4=AQ3=AQ2=AQ1= AQ0=1 in a current clock cycle, AP4=AP3=AP2=AP1= AP0=1 is required in a preceding clock cycle. Also, to set AP4=AP3=AP2=AP1=AP0=1 in a current clock cycle, AQ4=AQ3=AQ2=AQ1=1 and "1" output from the EXNOR circuit 118 are required in a preceding clock cycle. To obtain "1" output from the EXNOR circuit 118, AQ0=1 is required in a preceding clock cycle, and AQ4=AQ3= AQ2=AQ1=AQ0=1 is required in the preceding clock cycle. Therefore, in a case where AQ4=AQ3=AQ2=AQ1=AQ0= 1 is not preset, neither the state AP4=AP3=AP2= AP1=AP0=1 nor the state AQ4=AQ3=AQ2=AQ1=AQ0=1 is actually set.

Next, an operation of the semiconductor integrated circuit device will be described below.

In the test address generating unit 330, the binary values of the parallel output signals AP4 to AP0 output from the flip-flop circuits 114 of the odd-numbered stages and the binary values of the parallel output signals AQ4 to AQ0 output from the flip-flop circuits 114 of the even-numbered stages are renewed every clock cycle in the same manner as in the third embodiment, and the serial output signal SO substantially expressing each first pseudo-random number AP or each second pseudo-random number AQ is output to the address shift register 140.

FIG. 17 shows an operation result obtained in the RAM test circuit 330 in a tabular form.

As shown in FIG. 17, in a case where the preset values of the parallel output signals AP4 to AP0 are the same as those of the parallel output signals AQ4 to AQ0, each first pseudo-random number AP expressed by the parallel output signals AP4 to AP0 in a clock cycle is the same as the second pseudo-random number AQ expressed by the parallel output signals AQ4 to AQ0 in a next clock cycle. Also, in the same manner as the parallel output signals A4 to A0 of the seventh embodiment, each parallel output signal $Api_i$ (i= 4 to 1) is set as the parallel output signal $Ap_{i-1}$ every two clock cycles. Therefore, the first pseudo-random number AP expressed by the parallel output signals AP4 to AP0 and the second pseudo-random number AQ expressed by the parallel output signals AQ4 to AQ0 are generated in the same manner as the parallel output signals A4 to A0 of the seventh embodiment shown in FIG. 13.

Therefore, the change of the read address AR indicated by the parallel read address signals AR4 to AR0 shown in FIG. 17 is the same as those shown in FIG. 13, the change of the write address AW indicated by the parallel write address signals AW4 to AW0 shown in FIG. 17 is the same as those shown in FIG. 13, and the address shift operation is performed in the address shift register 140 in the same manner as in the seventh embodiment.

FIG. 18 shows another operation result obtained in the RAM test circuit 330 in a tabular form.

In a case where the binary values of the parallel output signals AP4 to AP0 and the parallel output signals AQ4 to AQ0 are appropriately preset, the read address AR expressed by the parallel read address signals AR4 to AR0 is efficiently renewed every clock cycle, and the write address AW expressed by the parallel write address signals AW4 to AW0 is efficiently renewed every clock cycle. For example, the binary values of the parallel output signals AP4 to AP0 are preset to {1, 1, 1, 0, 1} in CYCLE=0, and the binary values of the parallel output signals AQ4 to AQ0 are preset to {0, 0, 0, 0, 0} in CYCLE=0. In this case, the first pseudo-random numbers AP and the second pseudo-random numbers AQ shown in FIG. 18 are generated.

In detail, as shown in FIG. 18, a train of $2^5-1$ (=31) pseudo-random numbers {0, 29, 16, 30, 24, 15, 28, 23, 14, 27, 7, 13, 19, 22, 9, 11, 4, 5, 2, 18, 17, 25, 8, 12, 20, 6, 10, 3, 21, 1, 26} is generated in a pseudo-random number generating cycle equal to $2^5-1$ clock cycles by alternately combining each of pseudo-random numbers {0, 16, 24, 28, 14, 7, 19, 9, 4, 2, 17, 8, 20, 10, 21, 26} of a first train composed of the first portion of the decimal values AP shown in FIG. 17 and each of pseudo-random numbers {29, 30, 15, 23, 27, 13, 22, 11, 5, 18, 25, 12, 6, 3, 1} of a second train composed of the second portion of the decimal values AP shown in FIG. 17. In this case, in the address shift register 140, the read addresses AR set to the generated pseudo-random numbers in the $2^5-1$ clock cycles from CYCLE= 9 to CYCLE=39 are expressed by the string of the parallel read address signals AR4 to AR0, and the write addresses AW set to the generated pseudo-random numbers in the $2^5-1$ clock cycles from CYCLE=10 to CYCLE=40 are expressed by the string of the parallel write address signals AW4 to AW0. Thereafter, the parallel read address signals AR4 to AR0 are input to the address terminals AB4 to AB0 of the read port (the X decoder 151a and the Y decoder 152a) of the two-port RAM 170 in $2^5-1$ successive clock cycles, and the parallel write address signals AW4 to AW0 are input to the address terminals AC4 to AC0 of the write port (the X decoder 151b and the Y decoder 152b) of the two-port RAM 170 in $2^5-1$ successive clock cycles.

Here, because the pseudo-random numbers range from "0" to "30", the read addresses AR range from "0" to "30", and the write addresses AW range from "0" to "30". In this case, because none of memory cells of address numbers "28", "29", and "30" indicated by the read address AR and the write address AW exist in the two-port RAM 170, the read test and the write test for the read addresses AR=28, AR= 29 and AR=30 and the write addresses AW=28, AW=29 and AW=30 are skipped by setting clock cycles for those read addresses and write addresses as dummy clock cycles.

As is described above, in the ninth embodiment, in a case where the number of memory cells of the two-port RAM 170 arranged in the semiconductor integrated circuit device is lower than $2^N$ (the numeral N denotes the number of bits of the parallel read address signals AR4 to AR0 or the number of bits of the parallel write address signals AQ4 to AQ0 input to the address terminals AB4 to AB0 or AC4 to AC0) and is higher than $2^{N-1}$, the test address generating unit 330 having the simplified configuration is used to generate the first pseudo-random numbers AP and the second pseudo-random numbers AQ while setting the number of first pseudo-random numbers AP and the number of second pseudo-random numbers AQ to a value lower than $2^N-1$. Therefore, as compared with the configuration in the third embodiment, the configuration of the semiconductor integrated circuit device can be simplified, and a small-sized semiconductor integrated circuit can be manufactured.

Also, in a case where the binary values of the parallel output signals AP4 to AP0 and the parallel output signals AQ4 to AQ0 are appropriately preset, the group of the first pseudo-random numbers AP and the group of the second pseudo-random numbers AQ are respectively generated in $2^N-1$ successive clock cycles. Therefore, the read test and the write test can be efficiently performed in a small-sized semiconductor integrated circuit.

Embodiment 10

Figure 19:
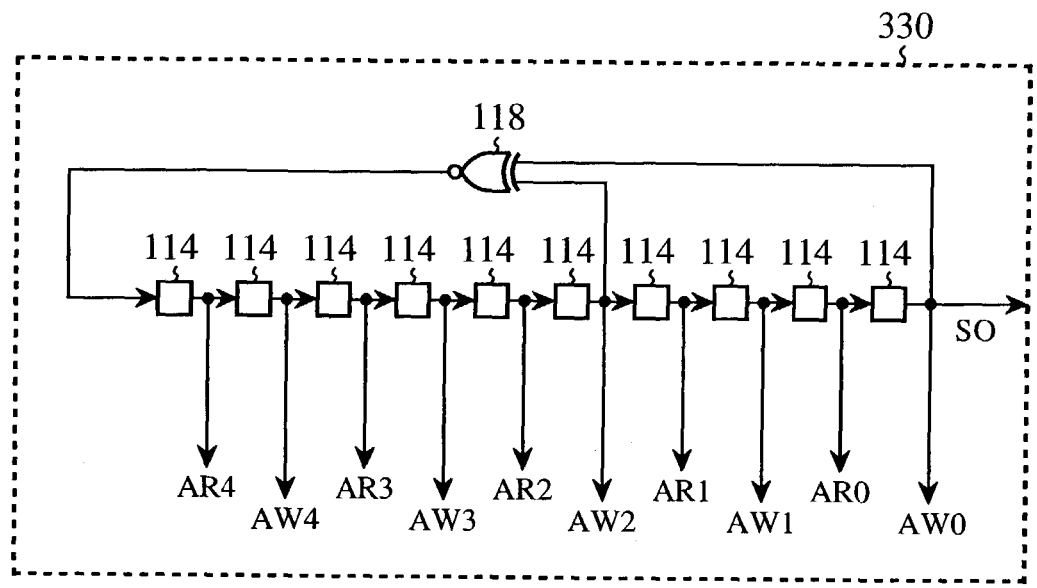
FIG. 19 is a circuit view of a semiconductor integrated circuit device according to a tenth embodiment of the present invention.
Figure 19:
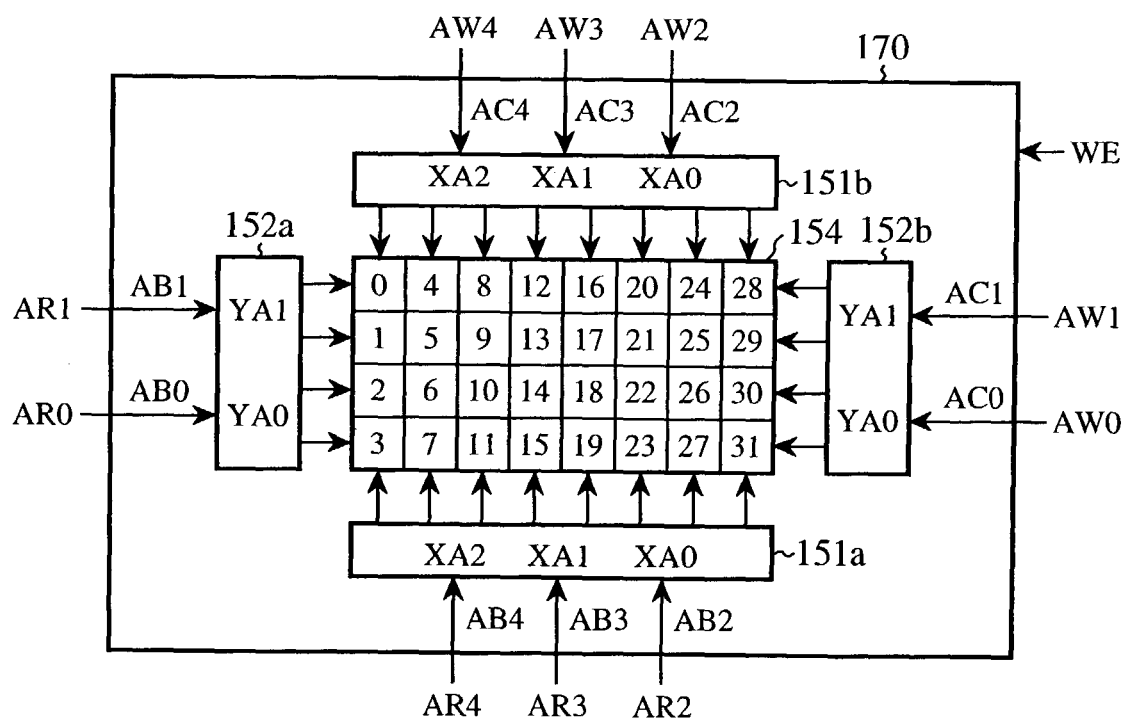

FIG. 19 is a circuit view of a semiconductor integrated circuit device according to a tenth embodiment of the present invention. The constituent elements, which are the same as those shown in FIG. 16, are indicated by the same reference numerals as those of the constituent elements shown in FIG. 16, and additional description of those constituent elements is omitted.

In FIG. 19, a semiconductor integrated circuit device comprises the test address generating unit 330 (or a serial shift register) denoting a RAM test circuit and the two-port RAM 170. The test address generating unit 330 has both the pseudo-random number generating function and the address shift function, the parallel read address signals AR4 to AR0 output from the flip-flop circuits 114 of the odd-numbered stages are directly input to the address terminals AB4 to AB0 of the X decoder 151a and the Y decoder 152a of the two-port RAM 170, and the parallel write address signals AW4 to AW0 output from the flip-flop circuits 114 of the even-numbered stages are directly input to the address terminals AC4 to AC0 of the X decoder 151b and the Y decoder 152b of the two-port RAM 170.

The first pseudo-random numbers AP expressed by the string of the parallel read address signals AR4 to AR0 and the second pseudo-random numbers AQ expressed by the string of the parallel write address signals AQ4 to AQ0 are shown in FIG. 17 or FIG. 18.

As is described above, in the tenth embodiment, in a case where the number of memory cells of the two-port RAM 170 arranged in the semiconductor integrated circuit device is lower than $2^N$ (the numeral N denotes the number of bits of the parallel read address signals AR4 to AR0 or the number of bits of the parallel write address signals AQ4 to AQ0 input to the address terminals AB4 to AB0 or AC4 to AC0) and is higher than $2^{N-1}$, the test address generating unit 330 having the simplified configuration is used to generate the first pseudo-random numbers AP and the second pseudo-random numbers AQ while setting the number of first pseudo-random numbers AP and the number of second pseudo-random numbers AQ to a value lower than $2^5-1$. Therefore, as compared with the configuration in the fourth embodiment, the configuration of the semiconductor integrated circuit device can be simplified, and a small-sized semiconductor integrated circuit can be manufactured.

Embodiment 11

Figure 20:
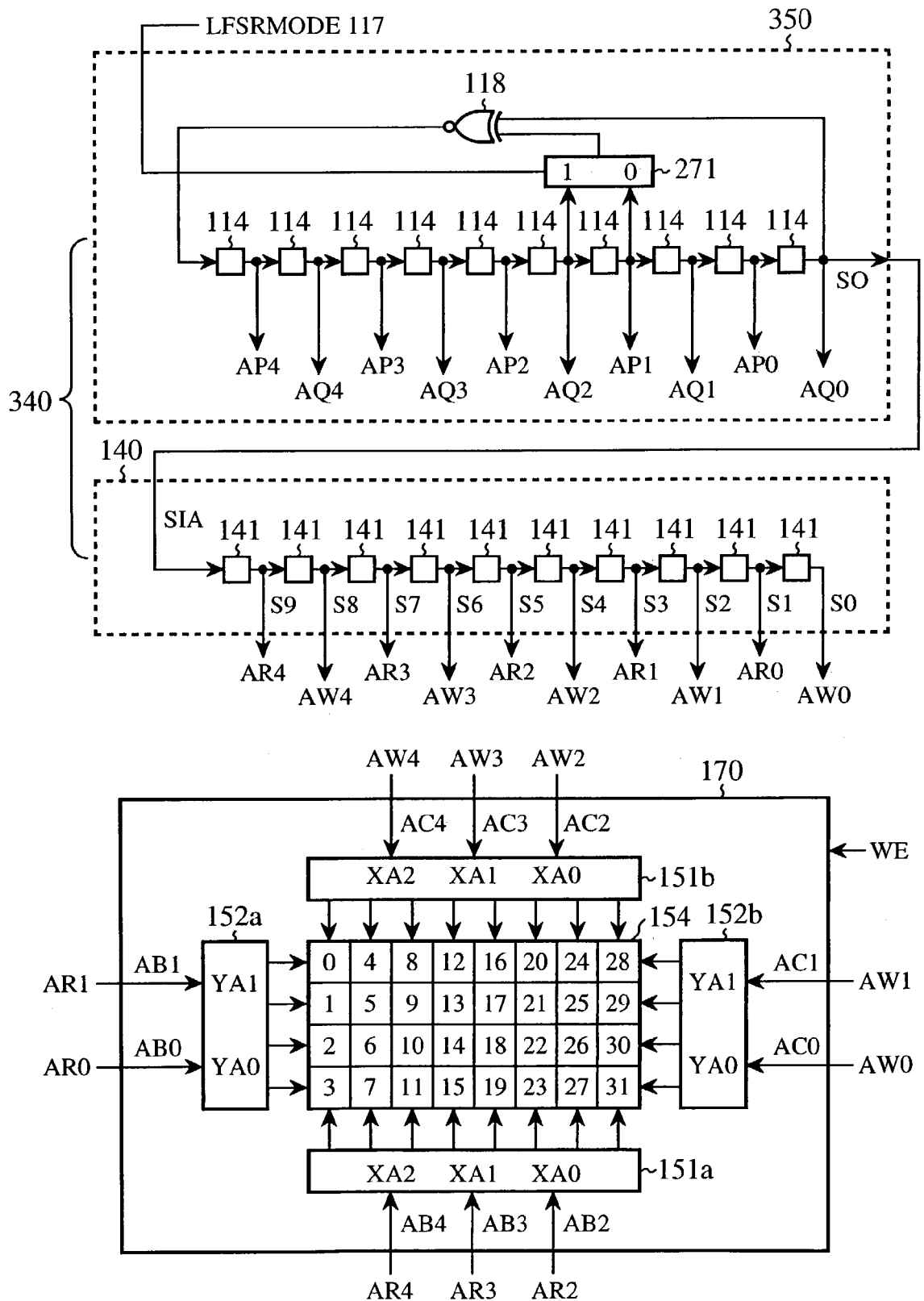
FIG. 20 is a circuit view of a semiconductor integrated circuit device according to an eleventh embodiment of the present invention.

FIG. 20 is a circuit view of a semiconductor integrated circuit device according to an eleventh embodiment of the present invention. The constituent elements, which are the same as those shown in FIG. 10 or FIG. 12, are indicated by the same reference numerals as those of the constituent elements shown in FIG. 10 or FIG. 12, and additional description of those constituent elements is omitted.

In FIG. 20, a semiconductor integrated circuit device comprises a RAM test circuit 340 and the two-port RAM 170. The RAM test circuit 340 comprises a test address generating unit 350 and the address shift register 140. The test address generating unit 350 comprises the ten serially-arranged flip-flop circuits 114, the selector 271 and the EXNOR circuit 118 for producing a signal according to the EXNOR logic for both the parallel output signal AQ0 output from the flip-flop circuits 114 of the tenth stage and a signal selected in the selector 271.

The test address generating unit 350 is formed of a simplified LFSR type pseudo-random number generating circuit.

Next, an operation of the semiconductor integrated circuit device will be described below.

In a case of the LFSRMODE signal 117 set to "1" the parallel output signal AQ2 output from the flip-flop circuit 114 of the sixth stage is selected in the selector 271, and the parallel output signal AQ2 is input to the EXNOR circuit 118. Therefore, the test address generating unit 350 is operated in the same manner as the test address generating unit 330 of the ninth embodiment shown in FIG. 16. In this case, $2^5-1$ (=31) first pseudo-random numbers AP ranging from "0" to "30" indicated by the string of parallel output signals AP4 to AP0 and $2^5-1$ second pseudo-random numbers AQ ranging from "0" to "30" indicated by the string of parallel output signals AQ4 to AQ0 are produced every clock cycle in the pseudo-random number generating cycle equal to $2^5-1$ clock cycles. Therefore, neither the state AP4=AP3=AP2=AP1=AP0=1 nor the state AQ4=AQ3=AQ2=AQ1=AQ0=1 is set in the test address generating unit 330.

When the preset values of the parallel output signals AP4 to AP0 are the same as those of the parallel output signals AQ4 to AQ0, the parallel read address signals AR4 to AR0 expressing the read addresses AR shown in FIG. 17 and the parallel write address signals AW4 to AW0 expressing the write addresses AW shown in FIG. 17 are respectively produced in the address shift register 140 in $2^6-2$ (=62) clock cycles, and the read test and the write test are alternately performed for all memory cells of the two-port RAM 170 in $2^6-2$ clock cycles.

When the parallel output signals AP4 to AP0 and the parallel output signals AQ4 to AQ0 are appropriately preset, the parallel read address signals AR4 to AR0 expressing the read addresses AR shown in FIG. 18 and the parallel write address signals AW4 to AW0 expressing the write addresses AW shown in FIG. 18 are respectively produced in the address shift register 140 in $2^5-1$ (=31) clock cycles, the read test is performed for all memory cells of the two-port RAM 170 in $2^5-1$ successive clock cycles while skipping the read test corresponding to the read addresses AR=28, AR=29 and AR=30, and the write test is performed for all memory cells of the two-port RAM 170 in $2^5-1$ successive clock cycles while skipping the write test corresponding to the write addresses AW=28, AW=29 and AW=30.

In a case of the LFSRMODE signal 117 set to "0", the parallel output signal AP1 output from the flip-flop circuit 114 of the seventh stage is selected in the selector 271, and the parallel output signal AP1 is input to the EXNOR circuit 118. Therefore, the test address generating unit 350 is operated in the same manner as the test address generating unit 310 of the eighth embodiment shown in FIG. 14. In this case, as shown in FIG. 15, $2^{10}-1$ (=1023) pseudo-random numbers ranging from "0" to "1022" are generated in the test address generating unit 350 in the pseudo-random number generating cycle equal to $2^{10}-1$ clock cycles and are expressed by the string of parallel output signals AP4, AQ4, AP3, AQ3, AP2, AQ2, AP1, AQ1, AP0 and AQ0. In this case, the state AP4=AQ4=AP3=AQ3=AP2=AQ2=AP1=AQ1=AP0=AQ0=1 is not generated in the test address generating unit 350. Thereafter, the parallel read address signals AR4 to AR0 expressing the read addresses AR shown in FIG. 15 and the parallel write address signals AW4 to AW0 expressing the write addresses AW shown in FIG. 15 are respectively produced in the address shift register 140 in $2^{10}-1$ (=1023) clock cycles, and the combination of the read test and the write test is performed for all memory cells of the two-port RAM 170 in $2^{10}-1$ successive clock cycles while skipping the read test and the write test corresponding to the read address AR=28, AR=29, AR=30 or AR=31 or the write address AW=28, AW=29, AW=30 or AW=31.

As is described above, in the eleventh embodiment, the test address generating unit 350 operated in the same manner as the test address generating unit 310 of the eighth embodiment or the test address generating unit 330 of the ninth embodiment according to the LFSRMODE signal 117 are used. Therefore, various patterns of RAM test can be performed, and a semiconductor integrated circuit device tested at high reliability can be obtained.

In the eleventh embodiment, the address shift register 140 is used. However, it is applicable that no address shift register be used. In this case, the parallel output signals AP4 to AP0 output from the test address generating unit 350 are directly input to the address terminals AB4 to AB0 of both the X read decoder 151a and the Y read decoder 152a of the two-port RAM 170, and the parallel output signals AQ4 to AQ0 output from the test address generating unit 350 are directly input to the address terminals AC4 to AC0 of both the X write decoder 151b and the Y write decoder 152b of the two-port RAM 170. Therefore, a small-sized semiconductor integrated circuit device can be obtained.

Embodiment 12

Figure 21:
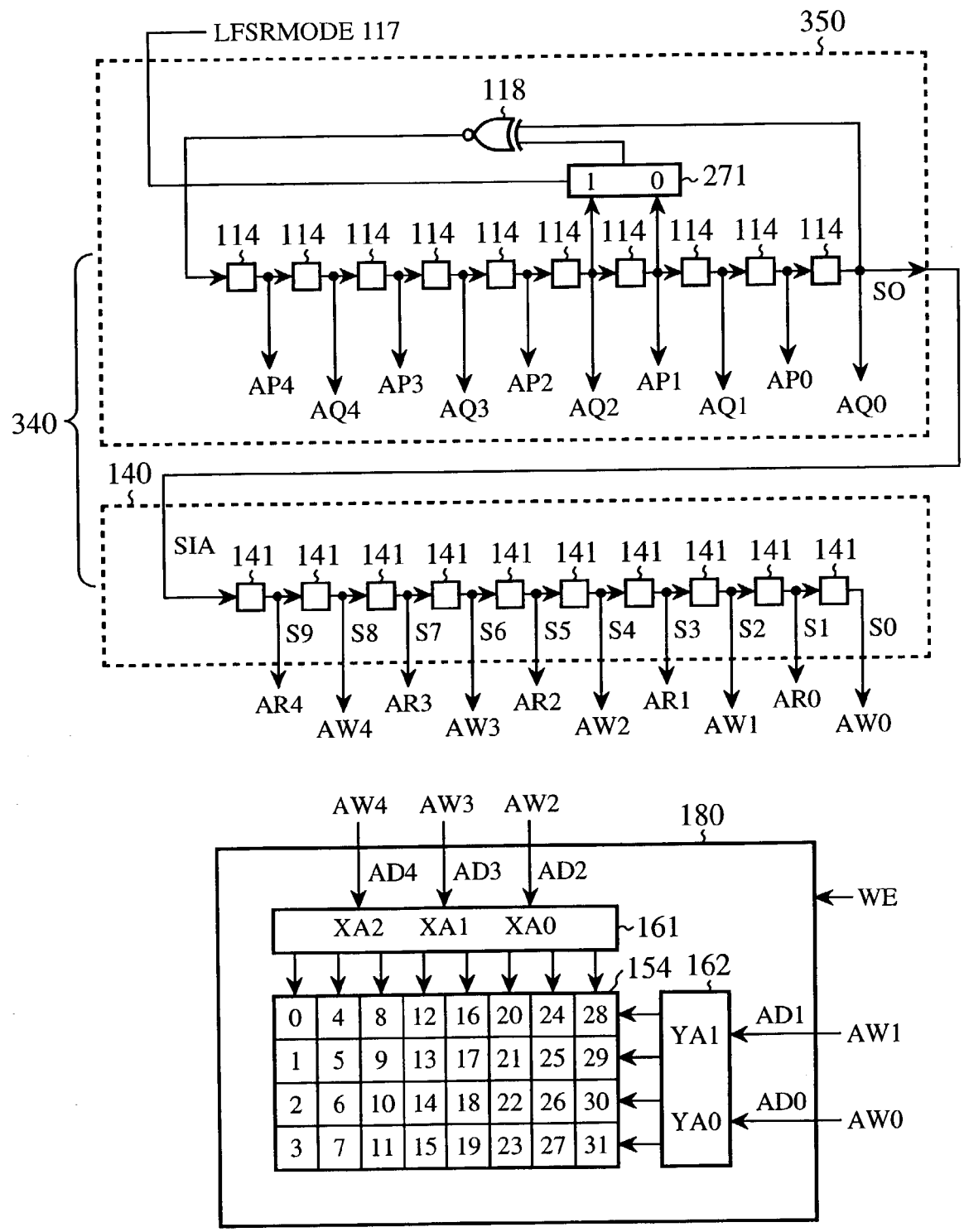
FIG. 21 is a circuit view of a semiconductor integrated circuit device according to a twelfth embodiment of the present invention.

FIG. 21 is a circuit view of a semiconductor integrated circuit device according to a twelfth embodiment of the present invention. The constituent elements, which are the same as those shown in FIG. 11 or FIG. 20, are indicated by the same reference numerals as those of the constituent elements shown in FIG. 11 or FIG. 20, and additional description of those constituent elements is omitted.

In FIG. 21, a semiconductor integrated circuit device comprises the RAM test circuit 340 and a single port RAM 180. The single port RAM 180 comprises the X decoder 161, the Y decoder 162 and the memory cell array 154. The X decoder 161 has three address terminals AD4, AD3 and AD2 to which the parallel read address signals AR4 to AR2 or the parallel write address signals AW4 to AW2 are input. The Y decoder 162 has two address terminals AD1 and AD0 to which the parallel read address signals AR1 to AR0 or the parallel write address signals AW1 to AW0 are input. The memory cell array 154 has twenty-eight memory cells.

In case of the read test, the parallel read address signals AR4 to AR0 output from the address shift register 140 are input to the address terminals AD4 to AD0 of both the X decoder 161 and the Y decoder 162. In this case, the parallel read address signals AR4 to AR0 express each of the pseudo-random numbers in the same manner as in the eleventh embodiment. Also, in case of the write test, the parallel write address signals AW4 to AW0 output from the address shift register 140 are input to the address terminals AD4 to AD0 of both the X decoder 161 and the Y decoder 162. In this case, the parallel write address signals AW4 to AW0 express each of the pseudo-random numbers in the same manner as in the eleventh embodiment.

The selection of the parallel read address signals AR4 to AR0 in case of the read test and the selection of the parallel write address signals AW4 to AW0 in case of the write test are, for example, performed in a selector switch (not shown) arranged between the address shift register 140 and the single port RAM 180.

As is described above, in the twelfth embodiment, in a case where the number of memory cells of the single port RAM 180 arranged in the semiconductor integrated circuit device is lower than $2^N$ (the numeral N denotes the number of bits of the parallel read address signals AR4 to AR0 or the number of bits of the parallel write address signals AQ4 to AQ0 input to the address terminals AD4 to AD0) and is higher than $2^{N-1}$, the test address generating unit 350 having the simplified configuration is used. In a case of the LFSRMODE signal 117 set to "1", the first pseudo-random numbers AP and the second pseudo-random numbers AQ are generated while setting the number of first pseudo-random numbers AP and the number of second pseudo-random numbers AQ to a value lower than $2^5-1$, and the read test and the write test are performed for all the memory cells of the single port RAM 180 while skipping the read test and the write test corresponding to the read address AR="28", "29" or "30" or the write address AW="28", "29" or "30". Also, in a case of the LFSRMODE signal 117 set to "0", the combination of the read test and the write test is performed for all memory cells of the single port RAM 180 in $2^{10}-1$ successive clock cycles while skipping the read test and the write test corresponding to the read address AR=28, AR=29, AR=30 or AR=31 or the write address AW=28, AW=29, AW=30 or AW=31. Therefore, as compared with the configuration in the sixth embodiment, the configuration of the semiconductor integrated circuit device can be simplified, and a small-sized semiconductor integrated circuit can be manufactured.

In the first to twelfth embodiments, the parallel output signal A0 or AQ0 is used as the serial output signal SO. However, because the parallel output signals A9 to A1 or A4 to A3 or the parallel output signals AP4 to AP0 and AQ3 to AQ1 are finally set as the parallel output signal A0 or AQ0, it is applicable that one of the parallel output signals A9 to A1, the parallel output signals A4 to A3 or the parallel output signals AP4 to AP0 and AQ3 to AQ1 be set as the serial output signal SO. In this case, the RAM test can be performed in the same manner as in the first to twelfth embodiments.

Also, in the first to twelfth embodiments except the fourth and tenth embodiments, it is applicable that the flip-flop circuit 141 of the first stage be removed from the address shift register 140, and the serial output signal SO be set as the parallel read address signal AR4.

Also, in the fourth embodiment, it is applicable that the single port RAM 160 be used in place of the two-port RAM 150. Also, in the tenth embodiment, it is applicable that the single port RAM 180 be used in place of the two-port RAM 150.

Also, in the first to twelfth embodiments except the sixth and twelfth embodiments, the two-port RAM 150 or 170 having both the read port (the X decoder 151a and the Y decoder 152a) and the write port (the X decoder 151b and the Y decoder 152b) is used. However, it is applicable that a two-port RAM having two read-write ports respectively used for the read test and the write test be used in place of the two-port RAM 150 or 170. Also, it is applicable that a multi-port RAM having three ports or more be used in place of the two-port RAM 150 or 170, and two of the three ports or more be used as a read port and a write port.

What is claimed is:

1. A semiconductor integrated circuit device, comprising:
a random access memory having a plurality of memory cells to which a plurality of addresses are allocated respectively; and
a serial shift register, having a plurality of flip-flops serially arranged, for receiving a serial signal in each of the flip-flops of a first group, outputting the serial signal from each flip-flop of the first group, receiving the serial signal in each of the flip-flops of a second group from the corresponding flip-flop of the first group, outputting a parallel signal from each flip-flop of the first group to obtain a first string of the parallel signals, outputting a parallel signal from each flip-flop of the second group to obtain a second string of the parallel signals, producing a first address from the first string of the parallel signals output from the flip-flops of the first group, producing a second address from the second string of the parallel signals output from the flip-flops of the second group, transmitting the first string of the parallel signals expressing the first address to the random access memory so as to specify the memory cell of the first address, and transmitting the second string of the parallel signals expressing the second address to the random access memory so as to specify the memory cell of the second address.

2. The semiconductor integrated circuit device according to claim 1, wherein the first string of the parallel signals output from the serial shift register is composed of a plurality of first bits expressing the first address, the second string of the parallel signals output from the serial shift register is composed of a plurality of second bits expressing the second address, the number of first bits of the first string is the same as the number of second bits of the second string, and the random access memory has both a first port receiving the first bits of the first string and a second port receiving the second bits of the second string.

3. The semiconductor integrated circuit device according to claim 2, further comprising
a pseudo-random number generating unit, having a plurality of flip-flops serially arranged, for generating a plurality of pseudo-random numbers and outputting each pseudo-random number to the serial shift register as the serial signal,
wherein the number of flip-flops of the pseudo-random number generating unit is equal to the number of first bits of the first string received in the first port of the random access memory.

4. The semiconductor integrated circuit device according to claim 3, wherein the pseudo-random numbers different from each other are generated by the pseudo-random number generating unit, and the number of pseudo-random numbers is equal to $2^N$ in a case where the sign N denotes the number of first bits of the first string received in the first port of the random access memory.

5. The semiconductor integrated circuit device according to claim 3, wherein the number of memory cells of the random access memory is lower than $2^N$ and is higher than $2^{N-1}$ in a case where the sign N denotes the number of first bits of the first string received in the first port of the random access memory, the pseudo-random numbers different from each other are generated by the pseudo-random number generating unit, and the number of pseudo-random numbers is lower than $2^N$ by unity.

6. The semiconductor integrated circuit device according to claim 2, further comprising
a pseudo-random number generating unit, having a plurality of flip-flops serially arranged, for generating a plurality of pseudo-random numbers and outputting each pseudo-random number to the serial shift register as the serial signal,
wherein the number of flip-flops of the pseudo-random number generating unit is equal to a sum of the number of first bits of the first string received in the first port of the random access memory and the number of second bits of the second string received in the second port of the random access memory.

7. The semiconductor integrated circuit device according to claim 6, wherein the pseudo-random numbers different from each other are generated by the pseudo-random number generating unit, and the number of pseudo-random numbers is equal to $2^N$ in a case where the sign N denotes the sum of the number of first bits of the first string received in the first port of the random access memory and the number of second bits of the second string received in the second port of the random access memory.

8. The semiconductor integrated circuit device according to claim 6, wherein the number of memory cells of the random access memory is lower than $2^N$ and is higher than $2^{N-1}$ in a case where the sign N denotes the sum of the number of first bits of the first string received in the first port of the random access memory and the number of second bits of the second string received in the second port of the random access memory, the pseudo-random numbers different from each other are generated by the pseudo-random number generating unit, and the number of pseudo-random numbers is lower than $2^N$ by unity.

9. The semiconductor integrated circuit device according to claim 1, wherein the serial signal received by the serial shift register is produced according to a plurality of bits output from a part of the flip-flops of the serial shift register, and the serial signal indicates a pseudo-random number expressed by a string of bits of which the number is equal to the number of bits output from the flip-flops of the serial shift register.

10. The semiconductor integrated circuit device according to claim 1, wherein the flip-flops of the first group are arranged in odd-numbered stages of the serial shift register, and the flip-flops of the second group are arranged in even-numbered stages of the serial shift register.

11. The semiconductor integrated circuit device according to claim 1, wherein the first string of the parallel signals output from the serial shift register is composed of a plurality of first bits expressing the first address, the second string of the parallel signals output from the serial shift register is composed of a plurality of second bits expressing the second address, the number of first bits of the first string is the same as the number of second bits of the second string, and the random access memory has a single port alternately receiving the first bits of the first string and the second bits of the second string.

12. The semiconductor integrated circuit device according to claim 11, further comprising
a pseudo-random number generating unit, having a plurality of flip-flops serially arranged, for generating a plurality of pseudo-random numbers and outputting each pseudo-random number to the serial shift register as the serial signal,
wherein the number of flip-flops of the pseudo-random number generating unit is equal to either the number of first bits of the first string or the number of second bits of the second string received in the single port of the random access memory.

13. The semiconductor integrated circuit device according to claim 12, wherein the pseudo-random numbers different from each other are generated by the pseudo-random number generating unit, and the number of pseudo-random numbers is equal to $2^N$ in a case where the sign N denotes either the number of first bits of the first string or the number of second bits of the second string received in the single port of the random access memory.

14. The semiconductor integrated circuit device according to claim 12, wherein the number of memory cells of the random access memory is lower than $2^N$ and is higher than $2^{N-1}$ in a case where the sign N denotes either the number of first bits of the first string or the number of second bits of the second string received in the single port of the random access memory, the pseudo-random numbers different from each other are generated by the pseudo-random number generating unit, and the number of pseudo-random numbers is lower than $2^N$ by unity.

15. The semiconductor integrated circuit device according to claim 11, further comprising
a pseudo-random number generating unit, having a plurality of flip-flops serially arranged, for generating a plurality of pseudo-random numbers and outputting each pseudo-random number to the serial shift register as the serial signal,
wherein the number of flip-flops of the pseudo-random number generating unit is twice of either the number of first bits of the first string or the number of second bits of the second string received in the single port of the random access memory.

16. The semiconductor integrated circuit device according to claim 15, wherein the pseudo-random numbers different from each other are generated by the pseudo-random number generating unit, and the number of pseudo-random numbers is equal to $2^N$ in a case where the sign N denotes the number of first bits of the first string or the number of second bits of the second string received in the single port of the random access memory.

17. The semiconductor integrated circuit device according to claim 15, wherein the number of memory cells of the random access memory is lower than $2^N$ and is higher than $2^{N-1}$ in a case where the sign N denotes the number of first bits of the first string or the number of second bits of the second string received in the single port of the random access memory, the pseudo-random numbers different from each other are generated by the pseudo-random number generating unit, and the number of pseudo-random numbers is lower than $2^N$ by unity.

\* \* \* \* \*